United States Patent
Wheeler

(10) Patent No.: US 10,685,699 B2
(45) Date of Patent: Jun. 16, 2020

(54) SORT OPERATION IN MEMORY

(71) Applicant: Micron Technology, Inc., Boise, ID (US)

(72) Inventor: Kyle B. Wheeler, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/208,121

(22) Filed: Dec. 3, 2018

(65) Prior Publication Data

US 2019/0341098 A1 Nov. 7, 2019

Related U.S. Application Data

(63) Continuation of application No. 14/920,537, filed on Oct. 22, 2015, now Pat. No. 10,147,480.

(60) Provisional application No. 62/068,247, filed on Oct. 24, 2014.

(51) Int. Cl.
*G11C 7/10* (2006.01)
*G11C 11/4091* (2006.01)
*G11C 19/28* (2006.01)

(52) U.S. Cl.
CPC ........ *G11C 11/4091* (2013.01); *G11C 7/1006* (2013.01); *G11C 19/287* (2013.01)

(58) Field of Classification Search
CPC .. G11C 11/4091; G11C 7/1006; G11C 19/287
See application file for complete search history.

(56) References Cited

U.S. PATENT DOCUMENTS

| | | | | | |
|---|---|---|---|---|---|
| 4,380,046 | A | ‡ | 4/1983 | Frosch | G06F 15/8007 712/11 |
| 4,435,792 | A | ‡ | 3/1984 | Bechtolsheim | G09G 5/393 348/71 |
| 4,435,793 | A | ‡ | 3/1984 | Ochii | G11C 5/063 365/19 |

(Continued)

FOREIGN PATENT DOCUMENTS

| | | | |
|---|---|---|---|
| CN | 102141905 | ‡ | 8/2011 |
| EP | 0214718 | ‡ | 3/1987 |

(Continued)

OTHER PUBLICATIONS

Dybdahl., et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.‡

(Continued)

*Primary Examiner* — Larry T MacKall
(74) *Attorney, Agent, or Firm* — Brooks, Cameron & Huebsch, PLLC

(57) ABSTRACT

Examples of the present disclosure provide apparatuses and methods related to performing a sort operation in a memory. An example apparatus might include a a first group of memory cells coupled to a first sense line, a second group of memory cells coupled to a second sense line, and a controller configured to control sensing circuitry to sort a first element stored in the first group of memory cells and a second element stored in the second group of memory cells by performing an operation without transferring data via an input/output (I/O) line.

19 Claims, 34 Drawing Sheets

(56) References Cited

U.S. PATENT DOCUMENTS

| | | | | |
|---|---|---|---|---|
| 4,727,474 A ‡ | 2/1988 | Batcher | G06F 15/8007 | 712/14 |
| 4,843,264 A ‡ | 6/1989 | Galbraith | G01R 19/155 | 327/21 |
| 4,958,378 A ‡ | 9/1990 | Bell | G09G 5/006 | 345/27 |
| 4,977,542 A ‡ | 12/1990 | Matsuda | G11C 7/14 | 365/14 |
| 5,023,838 A ‡ | 6/1991 | Herbert | G09G 5/393 | 326/10 |
| 5,034,636 A ‡ | 7/1991 | Reis | G11C 7/062 | 327/52 |
| 5,201,039 A ‡ | 4/1993 | Sakamura | G06F 9/30101 | 711/20 |
| 5,210,850 A ‡ | 5/1993 | Kelly | G06F 12/0888 | 710/22 |
| 5,253,308 A ‡ | 10/1993 | Johnson | G06T 1/20 | 382/30 |
| 5,276,643 A ‡ | 1/1994 | Hoffmann | G11C 7/1006 | 365/18 |
| 5,325,519 A ‡ | 6/1994 | Long | G06F 3/0601 | 714/15 |
| 5,367,488 A ‡ | 11/1994 | An | G11C 7/18 | 365/18 |
| 5,379,257 A ‡ | 1/1995 | Matsumura | G11C 7/1006 | 365/18 |
| 5,386,379 A ‡ | 1/1995 | Ali-Yahia | G11C 15/04 | 365/15 |
| 5,398,213 A ‡ | 3/1995 | Yeon | G11C 7/103 | 365/23 |
| 5,440,482 A ‡ | 8/1995 | Davis | G06F 7/02 | 715/22 |
| 5,446,690 A ‡ | 8/1995 | Tanaka | G11C 16/10 | 365/18 |
| 5,473,576 A ‡ | 12/1995 | Matsui | G11C 11/4096 | 365/23 |
| 5,481,500 A ‡ | 1/1996 | Reohr | G11C 7/065 | 365/18 |
| 5,485,373 A ‡ | 1/1996 | Davis | G06F 7/02 | 715/20 |
| 5,506,811 A ‡ | 4/1996 | McLaury | G11C 7/06 | 365/14 |
| 5,615,404 A ‡ | 3/1997 | Knoll | G06F 13/423 | 710/11 |
| 5,638,128 A ‡ | 6/1997 | Hoogenboom | H04N 19/61 | 375/24 |
| 5,638,317 A ‡ | 6/1997 | Tran | G11C 7/10 | 365/18 |
| 5,654,936 A ‡ | 8/1997 | Cho | G11C 7/1051 | 365/23 |
| 5,678,021 A ‡ | 10/1997 | Pawate | G06F 15/7821 | 711/10 |
| 5,724,291 A ‡ | 3/1998 | Matano | G11C 7/10 | 365/20 |
| 5,724,366 A ‡ | 3/1998 | Furutani | G11C 29/38 | 365/20 |
| 5,751,987 A ‡ | 5/1998 | Mahant-Shetti | G06F 9/3879 | 365/23 |
| 5,787,458 A ‡ | 7/1998 | Miwa | G11C 15/04 | 365/49 |
| 5,854,636 A ‡ | 12/1998 | Watanabe | G06F 17/10 | 345/51 |
| 5,867,429 A ‡ | 2/1999 | Chen | G11C 11/5621 | |
| 5,870,504 A ‡ | 2/1999 | Nemoto | G06K 9/44 | 382/26 |
| 5,915,084 A ‡ | 6/1999 | Wendell | G11C 7/06 | 365/20 |
| 5,935,263 A ‡ | 8/1999 | Keeth | G11C 29/38 | 714/71 |
| 5,986,942 A ‡ | 11/1999 | Sugibayashi | G11C 7/065 | 365/18 |
| 5,991,209 A ‡ | 11/1999 | Chow | G11C 7/065 | 365/18 |
| 5,991,785 A ‡ | 11/1999 | Alidina | G06F 7/544 | 708/20 |
| 6,005,799 A ‡ | 12/1999 | Rao | G11C 11/565 | 365/14 |
| 6,009,020 A ‡ | 12/1999 | Nagata | G11C 7/1006 | 365/18 |
| 6,092,186 A ‡ | 7/2000 | Betker | G06F 9/3804 | 710/22 |
| 6,122,211 A ‡ | 9/2000 | Morgan | G11C 7/06 | 365/14 |
| 6,125,071 A ‡ | 9/2000 | Kohno | G11C 8/10 | 365/23 |
| 6,134,164 A ‡ | 10/2000 | Lattimore | G11C 7/065 | 365/19 |
| 6,147,514 A ‡ | 11/2000 | Shiratake | G11C 7/065 | 327/55 |
| 6,151,244 A ‡ | 11/2000 | Fujino | G11C 11/4074 | 365/14 |
| 6,157,578 A ‡ | 12/2000 | Brady | G11C 7/065 | 365/18 |
| 6,163,862 A ‡ | 12/2000 | Adams | G11C 29/50 | 714/71 |
| 6,166,942 A ‡ | 12/2000 | Vo | G11C 7/10 | 365/18 |
| 6,172,918 B1‡ | 1/2001 | Hidaka | G11C 7/1012 | 365/18 |
| 6,175,514 B1‡ | 1/2001 | Henderson | G11C 7/1075 | 365/15 |
| 6,181,698 B1‡ | 1/2001 | Hariguchi | G11C 15/04 | 370/39 |
| 6,208,544 B1‡ | 3/2001 | Beadle | G11C 15/00 | 365/18 |
| 6,226,215 B1‡ | 5/2001 | Yoon | G11C 7/1048 | 365/18 |
| 6,301,153 B1‡ | 10/2001 | Takeuchi | G11C 16/0483 | 365/18 |
| 6,301,164 B1‡ | 10/2001 | Manning | G11C 29/785 | 365/20 |
| 6,304,477 B1‡ | 10/2001 | Naji | G11C 15/02 | 365/15 |
| 6,389,507 B1‡ | 5/2002 | Sherman | H04L 45/7453 | 707/99 |
| 6,418,498 B1‡ | 7/2002 | Martwick | G06F 9/4812 | 710/26 |
| 6,466,499 B1‡ | 10/2002 | Blodgett | G11C 7/065 | 365/20 |
| 6,510,098 B1‡ | 1/2003 | Taylor | G11C 8/16 | 365/18 |
| 6,563,754 B1‡ | 5/2003 | Lien | G11C 11/4125 | 365/22 |
| 6,578,058 B1‡ | 6/2003 | Nygaard, Jr. | G01R 31/3177 | 340/14 |
| 6,731,542 B1‡ | 5/2004 | Le | G11C 16/0491 | 365/18 |
| 6,754,746 B1‡ | 6/2004 | Leung | G06F 13/40 | 365/20 |
| 6,768,679 B1‡ | 7/2004 | Le | G11C 16/0491 | 365/18 |
| 6,807,614 B2‡ | 10/2004 | Chung | G06F 9/3879 | 711/16 |
| 6,816,422 B2‡ | 11/2004 | Hamade | G11C 29/34 | 365/18 |
| 6,819,612 B1‡ | 11/2004 | Achter | G11C 7/065 | 365/18 |
| 6,894,549 B2‡ | 5/2005 | Eliason | G11C 11/22 | 327/21 |
| 6,943,579 B1‡ | 9/2005 | Hazanchuk | G06F 7/523 | 326/39 |
| 6,948,056 B1‡ | 9/2005 | Roth | G06F 7/22 | 708/20 |
| 6,950,771 B1‡ | 9/2005 | Fan | G01R 31/2894 | 702/11 |
| 6,950,898 B2‡ | 9/2005 | Merritt | G11C 7/1036 | 365/63 |

(56) References Cited

U.S. PATENT DOCUMENTS

| | | | | |
|---|---|---|---|---|
| 6,956,770 B2 ‡ | 10/2005 | Khalid | G11C 16/0483 | 365/18 |
| 6,961,272 B2 ‡ | 11/2005 | Schreck | G11C 7/06 | 365/19 |
| 6,965,648 B1 ‡ | 11/2005 | Smith | G01R 31/3185 | 375/22 |
| 6,985,394 B2 ‡ | 1/2006 | Kim | G11C 7/12 | 365/20 |
| 6,987,693 B2 ‡ | 1/2006 | Cernea | G11C 8/08 | 365/18 |
| 7,020,017 B2 ‡ | 3/2006 | Chen | G11C 16/3459 | 365/18 |
| 7,028,170 B2 ‡ | 4/2006 | Saulsbury | G06F 9/30021 | 712/22 |
| 7,045,834 B2 ‡ | 5/2006 | Tran | H01L 27/10808 | 257/20 |
| 7,054,178 B1 ‡ | 5/2006 | Shiah | G11C 5/025 | 365/51 |
| 7,061,817 B2 ‡ | 6/2006 | Raad | G11C 29/40 | 365/19 |
| 7,079,407 B1 ‡ | 7/2006 | Dimitrelis | G11C 15/04 | 365/18 |
| 7,173,857 B2 ‡ | 2/2007 | Kato | G11C 11/5628 | 365/18 |
| 7,187,585 B2 ‡ | 3/2007 | Li | G11C 11/5642 | 365/18 |
| 7,196,928 B2 ‡ | 3/2007 | Chen | G11C 11/5642 | 365/18 |
| 7,260,565 B2 ‡ | 8/2007 | Lee | H04L 12/56 | |
| 7,260,672 B2 ‡ | 8/2007 | Garney | G06F 21/79 | 705/51 |
| 7,372,715 B2 ‡ | 5/2008 | Han | G11C 7/02 | 365/20 |
| 7,400,532 B2 ‡ | 7/2008 | Aritome | G11C 11/5628 | 365/18 |
| 7,406,494 B2 ‡ | 7/2008 | Magee | G06F 7/768 | 708/40 |
| 7,447,720 B2 ‡ | 11/2008 | Beaumont | G06F 9/3001 | 708/20 |
| 7,454,451 B2 ‡ | 11/2008 | Beaumont | G06F 9/3001 | 708/20 |
| 7,457,181 B2 ‡ | 11/2008 | Lee | G11C 7/065 | 365/18 |
| 7,535,769 B2 ‡ | 5/2009 | Cernea | G11C 7/02 | 365/18 |
| 7,546,438 B2 ‡ | 6/2009 | Chung | G06F 9/3001 | 711/20 |
| 7,562,198 B2 ‡ | 7/2009 | Noda | G11C 7/1006 | 711/15 |
| 7,574,466 B2 ‡ | 8/2009 | Beaumont | G06F 15/8023 | 708/20 |
| 7,602,647 B2 ‡ | 10/2009 | Li | G11C 11/5628 | 365/18 |
| 7,663,928 B2 ‡ | 2/2010 | Tsai | G11C 7/065 | 327/57 |
| 7,692,466 B2 ‡ | 4/2010 | Ahmadi | G11C 7/062 | 327/21 |
| 7,685,365 B2 ‡ | 5/2010 | Rajwar | G06F 9/467 | 711/11 |
| 7,752,417 B2 ‡ | 7/2010 | Manczak | G06F 11/3466 | 711/20 |
| 7,791,962 B2 ‡ | 9/2010 | Noda | G11C 7/1006 | 365/18 |
| 7,796,453 B2 ‡ | 9/2010 | Riho | G11C 7/1048 | 365/20 |
| 7,805,587 B1 ‡ | 9/2010 | Van Dyke | G06F 12/10 | 711/20 |
| 7,808,854 B2 ‡ | 10/2010 | Takase | G11C 7/065 | 365/18 |
| 7,827,372 B2 ‡ | 11/2010 | Bink | G11C 29/76 | 711/11 |
| 7,869,273 B2 ‡ | 1/2011 | Lee | G11C 11/5628 | 365/18 |
| 7,898,864 B2 ‡ | 3/2011 | Dong | G11C 11/5628 | 365/18 |
| 7,924,628 B2 ‡ | 4/2011 | Danon | G11C 11/5628 | 365/18 |
| 7,937,535 B2 ‡ | 5/2011 | Ozer | G06F 12/0822 | 711/14 |
| 7,957,206 B2 ‡ | 6/2011 | Bauser | G11C 7/067 | 365/17 |
| 7,979,667 B2 ‡ | 7/2011 | Allen | G06F 12/0246 | 711/20 |
| 7,996,749 B2 ‡ | 8/2011 | Ding | H04L 25/45 | 327/23 |
| 8,042,082 B2 ‡ | 10/2011 | Solomon | G06F 17/5045 | 365/12 |
| 8,045,391 B2 ‡ | 10/2011 | Mokhlesi | G11C 16/26 | 365/18 |
| 8,059,438 B2 ‡ | 11/2011 | Chang | G11C 7/1006 | 365/14 |
| 8,095,825 B2 ‡ | 1/2012 | Hirotsu | G06F 11/1407 | 714/15 |
| 8,117,462 B2 ‡ | 2/2012 | Snapp | G06Q 10/08 | 713/18 |
| 8,164,942 B2 ‡ | 4/2012 | Gebara | G11C 7/00 | 365/14 |
| 8,208,328 B2 ‡ | 6/2012 | Hong | G11C 7/1048 | 365/18 |
| 8,213,248 B2 ‡ | 7/2012 | Moon | G11C 11/4096 | 365/20 |
| 8,223,568 B2 ‡ | 7/2012 | Seo | G11C 5/025 | 365/19 |
| 8,238,173 B2 ‡ | 8/2012 | Akerib | G11C 15/043 | 365/18 |
| 8,274,841 B2 ‡ | 9/2012 | Shimano | G11C 8/04 | 365/18 |
| 8,279,683 B2 ‡ | 10/2012 | Klein | G11C 7/1006 | 365/18 |
| 8,310,884 B2 ‡ | 11/2012 | Iwai | G11C 11/4076 | 365/18 |
| 8,332,367 B2 ‡ | 12/2012 | Bhattacherjee | G06F 16/24556 | 707/69 |
| 8,339,824 B2 ‡ | 12/2012 | Cooke | G06K 9/6276 | 365/49 |
| 8,339,883 B2 ‡ | 12/2012 | Yu | G11C 7/12 | 365/19 |
| 8,347,154 B2 ‡ | 1/2013 | Bahali | G06F 11/008 | 365/20 |
| 8,351,292 B2 ‡ | 1/2013 | Matano | G11C 5/063 | 365/21 |
| 8,356,144 B2 ‡ | 1/2013 | Hessel | G06F 9/30036 | 711/15 |
| 8,417,921 B2 ‡ | 4/2013 | Gonion | G06F 8/4441 | 712/22 |
| 8,462,532 B1 ‡ | 6/2013 | Argyres | G11C 15/04 | 365/15 |
| 8,484,276 B2 ‡ | 7/2013 | Carlson | G06F 17/142 | 708/40 |
| 8,495,438 B2 ‡ | 7/2013 | Roine | G06F 11/1008 | 714/71 |
| 8,503,250 B2 ‡ | 8/2013 | Demone | G11C 7/1039 | 365/14 |
| 8,526,239 B2 ‡ | 9/2013 | Kim | G11C 16/344 | 365/18 |
| 8,533,245 B1 ‡ | 9/2013 | Cheung | G06F 1/03 | 708/20 |
| 8,555,037 B2 ‡ | 10/2013 | Gonion | G06F 8/4441 | 712/22 |
| 8,599,613 B2 ‡ | 12/2013 | Abiko | G11C 16/26 | 365/18 |
| 8,605,015 B2 ‡ | 12/2013 | Guttag | G09G 3/3685 | 345/84 |
| 8,625,376 B2 ‡ | 1/2014 | Jung | G11C 7/1006 | 365/18 |
| 8,644,101 B2 ‡ | 2/2014 | Jun | G11C 7/062 | 365/20 |

(56) References Cited

U.S. PATENT DOCUMENTS

| | | | |
|---|---|---|---|
| 8,650,232 B2‡ | 2/2014 | Stortz | G06F 7/02 708/20 |
| 8,873,272 B2‡ | 10/2014 | Lee | G11C 29/48 365/14 |
| 8,964,496 B2‡ | 2/2015 | Manning | G11C 7/1006 365/20 |
| 8,971,124 B1‡ | 3/2015 | Manning | G11C 7/06 365/18 |
| 9,015,390 B2‡ | 4/2015 | Klein | G06F 9/30036 710/5 |
| 9,047,193 B2‡ | 6/2015 | Lin | G06F 9/30043 |
| 9,165,023 B2‡ | 10/2015 | Moskovich | G06F 9/30021 |
| 9,740,607 B2 | 8/2017 | Wheeler | |
| 2001/0007112 A1‡ | 7/2001 | Porterfield | G06F 12/1081 718/10 |
| 2001/0008492 A1‡ | 7/2001 | Higashiho | G11C 7/06 365/19 |
| 2001/0010057 A1‡ | 7/2001 | Yamada | G06F 15/7821 709/20 |
| 2001/0028584 A1‡ | 10/2001 | Nakayama | G11C 29/24 365/20 |
| 2001/0043089 A1‡ | 11/2001 | Forbes | G11C 7/065 327/67 |
| 2001/0052062 A1‡ | 12/2001 | Lipovski | G11C 7/065 712/32 |
| 2002/0059355 A1‡ | 5/2002 | Peleg | G06F 7/4812 708/60 |
| 2003/0167426 A1‡ | 9/2003 | Slobodnik | G11C 29/16 714/71 |
| 2003/0222879 A1‡ | 12/2003 | Lin | G06F 7/57 345/53 |
| 2004/0073592 A1‡ | 4/2004 | Kim | G06F 7/508 708/71 |
| 2004/0073773 A1‡ | 4/2004 | Demjanenko | G06F 9/30036 712/7 |
| 2004/0085840 A1‡ | 5/2004 | Vali | G11C 7/062 365/20 |
| 2004/0095826 A1‡ | 5/2004 | Perner | G11C 7/06 365/20 |
| 2004/0154002 A1‡ | 8/2004 | Ball | G06F 17/5022 717/13 |
| 2004/0205289 A1‡ | 10/2004 | Srinivasan | G06F 12/0246 711/10 |
| 2004/0240251 A1‡ | 12/2004 | Nozawa | G11C 11/22 365/14 |
| 2005/0015557 A1‡ | 1/2005 | Wang | G06F 3/0613 711/15 |
| 2005/0078514 A1‡ | 4/2005 | Scheuerlein | G11C 8/10 365/18 |
| 2005/0097417 A1‡ | 5/2005 | Agrawal | G11C 29/24 714/73 |
| 2006/0047937 A1‡ | 3/2006 | Selvaggi | G06F 9/30101 711/22 |
| 2006/0069849 A1‡ | 3/2006 | Rudelic | G06F 12/0246 711/10 |
| 2006/0146623 A1‡ | 7/2006 | Mizuno | G11C 7/04 365/20 |
| 2006/0149804 A1‡ | 7/2006 | Luick | G06F 7/5443 708/62 |
| 2006/0149890 A1‡ | 7/2006 | Gorobets | G06F 12/0246 711/103 |
| 2006/0181917 A1‡ | 8/2006 | Kang | G11C 7/065 365/14 |
| 2006/0215432 A1‡ | 9/2006 | Wickeraad | G11C 29/44 365/49 |
| 2006/0225072 A1‡ | 10/2006 | Lari | G06F 8/61 717/17 |
| 2006/0291282 A1‡ | 12/2006 | Liu | G11C 16/0466 365/18 |
| 2007/0103986 A1‡ | 5/2007 | Chen | G11C 11/5642 365/18 |
| 2007/0171747 A1‡ | 7/2007 | Hunter | G11C 7/065 365/20 |
| 2007/0180006 A1‡ | 8/2007 | Gyoten | G06F 13/1652 708/20 |
| 2007/0180184 A1‡ | 8/2007 | Sakashita | G11C 16/10 711/10 |
| 2007/0195602 A1‡ | 8/2007 | Fong | G11C 16/10 365/18 |
| 2007/0285131 A1‡ | 12/2007 | Sohn | G11C 7/02 326/95 |
| 2007/0285979 A1‡ | 12/2007 | Turner | G11C 5/005 365/17 |
| 2007/0291532 A1‡ | 12/2007 | Tsuji | G11C 11/16 365/15 |
| 2008/0025073 A1‡ | 1/2008 | Arsovski | G11C 7/067 365/14 |
| 2008/0037333 A1‡ | 2/2008 | Kim | G11C 7/1051 365/18 |
| 2008/0052711 A1‡ | 2/2008 | Forin | G06F 9/4411 718/10 |
| 2008/0137388 A1‡ | 6/2008 | Krishnan | G11C 15/04 365/49 |
| 2008/0178053 A1‡ | 7/2008 | Gorman | G01R 31/31724 714/71 |
| 2008/0215937 A1‡ | 9/2008 | Dreibelbis | G01R 31/31724 714/71 |
| 2008/0165601 A1‡ | 12/2008 | Matick | G11C 11/4091 365/20 |
| 2009/0067218 A1‡ | 3/2009 | Graber | G11C 7/067 365/14 |
| 2009/0154238 A1‡ | 6/2009 | Lee | G11C 11/5628 365/18 |
| 2009/0154273 A1‡ | 6/2009 | Borot | G11C 29/24 365/20 |
| 2009/0254697 A1‡ | 10/2009 | Akerib | G11C 7/1006 711/10 |
| 2010/0017420 A1‡ | 1/2010 | Archer | G06F 15/17337 |
| 2010/0067296 A1‡ | 3/2010 | Li | G11C 8/10 365/18 |
| 2010/0091582 A1‡ | 4/2010 | Vali | G11C 11/5628 365/18 |
| 2010/0172190 A1‡ | 7/2010 | Lavi | G11C 7/02 365/18 |
| 2010/0210076 A1‡ | 8/2010 | Gruber | G11C 5/025 438/12 |
| 2010/0226183 A1‡ | 9/2010 | Kim | G11C 16/0483 365/18 |
| 2010/0308858 A1‡ | 12/2010 | Noda | G11C 7/1006 326/10 |
| 2010/0332895 A1‡ | 12/2010 | Billing | G06F 11/1008 714/6 |
| 2011/0051523 A1‡ | 3/2011 | Manabe | G11C 16/349 365/18 |
| 2011/0063919 A1‡ | 3/2011 | Chandrasekhar | G11C 16/10 365/18 |
| 2011/0093662 A1‡ | 4/2011 | Walker | G06F 15/7821 711/14 |
| 2011/0103151 A1‡ | 5/2011 | Kim | G11C 11/5628 365/18 |
| 2011/0119467 A1‡ | 5/2011 | Cadambi | G06F 15/7821 712/27 |
| 2011/0122695 A1‡ | 5/2011 | Li | G11C 11/5628 365/18 |
| 2011/0140741 A1‡ | 6/2011 | Zerbe | H04L 25/03006 327/57 |
| 2011/0219260 A1‡ | 9/2011 | Nobunaga | G11C 29/76 714/6 |
| 2011/0267883 A1‡ | 11/2011 | Lee | G11C 16/0441 365/18 |
| 2011/0317496 A1‡ | 12/2011 | Bunce | G11C 7/1051 365/18 |
| 2012/0005397 A1‡ | 1/2012 | Lim | G11C 7/062 710/31 |
| 2012/0017039 A1‡ | 1/2012 | Margetts | G06F 12/08 711/10 |

(56) References Cited

U.S. PATENT DOCUMENTS

| | | | | |
|---|---|---|---|---|
| 2012/0023281 A1 ‡ | 1/2012 | Kawasaki | G06F 9/3001 | 710/31 |
| 2012/0120705 A1 ‡ | 5/2012 | Mitsubori | G11C 29/025 | 365/72 |
| 2012/0134216 A1 ‡ | 5/2012 | Singh | G01J 3/02 | 365/18 |
| 2012/0134225 A1 | 5/2012 | Chow | | |
| 2012/0134226 A1 ‡ | 5/2012 | Chow | G11C 7/08 | 365/20 |
| 2012/0135225 A1 ‡ | 5/2012 | Colas | A61K 9/7084 | 428/33 |
| 2012/0140540 A1 ‡ | 6/2012 | Agam | G11C 8/08 | 365/49 |
| 2012/0182798 A1 ‡ | 7/2012 | Hosono | G11C 11/5621 | 365/18 |
| 2012/0195146 A1 ‡ | 8/2012 | Jun | G11C 7/062 | 365/20 |
| 2012/0198310 A1 ‡ | 8/2012 | Tran | H03K 19/0016 | 714/76 |
| 2012/0246380 A1 ‡ | 9/2012 | Akerib | G11C 7/1006 | 711/5 |
| 2012/0265964 A1 ‡ | 10/2012 | Murata | G06F 15/7821 | 712/22 |
| 2012/0281486 A1 ‡ | 11/2012 | Rao | G11C 7/1048 | 365/18 |
| 2012/0303627 A1 ‡ | 11/2012 | Keeton | G06F 16/2462 | 707/74 |
| 2013/0003467 A1 ‡ | 1/2013 | Klein | G11C 7/1006 | 365/18 |
| 2013/0061006 A1 ‡ | 3/2013 | Hein | G06F 13/4243 | 711/15 |
| 2013/0107623 A1 ‡ | 5/2013 | Kavalipurapu | G11C 16/0483 | 365/18 |
| 2013/0117541 A1 ‡ | 5/2013 | Choquette | G06F 9/3842 | 712/21 |
| 2013/0124783 A1 ‡ | 5/2013 | Yoon | G06F 12/0246 | 711/10 |
| 2013/0132702 A1 ‡ | 5/2013 | Patel | G06F 12/08 | 711/20 |
| 2013/0138646 A1 ‡ | 5/2013 | Sirer | G06F 16/278 | 707/73 |
| 2013/0163362 A1 ‡ | 6/2013 | Kim | G11C 7/00 | 365/20 |
| 2013/0173888 A1 ‡ | 7/2013 | Hansen | G06F 9/4484 | 712/22 |
| 2013/0205114 A1 ‡ | 8/2013 | Badam | G06F 3/0613 | 711/20 |
| 2013/0219112 A1 ‡ | 8/2013 | Okin | G06F 12/06 | 711/10 |
| 2013/0227361 A1 ‡ | 8/2013 | Bowers | G06F 11/1666 | 714/71 |
| 2013/0283122 A1 ‡ | 10/2013 | Anholt | H03M 13/29 | 714/75 |
| 2013/0286705 A1 ‡ | 10/2013 | Grover | G11C 7/12 | 365/49 |
| 2013/0326154 A1 ‡ | 12/2013 | Haswell | G06F 12/0864 | 711/14 |
| 2013/0332707 A1 ‡ | 12/2013 | Gueron | G06F 9/3001 | 712/22 |
| 2014/0185395 A1 ‡ | 7/2014 | Seo | G11C 7/22 | 365/18 |
| 2014/0215185 A1 ‡ | 7/2014 | Danielsen | G06F 9/381 | 712/20 |
| 2014/0244703 A1 ‡ | 8/2014 | Luitjens | G06F 9/3001 | 708/49 |
| 2014/0250279 A1 ‡ | 9/2014 | Manning | G06F 12/00 | 711/15 |
| 2014/0344934 A1 ‡ | 11/2014 | Jorgensen | G06F 21/56 | 726/24 |
| 2015/0120987 A1 * | 4/2015 | Wheeler | G11C 7/1006 | 711/102 |
| 2015/0134713 A1 ‡ | 5/2015 | Wheeler | G06F 5/01 | 708/20 |
| 2015/0220269 A1 ‡ | 8/2015 | Lee | G06F 3/061 | 711/10 |
| 2015/0269119 A1 ‡ | 9/2015 | Sreedhar | G06F 15/8015 | 712/22 |
| 2015/0324290 A1 ‡ | 11/2015 | Leidel | G06F 12/0817 | 711/14 |
| 2015/0325272 A1 ‡ | 11/2015 | Murphy | G06F 12/0284 | 711/14 |
| 2016/0064045 A1 ‡ | 3/2016 | La Fratta | G11C 7/065 | 365/189.011 |

FOREIGN PATENT DOCUMENTS

| | | | |
|---|---|---|---|
| EP | 2026209 | ‡ | 2/2009 |
| JP | H0831168 | ‡ | 2/1996 |
| JP | 2009259193 | ‡ | 3/2015 |
| KR | 10-0211482 | ‡ | 8/1998 |
| KR | 10-2010-0134235 | ‡ | 12/2010 |
| KR | 10-2013-0049421 | ‡ | 5/2013 |
| WO | 2001065359 | | 9/2001 |
| WO | WO-2001065359 | ‡ | 9/2001 |
| WO | 2010079451 | | 7/2010 |
| WO | WO-2010079451 | ‡ | 7/2010 |
| WO | 2013062596 | | 5/2013 |
| WO | WO-2013062596 A1 ‡ | | 5/2013 |
| WO | 2013081588 | | 6/2013 |
| WO | 2013095592 | | 6/2013 |
| WO | WO-2013081588 | ‡ | 6/2013 |
| WO | WO-2013095592 | ‡ | 6/2013 |

OTHER PUBLICATIONS

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.‡

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.‡

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.‡

U.S. Appl. No. 13/449,082, entitled, "Methods and Apparatus for Pattern Matching," filed Apr. 17, 2012, (37 pgs.).‡

U.S. Appl. No. 13/743,686, entitled, "Weighted Search and Compare in a Memory Device," filed Jan. 17, 2013, (25 pgs.).‡

U.S. Appl. No. 13/774,636, entitled, "Memory as a Programmable Logic Device," filed Feb. 22, 2013, (30 pgs.).‡

U.S. Appl. No. 13/774,553, entitled, "Neural Network in a Memory Device," filed Feb. 22, 2013, (63 pgs.).‡

U.S. Appl. No. 13/796,189, entitled, "Performing Complex Arithmetic Functions in a Memory Device," filed Mar. 12, 2013, (23 pgs.).‡

Gustavson, "IEEE Standard for Scalable Coherent Interface (SCI)", IEEE Standards, Apr. 11, 2012, p. 241.‡

Boyd et al., "On the General Applicability of Instruction-Set Randomization", Jul.-Sep. 2010, (14 pgs.), vol. 7, Issue 3, IEEE Transactions on Dependable and Secure Computing.‡

Stojmenovic, "Multiplicative Circulant Networks Topological Properties and Communication Algorithms", (25 pgs.), Discrete Applied Mathematics 77 (1997) 281-305.‡

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.‡

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.‡

Debnath, Biplob, Bloomflash: Bloom Filter on Flash-Based Storage, 2011 31st Annual Conference on Distributed Computing Systems, Jun. 20-24, 2011, 10 pgs.‡

(56) References Cited

OTHER PUBLICATIONS

Pagiamtzis, Kostas, "Content-Addressable Memory Introduction", Jun. 25, 2007, (6 pgs.), retrieved from: http://www.pagiamtzis.com/cam/camintro.‡

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.‡

International Search Report and Written Opinion for PCT Application No. PCT/US2013/043702, dated Sep. 26, 2013, (11 pgs.).‡

Elliot, et al., "Computational RAM: Implementing Processors in Memory", Jan.-Mar. 1999, (10 pgs.), vol. 16, Issue 1, IEEE Design and Test of Computers Magazine.‡

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

\* cited by examiner
‡ imported from a related application

Fig. 4A

| | COL 0 | COL 1 | COL 2 | COL 3 | COL 4 | COL 5 | |
|---|---|---|---|---|---|---|---|
| ROW 0 | 1 | 1 | 0 | 0 | 1 | 0 | 474-0 |
| ROW 1 | 1 | 0 | 1 | 0 | 0 | 1 | 474-1 |
| ROW 2 | 0 | 0 | 0 | 1 | 1 | 0 | 474-2 |
| MASK ROW | | | | | | | 490 |
| BIT PATTERN 1 ROW | 1 | 0 | 1 | 0 | 1 | 0 | 492 |
| BIT PATTERN 2 ROW | 0 | 1 | 0 | 1 | 0 | 1 | 493 |
| SENSING CIRCUITRY | | | | | | | 483 |
| VALUES | 3 | 1 | 2 | 4 | 5 | 2 | |

Fig. 4B

| | COL 0 | COL 1 | COL 2 | COL 3 | COL 4 | COL 5 | |
|---|---|---|---|---|---|---|---|
| ROW 0 | 1 | 1 | 0 | 0 | 1 | 0 | 474-0 |
| ROW 1 | 1 | 0 | 1 | 0 | 0 | 1 | 474-1 |
| ROW 2 | 0 | 0 | 0 | 1 | 1 | 0 | 474-2 |
| MASK ROW | 1 | 0 | 0 | 0 | 1 | 0 | 490 |
| BIT PATTERN 1 ROW | 1 | 0 | 1 | 0 | 1 | 0 | 492 |
| BIT PATTERN 2 ROW | 0 | 1 | 0 | 1 | 0 | 1 | 493 |
| SENSING CIRCUITRY | 1 | 0 | 0 | 0 | 1 | 0 | 483 |

| | | 405-0 488-0 COL 0 | 405-1 488-1 COL 1 | 405-2 488-2 COL 2 | 405-3 488-3 COL 3 | 405-4 488-4 COL 4 | 405-5 488-5 COL 5 | |
|---|---|---|---|---|---|---|---|---|
| 404-0 | ROW 0 | 1 | 1 | 0 | 0 | 1 | 0 | 474-0 |
| 404-1 | ROW 1 | 1 | 0 | 1 | 0 | 0 | 1 | 474-1 |
| 404-2 | ROW 2 | 0 | 0 | 0 | 1 | 1 | 0 | 474-2 |
| 404-3 | MASK ROW | 1 | 0 | 0 | 0 | 1 | 0 | 490 |
| 404-4 | BIT PATTERN 1 ROW | 1 | 0 | 1 | 0 | 1 | 0 | 492 |
| 404-5 | BIT PATTERN 2 ROW | 0 | 1 | 0 | 1 | 0 | 1 | 493 |
| 450 | SENSING CIRCUITRY | 1 | 0 | 0 | 0 | 1 | 0 | 483 |

| | | 405-0 488-0 COL 0 | 405-1 488-1 COL 1 | 405-2 488-2 COL 2 | 405-3 488-3 COL 3 | 405-4 488-4 COL 4 | 405-5 488-5 COL 5 | |
|---|---|---|---|---|---|---|---|---|
| 404-0 | ROW 0 | 1 | 1 | 0 | 0 | 0 | 1 | 474-0 |
| 404-1 | ROW 1 | 0 | 1 | 1 | 0 | 1 | 0 | 474-1 |
| 404-2 | ROW 2 | 0 | 0 | 0 | 1 | 0 | 1 | 474-2 |
| 404-3 | MASK ROW | 1 | 0 | 0 | 0 | 1 | 0 | 490 |
| 404-4 | BIT PATTERN 1 ROW | 1 | 0 | 1 | 0 | 1 | 0 | 492 |
| 404-5 | BIT PATTERN 2 ROW | 0 | 1 | 0 | 1 | 0 | 1 | 493 |
| 450 | SENSING CIRCUITRY | 0 | 0 | 0 | 1 | 0 | 1 | 483 |

| | COL 0 | COL 1 | COL 2 | COL 3 | COL 4 | COL 5 | |
|---|---|---|---|---|---|---|---|
| 404-0 ROW 0 | 1 | 1 | 0 | 0 | 0 | 1 | 474-0 |
| 404-1 ROW 1 | 0 | 1 | 1 | 0 | 1 | 0 | 474-1 |
| 404-2 ROW 2 | 0 | 0 | 0 | 1 | 0 | 1 | 474-2 |
| 404-3 MASK ROW | 1 | 0 | 0 | 0 | 1 | 0 | 490 |
| 404-4 BIT PATTERN 1 ROW | 1 | 0 | 1 | 0 | 1 | 0 | 492 |
| 404-5 BIT PATTERN 2 ROW | 0 | 1 | 0 | 1 | 0 | 1 | 493 |
| 450 SENSING CIRCUITRY | 0 | 1 | 0 | 1 | 0 | 0 | 483 |

*Fig. 4E*

| | COL 0 | COL 1 | COL 2 | COL 3 | COL 4 | COL 5 | |
|---|---|---|---|---|---|---|---|
| 404-0 ROW 0 | 1 | 1 | 0 | 0 | 0 | 1 | 474-0 |
| 404-1 ROW 1 | 0 | 1 | 1 | 0 | 1 | 0 | 474-1 |
| 404-2 ROW 2 | 0 | 0 | 0 | 1 | 0 | 1 | 474-2 |
| 404-3 MASK ROW | 0 | 1 | 0 | 1 | 0 | 0 | 490 |
| 404-4 BIT PATTERN 1 ROW | 1 | 0 | 1 | 0 | 1 | 0 | 492 |
| 404-5 BIT PATTERN 2 ROW | 0 | 1 | 0 | 1 | 0 | 1 | 493 |
| 450 SENSING CIRCUITRY | 0 | 1 | 0 | 1 | 0 | 0 | 483 |

*Fig. 4F*

| | COL 0 | COL 1 | COL 2 | COL 3 | COL 4 | COL 5 | |
|---|---|---|---|---|---|---|---|
| 404-0 ROW 0 | 1 | 0 | 1 | 0 | 0 | 1 | 474-0 |
| 404-1 ROW 1 | 0 | 1 | 1 | 1 | 0 | 0 | 474-1 |
| 404-2 ROW 2 | 0 | 0 | 0 | 0 | 1 | 1 | 474-2 |
| 404-3 MASK ROW | 0 | 1 | 0 | 1 | 0 | 0 | 490 |
| 404-4 BIT PATTERN 1 ROW | 1 | 0 | 1 | 0 | 1 | 0 | 492 |
| 404-5 BIT PATTERN 2 ROW | 0 | 1 | 0 | 1 | 0 | 1 | 493 |
| 450 SENSING CIRCUITRY | 0 | 0 | 0 | 0 | 1 | 1 | 483 |

*Fig. 4G*

| | COL 0 | COL 1 | COL 2 | COL 3 | COL 4 | COL 5 | |
|---|---|---|---|---|---|---|---|
| 404-0 ROW 0 | 1 | 0 | 1 | 0 | 0 | 1 | 474-0 |
| 404-1 ROW 1 | 0 | 1 | 1 | 1 | 0 | 0 | 474-1 |
| 404-2 ROW 2 | 0 | 0 | 0 | 0 | 1 | 1 | 474-2 |
| 404-3 MASK ROW | 0 | 0 | 1 | 0 | 0 | 0 | 490 |
| 404-4 BIT PATTERN 1 ROW | 1 | 0 | 1 | 0 | 1 | 0 | 492 |
| 404-5 BIT PATTERN 2 ROW | 0 | 1 | 0 | 1 | 0 | 1 | 493 |
| 450 SENSING CIRCUITRY | 0 | 0 | 1 | 0 | 0 | 0 | 483 |

| | COL 0 | COL 1 | COL 2 | COL 3 | COL 4 | COL 5 | |
|---|---|---|---|---|---|---|---|
| ROW 0 | 1 | 0 | 1 | 0 | 0 | 1 | 474-0 |
| ROW 1 | 0 | 1 | 1 | 1 | 0 | 0 | 474-1 |
| ROW 2 | 0 | 0 | 0 | 0 | 1 | 1 | 474-2 |
| MASK ROW | 0 | 0 | 1 | 0 | 0 | 0 | 490 |
| BIT PATTERN 1 ROW | 1 | 0 | 1 | 0 | 1 | 0 | 492 |
| BIT PATTERN 2 ROW | 0 | 1 | 0 | 1 | 0 | 1 | 493 |
| SENSING CIRCUITRY | 0 | 0 | 1 | 0 | 0 | 0 | 483 |

Fig. 4J

| | COL 0 | COL 1 | COL 2 | COL 3 | COL 4 | COL 5 | |
|---|---|---|---|---|---|---|---|
| ROW 0 | 1 | 0 | 0 | 1 | 0 | 1 | 474-0 |
| ROW 1 | 0 | 1 | 1 | 1 | 0 | 0 | 474-1 |
| ROW 2 | 0 | 0 | 0 | 0 | 1 | 1 | 474-2 |
| MASK ROW | 0 | 0 | 1 | 0 | 0 | 0 | 490 |
| BIT PATTERN 1 ROW | 1 | 0 | 1 | 0 | 1 | 0 | 492 |
| BIT PATTERN 2 ROW | 0 | 1 | 0 | 1 | 0 | 1 | 493 |
| SENSING CIRCUITRY | 0 | 0 | 0 | 0 | 1 | 1 | 483 |
| VALUES | 1 | 2 | 2 | 3 | 4 | 5 | |

Fig. 5A

| | COL 0 | COL 1 | COL 2 | COL 3 | COL 4 | COL 5 | |
|---|---|---|---|---|---|---|---|
| 530 COMPARE START | 505-0 / 588-0 | 505-1 / 588-1 | 505-2 / 588-2 | 505-3 / 588-3 | 505-4 / 588-4 | 505-5 / 588-5 | |
| 504-0 ROW 0 | 1 | 1 | 0 | 0 | 1 | 0 | 574-0 |
| 504-1 ROW 1 | 1 | 0 | 1 | 0 | 0 | 1 | 574-1 |
| 504-2 ROW 2 | 0 | 0 | 0 | 1 | 1 | 0 | 574-2 |
| 504-3 MASK ROW | 0 | 0 | 0 | 0 | 0 | 0 | 590 |
| 504-10 DIFFTHISTIME ROW | 0 | 0 | 0 | 0 | 0 | 0 | 594 |
| 504-11 DIFFEVER ROW | 0 | 0 | 0 | 0 | 0 | 0 | 595 |
| 504-12 DIFFEVER 2 ROW | 0 | 0 | 0 | 0 | 0 | 0 | 596 |
| 550 SENSING CIRCUITRY | 0 | 0 | 0 | 0 | 0 | 0 | 583 |
| 589 VALUES | 3 | 1 | 2 | 4 | 5 | 2 | |
| | 589-0 | 589-1 | 589-2 | 589-3 | 589-4 | 589-5 | |

Fig. 5B

| | COL 0 | COL 1 | COL 2 | COL 3 | COL 4 | COL 5 | |
|---|---|---|---|---|---|---|---|
| 530 ITERATION 1; PHASE 1 | 505-0 / 588-0 | 505-1 / 588-1 | 505-2 / 588-2 | 505-3 / 588-3 | 505-4 / 588-4 | 505-5 / 588-5 | |
| 504-0 ROW 0 | 1 | 1 | 0 | 0 | 1 | 0 | 574-0 |
| 504-1 ROW 1 | 1 | 0 | 1 | 0 | 0 | 1 | 574-1 |
| 504-2 ROW 2 | 0 | 0 | 0 | 1 | 1 | 0 | 574-2 |
| 504-3 MASK ROW | 0 | 0 | 0 | 0 | 0 | 0 | 590 |
| 504-10 DIFFTHISTIME ROW | 0 | 0 | 1 | 0 | 1 | 0 | 594 |
| 504-11 DIFFEVER ROW | 0 | 0 | 0 | 0 | 0 | 0 | 595 |
| 504-12 DIFFEVER 2 ROW | 0 | 0 | 0 | 0 | 0 | 0 | 596 |
| 550 SENSING CIRCUITRY | 0 | 0 | 1 | 0 | 1 | 0 | 583 |

| ITERATION 1; PHASE 2 | COL 0 | COL 1 | COL 2 | COL 3 | COL 4 | COL 5 | |
|---|---|---|---|---|---|---|---|
| ROW 0 | 1 | 1 | 0 | 0 | 1 | 0 | 574-0 |
| ROW 1 | 1 | 0 | 1 | 0 | 0 | 1 | 574-1 |
| ROW 2 | 0 | 0 | 0 | 1 | 1 | 0 | 574-2 |
| MASK ROW | 0 | 0 | 0 | 0 | 0 | 0 | 590 |
| DIFFTHISTIME ROW | 0 | 0 | 1 | 0 | 1 | 0 | 594 |
| DIFFEVER ROW | 0 | 0 | 1 | 0 | 1 | 0 | 595 |
| DIFFEVER 2 ROW | 0 | 0 | 1 | 0 | 1 | 0 | 596 |
| SENSING CIRCUITRY | 0 | 0 | 1 | 0 | 1 | 0 | 583 |

*Fig. 5C*

| ITERATION 1; PHASE 3 | COL 0 | COL 1 | COL 2 | COL 3 | COL 4 | COL 5 | |
|---|---|---|---|---|---|---|---|
| ROW 0 | 1 | 1 | 0 | 0 | 1 | 0 | 574-0 |
| ROW 1 | 1 | 0 | 1 | 0 | 0 | 1 | 574-1 |
| ROW 2 | 0 | 0 | 0 | 1 | 1 | 0 | 574-2 |
| MASK ROW | 0 | 0 | 0 | 0 | 0 | 0 | 590 |
| DIFFTHISTIME ROW | 0 | 0 | 0 | 0 | 1 | 0 | 594 |
| DIFFEVER ROW | 0 | 0 | 1 | 0 | 1 | 0 | 595 |
| DIFFEVER 2 ROW | 0 | 0 | 1 | 0 | 1 | 0 | 596 |
| SENSING CIRCUITRY | 0 | 0 | 0 | 0 | 1 | 0 | 583 |

*Fig. 5D*

| | 505-0 / 588-0 COL 0 | 505-1 / 588-1 COL 1 | 505-2 / 588-2 COL 2 | 505-3 / 588-3 COL 3 | 505-4 / 588-4 COL 4 | 505-5 / 588-5 COL 5 | |
|---|---|---|---|---|---|---|---|
| 530 → ITERATION 1; PHASE 4 | | | | | | | |
| 504-0 ROW 0 | 1 | 1 | 0 | 0 | 1 | 0 | 574-0 |
| 504-1 ROW 1 | 1 | 0 | 1 | 0 | 0 | 1 | 574-1 |
| 504-2 ROW 2 | 0 | 0 | 0 | 1 | 1 | 0 | 574-2 |
| 504-3 MASK ROW | 0 | 0 | 0 | 0 | 1 | 0 | 590 |
| 504-10 DIFFTHISTIME ROW | 0 | 0 | 0 | 0 | 1 | 0 | 594 |
| 504-11 DIFFEVER ROW | 0 | 0 | 1 | 0 | 1 | 0 | 595 |
| 504-12 DIFFEVER 2 ROW | 0 | 0 | 1 | 0 | 1 | 0 | 596 |
| 550 SENSING CIRCUITRY | 0 | 0 | 0 | 0 | 1 | 0 | 583 |

*Fig. 5E*

| ITERATION 2; PHASE 1 | COL 0 | COL 1 | COL 2 | COL 3 | COL 4 | COL 5 | |
|---|---|---|---|---|---|---|---|
| 504-0 ROW 0 | 1 | 1 | 0 | 0 | 1 | 0 | 574-0 |
| 504-1 ROW 1 | 1 | 0 | 1 | 0 | 0 | 1 | 574-1 |
| 504-2 ROW 2 | 0 | 0 | 0 | 1 | 1 | 0 | 574-2 |
| 504-3 MASK ROW | 0 | 0 | 0 | 0 | 1 | 0 | 590 |
| 504-10 DIFFTHISTIME ROW | 1 | 1 | 1 | 0 | 1 | 1 | 594 |
| 504-11 DIFFEVER ROW | 0 | 0 | 1 | 0 | 1 | 0 | 595 |
| 504-12 DIFFEVER 2 ROW | 0 | 0 | 1 | 0 | 1 | 0 | 596 |
| 550 SENSING CIRCUITRY | 1 | 1 | 1 | 0 | 1 | 1 | 583 |

*Fig. 5F*

| ITERATION 2; PHASE 2 | COL 0 | COL 1 | COL 2 | COL 3 | COL 4 | COL 5 | |
|---|---|---|---|---|---|---|---|
| 504-0 ROW 0 | 1 | 1 | 0 | 0 | 1 | 0 | 574-0 |
| 504-1 ROW 1 | 1 | 0 | 1 | 0 | 0 | 1 | 574-1 |
| 504-2 ROW 2 | 0 | 0 | 0 | 1 | 1 | 0 | 574-2 |
| 504-3 MASK ROW | 0 | 0 | 0 | 0 | 1 | 0 | 590 |
| 504-10 DIFFTHISTIME ROW | 1 | 1 | 0 | 0 | 0 | 1 | 594 |
| 504-11 DIFFEVER ROW | 0 | 0 | 1 | 0 | 1 | 0 | 595 |
| 504-12 DIFFEVER 2 ROW | 1 | 1 | 1 | 0 | 1 | 1 | 596 |
| 550 SENSING CIRCUITRY | 1 | 1 | 1 | 0 | 1 | 1 | 583 |

*Fig. 5G*

| 530 → ITERATION 2; PHASE 3 | COL 0 (505-0 / 588-0) | COL 1 (505-1 / 588-1) | COL 2 (505-2 / 588-2) | COL 3 (505-3 / 588-3) | COL 4 (505-4 / 588-4) | COL 5 (505-5 / 588-5) | |
|---|---|---|---|---|---|---|---|
| 504-0 ROW 0 | 1 | 1 | 0 | 0 | 1 | 0 | 574-0 |
| 504-1 ROW 1 | 1 | 0 | 1 | 0 | 0 | 1 | 574-1 |
| 504-2 ROW 2 | 0 | 0 | 0 | 1 | 1 | 0 | 574-2 |
| 504-3 MASK ROW | 0 | 0 | 0 | 0 | 1 | 0 | 590 |
| 504-10 DIFFTHISTIME ROW | 1 | 0 | 0 | 0 | 0 | 1 | 594 |
| 504-11 DIFFEVER ROW | 0 | 0 | 1 | 0 | 1 | 0 | 595 |
| 504-12 DIFFEVER 2 ROW | 1 | 1 | 1 | 0 | 1 | 0 | 596 |
| 550 SENSING CIRCUITRY | 1 | 0 | 0 | 0 | 0 | 1 | 583 |

*Fig. 5H*

| 530 → ITERATION 2; PHASE 4 | COL 0 (505-0 / 588-0) | COL 1 (505-1 / 588-1) | COL 2 (505-2 / 588-2) | COL 3 (505-3 / 588-3) | COL 4 (505-4 / 588-4) | COL 5 (505-5 / 588-5) | |
|---|---|---|---|---|---|---|---|
| 504-0 ROW 0 | 1 | 1 | 0 | 0 | 1 | 0 | 574-0 |
| 504-1 ROW 1 | 1 | 0 | 1 | 0 | 0 | 1 | 574-1 |
| 504-2 ROW 2 | 0 | 0 | 0 | 1 | 1 | 0 | 574-2 |
| 504-3 MASK ROW | 1 | 0 | 0 | 0 | 1 | 1 | 590 |
| 504-10 DIFFTHISTIME ROW | 1 | 0 | 0 | 0 | 0 | 1 | 594 |
| 504-11 DIFFEVER ROW | 0 | 0 | 1 | 0 | 1 | 0 | 595 |
| 504-12 DIFFEVER 2 ROW | 1 | 1 | 1 | 0 | 1 | 0 | 596 |
| 550 SENSING CIRCUITRY | 1 | 0 | 0 | 0 | 1 | 1 | 583 |

*Fig. 5I*

| 530 → ITERATION 3; PHASE 1 | 505-0 / 588-0 COL 0 | 505-1 / 588-1 COL 1 | 505-2 / 588-2 COL 2 | 505-3 / 588-3 COL 3 | 505-4 / 588-4 COL 4 | 505-5 / 588-5 COL 5 | |
|---|---|---|---|---|---|---|---|
| 504-0 ROW 0 | 1 | 1 | 0 | 0 | 1 | 0 | 574-0 |
| 504-1 ROW 1 | 1 | 0 | 1 | 0 | 0 | 1 | 574-1 |
| 504-2 ROW 2 | 0 | 0 | 0 | 1 | 1 | 0 | 574-2 |
| 504-3 MASK ROW | 1 | 0 | 0 | 0 | 1 | 1 | 590 |
| 504-10 DIFFTHISTIME ROW | 0 | 1 | 0 | 1 | 1 | 0 | 594 |
| 504-11 DIFFEVER ROW | 0 | 0 | 1 | 0 | 1 | 0 | 595 |
| 504-12 DIFFEVER 2 ROW | 1 | 1 | 1 | 0 | 1 | 0 | 596 |
| 550 SENSING CIRCUITRY | 0 | 1 | 1 | 1 | 1 | 0 | 583 |

*Fig. 5J*

| 530 → ITERATION 3; PHASE 2 | 505-0 / 588-0 COL 0 | 505-1 / 588-1 COL 1 | 505-2 / 588-2 COL 2 | 505-3 / 588-3 COL 3 | 505-4 / 588-4 COL 4 | 505-5 / 588-5 COL 5 | |
|---|---|---|---|---|---|---|---|
| 504-0 ROW 0 | 1 | 1 | 0 | 0 | 1 | 0 | 574-0 |
| 504-1 ROW 1 | 1 | 0 | 1 | 0 | 0 | 1 | 574-1 |
| 504-2 ROW 2 | 0 | 0 | 0 | 1 | 1 | 0 | 574-2 |
| 504-3 MASK ROW | 1 | 0 | 0 | 0 | 1 | 1 | 590 |
| 504-10 DIFFTHISTIME ROW | 0 | 1 | 0 | 1 | 0 | 0 | 594 |
| 504-11 DIFFEVER ROW | 1 | 1 | 1 | 0 | 1 | 0 | 595 |
| 504-12 DIFFEVER 2 ROW | 0 | 1 | 1 | 1 | 1 | 0 | 596 |
| 550 SENSING CIRCUITRY | 0 | 1 | 1 | 1 | 1 | 0 | 583 |

*Fig. 5K*

530 → ITERATION 3; PHASE 3

| | COL 0 (505-0 / 588-0) | COL 1 (505-1 / 588-1) | COL 2 (505-2 / 588-2) | COL 3 (505-3 / 588-3) | COL 4 (505-4 / 588-4) | COL 5 (505-5 / 588-5) | |
|---|---|---|---|---|---|---|---|
| 504-0 ROW 0 | 1 | 1 | 0 | 0 | 1 | 0 | 574-0 |
| 504-1 ROW 1 | 1 | 0 | 1 | 0 | 0 | 1 | 574-1 |
| 504-2 ROW 2 | 0 | 0 | 0 | 1 | 1 | 0 | 574-2 |
| 504-3 MASK ROW | 1 | 0 | 0 | 0 | 1 | 1 | 590 |
| 504-10 DIFFTHISTIME ROW | 0 | 1 | 0 | 0 | 0 | 0 | 594 |
| 504-11 DIFFEVER ROW | 1 | 1 | 1 | 0 | 1 | 0 | 595 |
| 504-12 DIFFEVER 2 ROW | 0 | 1 | 1 | 1 | 1 | 0 | 596 |
| 550 SENSING CIRCUITRY | 0 | 1 | 0 | 0 | 0 | 0 | 583 |

*Fig. 5L*

530 → ITERATION 3; PHASE 4

| | COL 0 (505-0 / 588-0) | COL 1 (505-1 / 588-1) | COL 2 (505-2 / 588-2) | COL 3 (505-3 / 588-3) | COL 4 (505-4 / 588-4) | COL 5 (505-5 / 588-5) | |
|---|---|---|---|---|---|---|---|
| 504-0 ROW 0 | 1 | 1 | 0 | 0 | 1 | 0 | 574-0 |
| 504-1 ROW 1 | 1 | 0 | 1 | 0 | 0 | 1 | 574-1 |
| 504-2 ROW 2 | 0 | 0 | 0 | 1 | 1 | 0 | 574-2 |
| 504-3 MASK ROW | 1 | 1 | 0 | 0 | 1 | 1 | 590 |
| 504-10 DIFFTHISTIME ROW | 0 | 1 | 0 | 0 | 0 | 0 | 594 |
| 504-11 DIFFEVER ROW | 1 | 1 | 1 | 0 | 1 | 0 | 595 |
| 504-12 DIFFEVER 2 ROW | 0 | 1 | 1 | 1 | 1 | 0 | 596 |
| 550 SENSING CIRCUITRY | 1 | 1 | 0 | 0 | 1 | 1 | 583 |

| | COL 0 | COL 1 | COL 2 | COL 3 | COL 4 | COL 5 | |
|---|---|---|---|---|---|---|---|
| ROW 0 | 1 | 1 | 0 | 0 | 1 | 0 | 674-0 |
| ROW 1 | 1 | 0 | 1 | 0 | 0 | 1 | 674-1 |
| ROW 2 | 0 | 0 | 0 | 1 | 1 | 0 | 674-2 |
| MASK ROW | 1 | 0 | 0 | 0 | 1 | 0 | 690 |
| SHIFTED MASK ROW | 0 | 0 | 0 | 0 | 0 | 0 | 678 |
| TEMP ROW1 | 0 | 0 | 0 | 0 | 0 | 0 | 680 |
| TEMP ROW2 | 0 | 0 | 0 | 0 | 0 | 0 | 682 |
| SENSING CIRCUITRY | 0 | 0 | 0 | 0 | 0 | 0 | 683 |
| VALUES | 3 | 1 | 2 | 4 | 5 | 2 | |

| | COL 0 | COL 1 | COL 2 | COL 3 | COL 4 | COL 5 | |
|---|---|---|---|---|---|---|---|
| ROW 0 | 1 | 1 | 0 | 0 | 1 | 0 | 674-0 |
| ROW 1 | 1 | 0 | 1 | 0 | 0 | 1 | 674-1 |
| ROW 2 | 0 | 0 | 0 | 1 | 1 | 0 | 674-2 |
| MASK ROW | 1 | 0 | 0 | 0 | 1 | 0 | 690 |
| SHIFTED MASK ROW | 0 | 1 | 0 | 0 | 0 | 1 | 678 |
| TEMP ROW1 | 0 | 0 | 0 | 0 | 0 | 0 | 680 |
| TEMP ROW2 | 0 | 0 | 0 | 0 | 0 | 0 | 682 |
| SENSING CIRCUITRY | 0 | 1 | 0 | 0 | 0 | 1 | 683 |

*Fig. 6B*

| 630 → ITERATION 1; PHASE 1 | COL 0 (605-0 / 688-0) | COL 1 (605-1 / 688-1) | COL 2 (605-2 / 688-2) | COL 3 (605-3 / 688-3) | COL 4 (605-4 / 688-4) | COL 5 (605-5 / 688-5) | |
|---|---|---|---|---|---|---|---|
| 604-0  ROW 0 | 1 | 1 | 0 | 0 | 1 | 0 | 674-0 |
| 604-1  ROW 1 | 1 | 0 | 1 | 0 | 0 | 1 | 674-1 |
| 604-2  ROW 2 | 0 | 0 | 0 | 1 | 1 | 0 | 674-2 |
| 604-3  MASK ROW | 1 | 0 | 0 | 0 | 1 | 0 | 690 |
| 604-21  SHIFTED MASK ROW | 0 | 1 | 0 | 0 | 0 | 1 | 678 |
| 604-22  TEMP ROW1 | 1 | 1 | 0 | 0 | 1 | 0 | 680 |
| 604-23  TEMP ROW2 | 0 | 0 | 0 | 0 | 0 | 0 | 682 |
| 650  SENSING CIRCUITRY | 1 | 1 | 0 | 0 | 1 | 0 | 683 |

*Fig. 6C*

| 630 → ITERATION 1; PHASE 2 | COL 0 (605-0 / 688-0) | COL 1 (605-1 / 688-1) | COL 2 (605-2 / 688-2) | COL 3 (605-3 / 688-3) | COL 4 (605-4 / 688-4) | COL 5 (605-5 / 688-5) | |
|---|---|---|---|---|---|---|---|
| 604-0  ROW 0 | 1 | 1 | 0 | 0 | 1 | 0 | 674-0 |
| 604-1  ROW 1 | 1 | 0 | 1 | 0 | 0 | 1 | 674-1 |
| 604-2  ROW 2 | 0 | 0 | 0 | 1 | 1 | 0 | 674-2 |
| 604-3  MASK ROW | 1 | 0 | 0 | 0 | 1 | 0 | 690 |
| 604-21  SHIFTED MASK ROW | 0 | 1 | 0 | 0 | 0 | 1 | 678 |
| 604-22  TEMP ROW1 | 1 | 1 | 0 | 0 | 1 | 0 | 680 |
| 604-23  TEMP ROW2 | 0 | 1 | 0 | 0 | 0 | 1 | 682 |
| 650  SENSING CIRCUITRY | 0 | 1 | 0 | 0 | 0 | 1 | 683 |

*Fig. 6D*

| 630 → ITERATION 1; PHASE 3 | COL 0 (605-0/688-0) | COL 1 (605-1/688-1) | COL 2 (605-2/688-2) | COL 3 (605-3/688-3) | COL 4 (605-4/688-4) | COL 5 (605-5/688-5) | |
|---|---|---|---|---|---|---|---|
| 604-0 ROW 0 | 1 | 1 | 0 | 0 | 1 | 1 | 674-0 |
| 604-1 ROW 1 | 1 | 0 | 1 | 0 | 0 | 1 | 674-1 |
| 604-2 ROW 2 | 0 | 0 | 0 | 1 | 1 | 0 | 674-2 |
| 604-3 MASK ROW | 1 | 0 | 0 | 0 | 1 | 0 | 690 |
| 604-21 SHIFTED MASK ROW | 0 | 1 | 0 | 0 | 0 | 1 | 678 |
| 604-22 TEMP ROW1 | 1 | 1 | 0 | 0 | 1 | 0 | 680 |
| 604-23 TEMP ROW2 | 0 | 1 | 0 | 0 | 0 | 1 | 682 |
| 650 SENSING CIRCUITRY | 1 | 1 | 0 | 0 | 1 | 1 | 683 |

*Fig. 6E*

| 630 → ITERATION 1; PHASE 4 | COL 0 (605-0/688-0) | COL 1 (605-1/688-1) | COL 2 (605-2/688-2) | COL 3 (605-3/688-3) | COL 4 (605-4/688-4) | COL 5 (605-5/688-5) | |
|---|---|---|---|---|---|---|---|
| 604-0 ROW 0 | 1 | 1 | 0 | 0 | 1 | 1 | 674-0 |
| 604-1 ROW 1 | 1 | 0 | 1 | 0 | 0 | 1 | 674-1 |
| 604-2 ROW 2 | 0 | 0 | 0 | 1 | 1 | 0 | 674-2 |
| 604-3 MASK ROW | 1 | 0 | 0 | 0 | 1 | 0 | 690 |
| 604-21 SHIFTED MASK ROW | 0 | 1 | 0 | 0 | 0 | 1 | 678 |
| 604-22 TEMP ROW1 | 1 | 1 | 0 | 0 | 1 | 0 | 680 |
| 604-23 TEMP ROW2 | 1 | 0 | 0 | 0 | 0 | 0 | 682 |
| 650 SENSING CIRCUITRY | 1 | 0 | 0 | 0 | 0 | 0 | 683 |

*Fig. 6F*

| | COL 0 | COL 1 | COL 2 | COL 3 | COL 4 | COL 5 | |
|---|---|---|---|---|---|---|---|
| ROW 0 | 1 | 1 | 0 | 0 | 0 | 1 | 674-0 |
| ROW 1 | 1 | 0 | 1 | 0 | 0 | 1 | 674-1 |
| ROW 2 | 0 | 0 | 0 | 1 | 1 | 0 | 674-2 |
| MASK ROW | 1 | 0 | 0 | 0 | 1 | 0 | 690 |
| SHIFTED MASK ROW | 0 | 1 | 0 | 0 | 0 | 1 | 678 |
| TEMP ROW1 | 1 | 1 | 0 | 0 | 1 | 0 | 680 |
| TEMP ROW2 | 1 | 0 | 0 | 0 | 0 | 0 | 682 |
| SENSING CIRCUITRY | 1 | 1 | 0 | 0 | 0 | 1 | 683 |

ITERATION 1; PHASE 5

*Fig. 6G*

| 630 → ITERATION 2; PHASE 1 | COL 0 (605-0 / 688-0) | COL 1 (605-1 / 688-1) | COL 2 (605-2 / 688-2) | COL 3 (605-3 / 688-3) | COL 4 (605-4 / 688-4) | COL 5 (605-5 / 688-5) | |
|---|---|---|---|---|---|---|---|
| 604-0  ROW 0 | 1 | 1 | 0 | 0 | 0 | 1 | 674-0 |
| 604-1  ROW 1 | 1 | 0 | 1 | 0 | 0 | 1 | 674-1 |
| 604-2  ROW 2 | 0 | 0 | 0 | 1 | 1 | 0 | 674-2 |
| 604-3  MASK ROW | 1 | 0 | 0 | 0 | 1 | 0 | 690 |
| 604-21  SHIFTED MASK ROW | 0 | 1 | 0 | 0 | 0 | 1 | 678 |
| 604-22  TEMP ROW1 | 1 | 0 | 1 | 0 | 0 | 1 | 680 |
| 604-23  TEMP ROW2 | 1 | 0 | 0 | 0 | 0 | 0 | 682 |
| 650  SENSING CIRCUITRY | 1 | 0 | 1 | 0 | 0 | 1 | 683 |

*Fig. 6H*

| 630 → ITERATION 2; PHASE 2 | COL 0 (605-0 / 688-0) | COL 1 (605-1 / 688-1) | COL 2 (605-2 / 688-2) | COL 3 (605-3 / 688-3) | COL 4 (605-4 / 688-4) | COL 5 (605-5 / 688-5) | |
|---|---|---|---|---|---|---|---|
| 604-0  ROW 0 | 1 | 1 | 0 | 0 | 0 | 1 | 674-0 |
| 604-1  ROW 1 | 1 | 0 | 1 | 0 | 0 | 1 | 674-1 |
| 604-2  ROW 2 | 0 | 0 | 0 | 1 | 1 | 0 | 674-2 |
| 604-3  MASK ROW | 1 | 0 | 0 | 0 | 1 | 0 | 690 |
| 604-21  SHIFTED MASK ROW | 0 | 1 | 0 | 0 | 0 | 1 | 678 |
| 604-22  TEMP ROW1 | 1 | 0 | 1 | 0 | 0 | 1 | 680 |
| 604-23  TEMP ROW2 | 0 | 1 | 0 | 0 | 0 | 0 | 682 |
| 650  SENSING CIRCUITRY | 0 | 1 | 0 | 0 | 0 | 0 | 683 |

*Fig. 6I*

| 630 → ITERATION 2; PHASE 3 | COL 0 (605-0 / 688-0) | COL 1 (605-1 / 688-1) | COL 2 (605-2 / 688-2) | COL 3 (605-3 / 688-3) | COL 4 (605-4 / 688-4) | COL 5 (605-5 / 688-5) | |
|---|---|---|---|---|---|---|---|
| 604-0 ROW 0 | 1 | 1 | 0 | 0 | 0 | 1 | 674-0 |
| 604-1 ROW 1 | 1 | 1 | 1 | 0 | 0 | 0 | 674-1 |
| 604-2 ROW 2 | 0 | 0 | 0 | 1 | 1 | 0 | 674-2 |
| 604-3 MASK ROW | 1 | 0 | 0 | 0 | 1 | 0 | 690 |
| 604-21 SHIFTED MASK ROW | 0 | 1 | 0 | 0 | 0 | 1 | 678 |
| 604-22 TEMP ROW1 | 1 | 0 | 1 | 0 | 0 | 1 | 680 |
| 604-23 TEMP ROW2 | 0 | 1 | 0 | 0 | 0 | 0 | 682 |
| 650 SENSING CIRCUITRY | 1 | 1 | 1 | 0 | 0 | 0 | 683 |

*Fig. 6J*

| 630 → ITERATION 2; PHASE 4 | COL 0 (605-0 / 688-0) | COL 1 (605-1 / 688-1) | COL 2 (605-2 / 688-2) | COL 3 (605-3 / 688-3) | COL 4 (605-4 / 688-4) | COL 5 (605-5 / 688-5) | |
|---|---|---|---|---|---|---|---|
| 604-0 ROW 0 | 1 | 1 | 0 | 0 | 0 | 1 | 674-0 |
| 604-1 ROW 1 | 1 | 1 | 1 | 0 | 0 | 0 | 674-1 |
| 604-2 ROW 2 | 0 | 0 | 0 | 1 | 1 | 0 | 674-2 |
| 604-3 MASK ROW | 1 | 0 | 0 | 0 | 1 | 0 | 690 |
| 604-21 SHIFTED MASK ROW | 0 | 1 | 0 | 0 | 0 | 1 | 678 |
| 604-22 TEMP ROW1 | 1 | 0 | 1 | 0 | 0 | 1 | 680 |
| 604-23 TEMP ROW2 | 0 | 0 | 0 | 0 | 1 | 0 | 682 |
| 650 SENSING CIRCUITRY | 0 | 0 | 0 | 0 | 1 | 0 | 683 |

*Fig. 6K*

| | 605-0 688-0 COL 0 | 605-1 688-1 COL 1 | 605-2 688-2 COL 2 | 605-3 688-3 COL 3 | 605-4 688-4 COL 4 | 605-5 688-5 COL 5 | |
|---|---|---|---|---|---|---|---|
| 630 → ITERATION 2; PHASE 5 | | | | | | | |
| 604-0 ROW 0 | 1 | 1 | 0 | 0 | 0 | 1 | 674-0 |
| 604-1 ROW 1 | 0 | 1 | 1 | 0 | 1 | 0 | 674-1 |
| 604-2 ROW 2 | 0 | 0 | 0 | 1 | 1 | 0 | 674-2 |
| 604-3 MASK ROW | 1 | 0 | 0 | 0 | 1 | 0 | 690 |
| 604-21 SHIFTED MASK ROW | 0 | 1 | 0 | 0 | 0 | 1 | 678 |
| 604-22 TEMP ROW1 | 1 | 0 | 1 | 0 | 0 | 1 | 680 |
| 604-23 TEMP ROW2 | 0 | 0 | 0 | 0 | 1 | 0 | 682 |
| 650 SENSING CIRCUITRY | 0 | 1 | 1 | 0 | 1 | 0 | 683 |

*Fig. 6L*

| 630 → ITERATION 3; PHASE 1 | COL 0 (605-0 / 688-0) | COL 1 (605-1 / 688-1) | COL 2 (605-2 / 688-2) | COL 3 (605-3 / 688-3) | COL 4 (605-4 / 688-4) | COL 5 (605-5 / 688-5) | |
|---|---|---|---|---|---|---|---|
| 604-0 ROW 0 | 1 | 1 | 0 | 0 | 0 | 1 | 674-0 |
| 604-1 ROW 1 | 0 | 1 | 1 | 0 | 1 | 0 | 674-1 |
| 604-2 ROW 2 | 0 | 0 | 0 | 1 | 1 | 0 | 674-2 |
| 604-3 MASK ROW | 1 | 0 | 0 | 0 | 1 | 0 | 690 |
| 604-21 SHIFTED MASK ROW | 0 | 1 | 0 | 0 | 0 | 1 | 678 |
| 604-22 TEMP ROW1 | 0 | 0 | 0 | 1 | 1 | 0 | 680 |
| 604-23 TEMP ROW2 | 0 | 0 | 0 | 0 | 0 | 0 | 682 |
| 650 SENSING CIRCUITRY | 0 | 0 | 0 | 1 | 1 | 0 | 683 |

*Fig. 6M*

| 630 → ITERATION 3; PHASE 2 | COL 0 (605-0 / 688-0) | COL 1 (605-1 / 688-1) | COL 2 (605-2 / 688-2) | COL 3 (605-3 / 688-3) | COL 4 (605-4 / 688-4) | COL 5 (605-5 / 688-5) | |
|---|---|---|---|---|---|---|---|
| 604-0 ROW 0 | 1 | 1 | 0 | 0 | 0 | 1 | 674-0 |
| 604-1 ROW 1 | 0 | 1 | 1 | 0 | 1 | 0 | 674-1 |
| 604-2 ROW 2 | 0 | 0 | 0 | 1 | 1 | 0 | 674-2 |
| 604-3 MASK ROW | 1 | 0 | 0 | 0 | 1 | 0 | 690 |
| 604-21 SHIFTED MASK ROW | 0 | 1 | 0 | 0 | 0 | 1 | 678 |
| 604-22 TEMP ROW1 | 0 | 0 | 0 | 1 | 1 | 0 | 680 |
| 604-23 TEMP ROW2 | 0 | 0 | 0 | 0 | 0 | 1 | 682 |
| 650 SENSING CIRCUITRY | 0 | 0 | 0 | 0 | 0 | 1 | 683 |

*Fig. 6N*

| 630 → ITERATION 3; PHASE 3 | COL 0 (605-0 / 688-0) | COL 1 (605-1 / 688-1) | COL 2 (605-2 / 688-2) | COL 3 (605-3 / 688-3) | COL 4 (605-4 / 688-4) | COL 5 (605-5 / 688-5) | |
|---|---|---|---|---|---|---|---|
| 604-0 ROW 0 | 1 | 1 | 0 | 0 | 0 | 1 | 674-0 |
| 604-1 ROW 1 | 0 | 1 | 1 | 0 | 1 | 0 | 674-1 |
| 604-2 ROW 2 | 0 | 0 | 0 | 1 | 1 | 1 | 674-2 |
| 604-3 MASK ROW | 1 | 0 | 0 | 0 | 1 | 0 | 690 |
| 604-21 SHIFTED MASK ROW | 0 | 1 | 0 | 0 | 0 | 1 | 678 |
| 604-22 TEMP ROW1 | 0 | 0 | 0 | 1 | 1 | 0 | 680 |
| 604-23 TEMP ROW2 | 0 | 0 | 0 | 0 | 0 | 1 | 682 |
| 650 SENSING CIRCUITRY | 0 | 0 | 0 | 1 | 1 | 1 | 683 |

*Fig. 6O*

| 630 → ITERATION 3; PHASE 4 | COL 0 (605-0 / 688-0) | COL 1 (605-1 / 688-1) | COL 2 (605-2 / 688-2) | COL 3 (605-3 / 688-3) | COL 4 (605-4 / 688-4) | COL 5 (605-5 / 688-5) | |
|---|---|---|---|---|---|---|---|
| 604-0 ROW 0 | 1 | 1 | 0 | 0 | 0 | 1 | 674-0 |
| 604-1 ROW 1 | 0 | 1 | 1 | 0 | 1 | 0 | 674-1 |
| 604-2 ROW 2 | 0 | 0 | 0 | 1 | 1 | 1 | 674-2 |
| 604-3 MASK ROW | 1 | 0 | 0 | 0 | 1 | 0 | 690 |
| 604-21 SHIFTED MASK ROW | 0 | 1 | 0 | 0 | 0 | 1 | 678 |
| 604-22 TEMP ROW1 | 0 | 0 | 0 | 1 | 1 | 0 | 680 |
| 604-23 TEMP ROW2 | 0 | 0 | 0 | 0 | 0 | 0 | 682 |
| 650 SENSING CIRCUITRY | 0 | 0 | 0 | 0 | 0 | 0 | 683 |

*Fig. 6P*

| ITERATION 3; PHASE 5 630 | COL 0 605-0 688-0 | COL 1 605-1 688-1 | COL 2 605-2 688-2 | COL 3 605-3 688-3 | COL 4 605-4 688-4 | COL 5 605-5 688-5 | |
|---|---|---|---|---|---|---|---|
| 604-0 ROW 0 | 1 | 1 | 0 | 0 | 0 | 1 | 674-0 |
| 604-1 ROW 1 | 0 | 1 | 1 | 0 | 1 | 0 | 674-1 |
| 604-2 ROW 2 | 0 | 0 | 0 | 1 | 0 | 1 | 674-2 |
| 604-3 MASK ROW | 1 | 0 | 0 | 0 | 1 | 0 | 690 |
| 604-21 SHIFTED MASK ROW | 0 | 1 | 0 | 0 | 0 | 1 | 678 |
| 604-22 TEMP ROW1 | 0 | 0 | 0 | 1 | 1 | 0 | 680 |
| 604-23 TEMP ROW2 | 0 | 0 | 0 | 0 | 0 | 0 | 682 |
| 650 SENSING CIRCUITRY | 0 | 0 | 0 | 1 | 0 | 1 | 683 |

*Fig. 6Q*

SORT OPERATION IN MEMORY

PRIORITY INFORMATION

This application is a Continuation of U.S. application Ser. No. 14/920,537, filed Oct. 22, 2015, which issues as U.S. Pat. No. 10,147,480 on Dec. 4, 2018, which claims the benefit of U.S. Provisional Application No. 62/068,247, filed Oct. 24, 2014, the contents of which are incorporated herein by reference.

TECHNICAL FIELD

The present disclosure relates generally to semiconductor memory apparatuses and methods, and more particularly, to apparatuses and methods related to performing swap operations in a memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered.

In many instances, the processing resources (e.g., processor and/or associated functional unit circuitry) may be external to the memory array, and data can be accessed (e.g., via a bus between the processing resources and the memory array) to execute instructions. Data can be moved from the memory array to registers external to the memory array via a bus.

BRIEF DESCRIPTION OF THE DRAWINGS

FIGS. 4A-4J illustrate the states of memory cells of a portion of an array at a number of particular phases associated with performing a swap operation in accordance with a number of embodiments of the present disclosure.

FIGS. 5A-5M illustrate the states of memory cells of a portion of an array at a number of particular phases associated with performing a compare operation in accordance with a number of embodiments of the present disclosure.

FIGS. 6A-6Q illustrate the states of memory cells of a portion of an array at a number of particular phases associated with performing a swap operation in accordance with a number of embodiments of the present disclosure.

DETAILED DESCRIPTION

Figure 1:
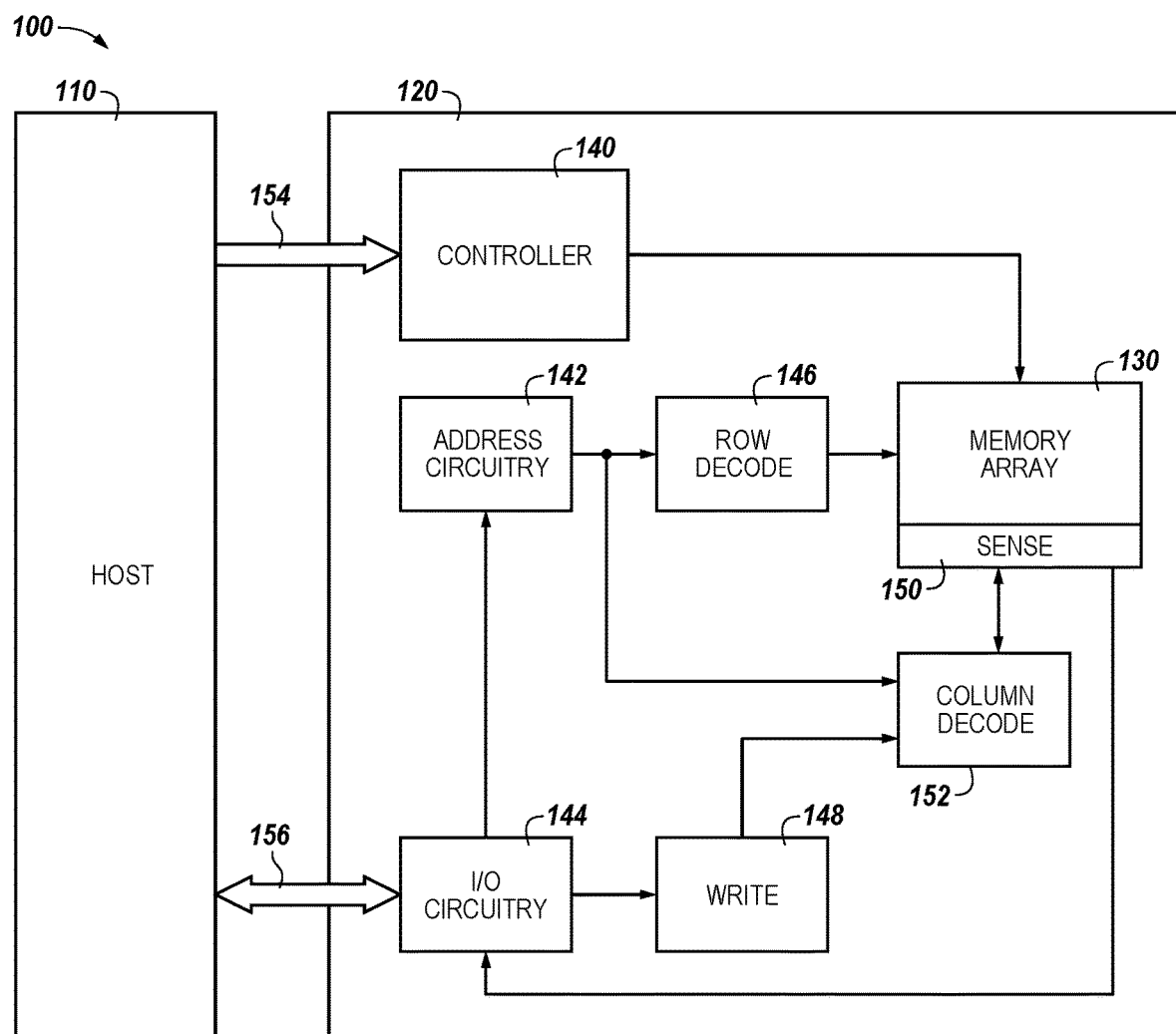
FIG. 1 is a block diagram of an apparatus in the form of a computing system including a memory device in accordance with a number of embodiments of the present disclosure.

The present disclosure includes apparatuses and methods related to performing sort operations in a memory. A sort operation can be performed on a first element (e.g., first bit-vector) and a second element (e.g., second bit-vector). An example apparatus might include a first group of memory cells coupled to a first sense line, a second group of memory cells coupled to a second sense line, and a controller configured to control sensing circuitry to sort a first element stored in the first group of memory cells and a second element stored in the second group of memory cells by performing an operation without transferring data via an input/output (I/O) line.

As used herein, a first element and a second element can be numerical values that can be stored (e.g., as bit-vectors) in an array. As used herein, sorting is defined as storing a first element, which is originally (e.g., initially) stored in a first group of memory cells, in a second group of memory cells in which a second element is originally stored, and storing the second element, which is originally stored in the second group of memory cells, in the first group of memory cells based on the numerical value of the first element and the numerical value of the second element. As used herein, comparing is defined as determining whether a first element is greater than second element and storing the result of the compare operation as a mask to be used by the sort operation and/or the swap operation. As used herein, swapping is defined as storing a first element, which is originally (e.g., initially) stored in a first group of memory cells, in a second group of memory cells in which a second element is originally stored, and storing the second element, which is originally stored in the second group of memory cells, in the first group of memory cells based on a mask that was created by the compare operation.

In a number of examples, an element can represent an object and/or other construct, which may be represented by a bit-vector. As an example, a sort operation can be performed to sort bit-vectors that represent respective objects.

A number of embodiments of the present disclosure can provide a reduction of the number of operations (e.g., computations, functions, etc.) and/or time involved in performing a sort operation (e.g., sort function) relative to previous approaches. For instance, the number of computations and/or the time can be reduced due to an ability to perform various comparison operations and/or swap operation, as part of the sort operation, in parallel (e.g., simultaneously). Performing a number of sort operations as described herein can also reduce power consumption as compared to previous approaches. In accordance with a number of embodiments, a sort operation can be performed on elements (e.g., data in the form of bit-vectors stored in an array) without transferring data out of the memory array and/or sensing circuitry via a bus (e.g., data bus, address bus, control bus, etc.), which can reduce the time and/or power needed to transfer data to a host in order to perform the sort operation. The result of the sort operation can be provided to other single instruction multiple data (SIMD) operations (e.g., bit-vector division) and/or advanced pattern search applications, for example. A sort operation can involve performing a compare operation, a swap operation, and/or a number of logical operations (e.g., AND operations, OR operations, SHIFT operations, and INVERT operations, etc.). However, embodiments are not limited to these examples. As used herein SIMD operations is defined as performing a same operation on multiple elements in parallel (e.g., simultaneously).

In various previous approaches, elements (e.g., data stored in a particular group of memory cells and data stored in a different particular group of memory cells) to be sorted may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations to sort the elements and to store the result. However, often only two elements can be sorted by the ALU circuitry at a given time, and transferring data to/from memory from/to registers via a bus can involve significant power consumption and time requirements. Even if the processing resource is located on a same chip as the memory array, significant power can be consumed in moving data out of the array to the compute circuitry (e.g., ALU), which can involve performing a sense line address access (e.g., firing of a column decode signal) in order to transfer data from sense lines onto I/O lines, moving the data to the array periphery, and providing the data to a register in association with performing a sort operation, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M," "N," "J," "R," "S," "U," "V," "X," "Y," and "W," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIG. 2.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller.

An example of the sensing circuitry 150 is described further below in association with FIG. 2. For instance, in a number of embodiments, the sensing circuitry 150 can comprise a number of sense amplifiers and a number of compute components, which may comprise an accumulator and can be used to perform logical operations (e.g., on data associated with complementary sense lines) in association with performing a sort operation in accordance with embodiments described herein. In a number of embodiments, the sensing circuitry (e.g., 150) can be used to perform a sort operation on data stored in array 130 and to store the results of the sort operation back to the array 130 without transferring data via a sense line address access (e.g., without firing a column decode signal). As such, a sort operation can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on controller 140 or elsewhere)).

In various previous approaches, data associated with a sort operation, for instance, would be read from memory via sensing circuitry and provided to an external ALU. The external ALU circuitry would perform the sort operations and the result could be transferred back to the array via the local I/O lines. In contrast, in a number of embodiments of the present disclosure, sensing circuitry (e.g., 150) is configured to perform a sort operation on data stored in memory cells in memory array 130 and store the result back to the array 130 without enabling a local I/O line coupled to the sensing circuitry.

As such, in a number of embodiments, registers and/or an ALU external to array 130 and sensing circuitry 150 may not be needed to perform the sort operation as the sensing circuitry 150 can perform the appropriate computations involved in performing the sort operation using the address space of memory array 130. Additionally, the sort operation can be performed without the use of an external processing resource.

Figure 2A:
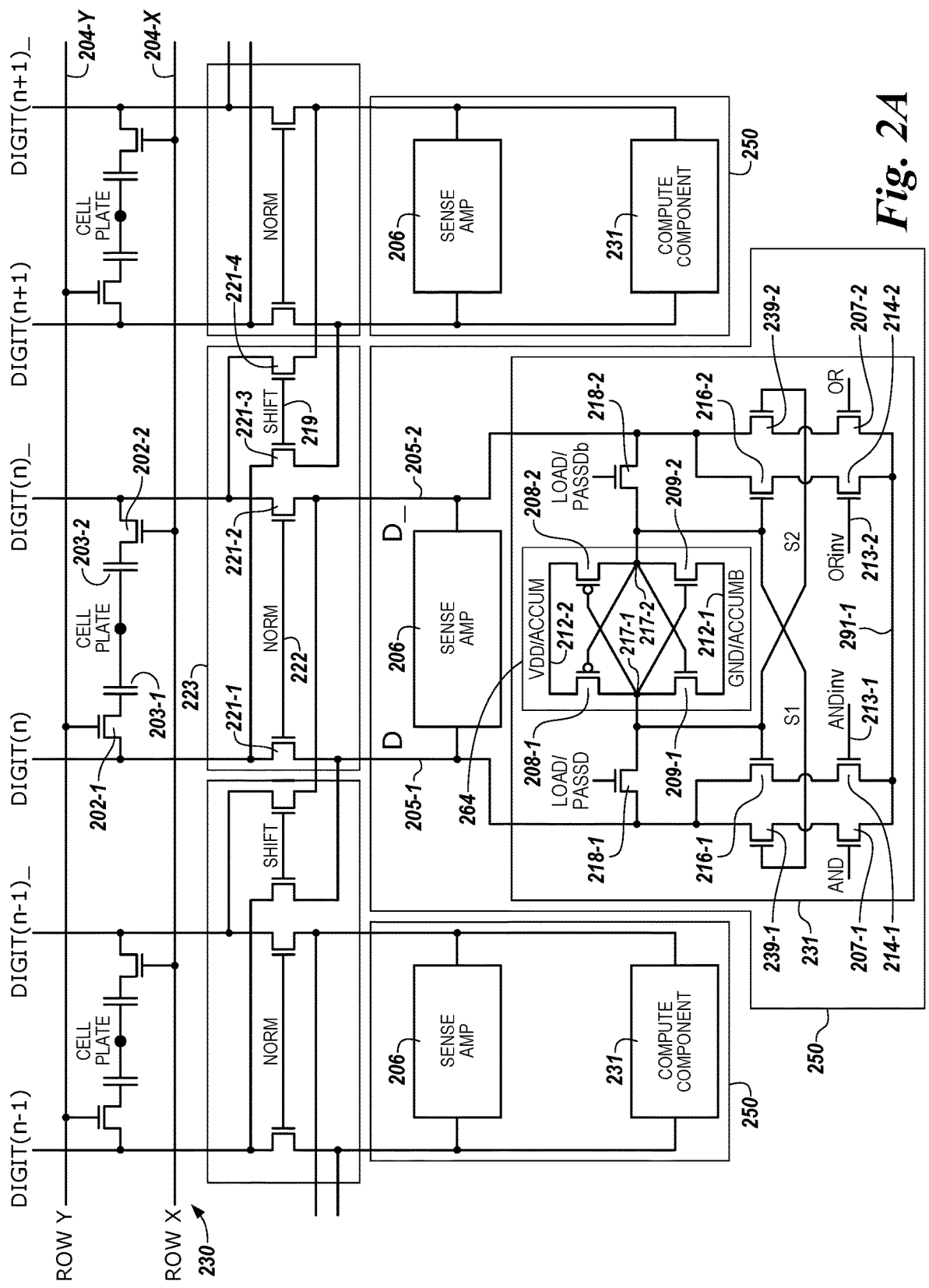
FIG. 2A illustrates a schematic diagram of a portion of a memory array in accordance with a number of embodiments of the present disclosure.

FIG. 2A illustrates a schematic diagram of a portion of a memory array 230 including sensing circuitry 250 in accordance with a number of embodiments of the present disclosure. In FIG. 2A, a memory cell comprises a storage element (e.g., capacitor) and an access device (e.g., transistor). For instance, a first memory cell comprises transistor 202-1 and capacitor 203-1 and a second memory cell comprises transistor 202-2 and capacitor 203-2. In this example, the memory array 230 is a DRAM array of 1T1C (one transistor one capacitor) memory cells; however, embodiments are not so limited. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines (e.g., DIGIT(n−1)/DIGIT(n−1)_, DIGIT(n)/DIGIT(n)_, DIGIT(n+1)/DIGIT(n+1)_). The individual data lines corresponding to each pair of complementary data lines can also be referred to as data lines 205-1 (D) and 205-2 (D_) respectively. Although only three pair of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2A, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can comprise a cross coupled latch, which can be referred to herein as a primary latch. The sense amplifier 206 can be configured, for example, as described with respect to FIG. 2B.

In the example illustrated in FIG. 2A, the circuitry corresponding to compute component 231 comprises a static latch 264 and an additional ten transistors that implement, among other things, a dynamic latch. The dynamic latch and/or static latch of the compute component 231 can be collectively referred to herein as a secondary latch, which can serve as an accumulator. As such, the compute component 231 can operate as and/or be referred to herein as an accumulator. The compute component 231 can be coupled to each of the data lines 205-1 (D) and 205-2 (D_) as shown in FIG. 2A. However, embodiments are not limited to this example. The transistors of compute component 231 can all be n-channel transistors (e.g., NMOS transistors); however, embodiments are not so limited.

In this example, data line 205-1 can be coupled to a first source/drain region of transistors 216-1 and 239-1, as well as to a first source/drain region of load/pass transistor 218-1. Data line 205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage line 291-1 (e.g., ground (GND)). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating the LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231 shown in FIG. 2A has the benefit of balancing the sense amplifier for functionality when the pull-down transistors 207-1, 207-2, 214-1, and 214-2 are conducting before the sense amplifier 206 is fired (e.g., during pre-seeding of the sense amplifier 206). As used herein, firing the sense amplifier 206 refers to enabling the sense amplifier 206 to set the primary latch and subsequently disabling the sense amplifier 206 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ORinv control signal line 213-2) can be operated to pull-down data line 205-2 (D_).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each having a gate coupled to one of a LOAD control signal or a PASSD/PASSDB control signal.

According to some embodiments, the gate of load/pass transistor 218-1 can be coupled to a PASSD control signal, and the gate of load/pass transistor 218-2 can be coupled to a PASSDb control signal. In the configuration in which the gates of transistors 218-1 and 218-2 are respectively coupled to one of the PASSD and PASSDb control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors.

For instance, load transistors can be constructed to handle loading associated with coupling data lines to the local dynamic nodes S1 and S2, and pass transistors can be constructed to handle heavier loading associated with coupling data lines to an adjacent accumulator (e.g., through the shift circuitry 223, as shown in FIG. 2A). According to some embodiments, load/pass transistors 218-1 and 218-2 can be configured to accommodate the heavier loading corresponding to a pass transistor but be coupled and operated as a load transistor. Load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 includes four transistors 208-1, 208-2, 209-1, and 209-2 coupled to a pair of complementary data lines 205-1 and 205-2 through load/pass transistors 218-1 and 218-2. However, embodiments are not limited to this configuration. The latch 264 can be a cross coupled latch (e.g., gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2). As described further herein, the cross coupled latch 264 can be referred to as a static latch.

The voltages or currents on the respective data lines 205-1 and 205-2 can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
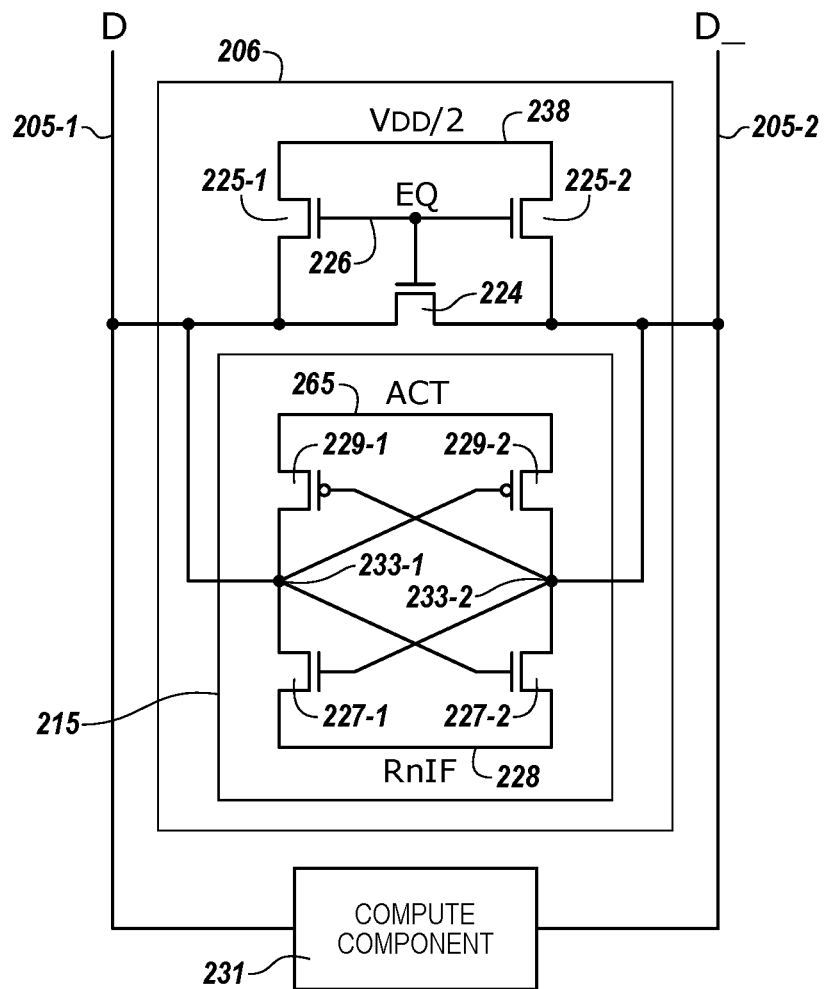
FIG. 2B illustrates a schematic diagram of a portion of a memory array in accordance with a number of embodiments of the present disclosure.

In this example, a second source/drain region of transistor 209-1 and 209-2 is commonly coupled to a negative control signal line 212-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the complementary (e.g., other) of the activated positive control signal voltage (e.g., $V_{DD}$) or the activated negative control signal voltage (e.g., ground).

FIG. 2B illustrates a schematic diagram of a portion of a memory array in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206) can comprise a number of transistors formed on pitch with the transistors of the corresponding compute component 231 and/or the memory cells of an array (e.g., 230 shown in FIG. 2A) to which they are coupled, which may conform to a particular feature size (e.g., $4F^2$, $6F^2$, etc.). The sense amplifier 206 comprises a latch 215 including four transistors coupled to a pair of complementary data lines 205-1 and 205-2. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). As described further herein, the latch 215 comprising transistors 227-1, 227-2, 229-1, and 229-2 can be referred to as a primary latch. However, embodiments are not limited to this example.

The voltages and/or currents on the respective data lines 205-1 and 205-2 can be provided to the respective latch inputs 233-1 and 233-2 of the cross coupled latch 215 (e.g., the input of the secondary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231 (e.g., accumulator) can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 265 (ACT). The ACT signal 265 can be a supply voltage (e.g., $V_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines 205-1 and 205-2 (e.g., in association with preparing the sense amplifier for a sensing operation). In this example, the equilibration circuitry comprises a transistor 224 having a first source/drain region coupled to a first source/drain region of transistor 225-1 and data line 205-1. A second source/drain region of transistor 224 can be coupled to a first source/drain region of transistor 225-2 and data line 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 226 (EQ). As such, activating EQ enables the transistors 224, 225-1, and 225-2, which effectively shorts data line 205-1 to data line 205-2 such that the data lines 205-1 and 205-2 are equilibrated to equilibration voltage $V_{DD}/2$. According to various embodiments of the present disclosure, a number of logical operations can be performed using the sense amplifier, and storing the result in the compute component (e.g., accumulator).

As shown in FIG. 2A, the sense amplifier 206 and the compute component 231 can be coupled to the array 230 via shift circuitry 223. In this example, the shift circuitry 223 comprises a pair of isolation devices (e.g., isolation transistors 221-1 and 221-2) coupled to data lines 205-1 and 205-2, respectively). The isolation transistors 221-1 and 221-2 are coupled to a control signal 222 (NORM) that, when activated, enables (e.g., turns on) the isolation transistors 221-1 and 221-2 to couple the corresponding sense amplifier 206 and compute component 231 to a corresponding column of memory cells (e.g., to a corresponding pair of complementary data lines 205-1 and 205-2. According to various embodiments, conduction of isolation transistors 221-1 and 221-2 can be referred to as a "normal" configuration of the shift circuitry 223.

In the example illustrated in FIG. 2A, the shift circuitry 223 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206 and compute component 231 are coupled to a different pair of complementary data lines (e.g., a pair of complementary data lines different than the pair of complementary data lines to which isolation transistors 221-1 and 221-2 couple the particular sense amplifier 206 and compute component 231), or can couple a particular sense amplifier 206 and compute component 231 to another memory array (and isolate the particular sense amplifier 206 and compute component 231 from a first memory array). According to various embodiments, the shift circuitry 223 can be arranged as a portion of (e.g., within) the sense amplifier 206, for instance.

Although the shift circuitry 223 shown in FIG. 2A includes isolation transistors 221-1 and 221-2 used to couple particular sensing circuitry 250 (e.g., a particular sense amplifier 206 and corresponding compute component 231) to a particular pair of complementary data lines 205-1 and 205-2 (e.g., DIGIT(n) and DIGIT(n)_) and isolation transistors 221-3 and 221-4 are arranged to couple the particular sensing circuitry 250 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_) and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A).

Embodiments of the present disclosure are not limited to the configuration of shift circuitry 223 shown in FIG. 2A. In a number of embodiments, shift circuitry 223 such as that shown in FIG. 2A can be operated (e.g., in conjunction with sense amplifiers 206 and compute components 231) in association with performing various operations (e.g., logical and/or arithmetic operations) without transferring data out of the sensing circuitry 250 via an I/O line (e.g., I/O line 334 shown in FIG. 3), for instance. Although shift circuitry 223 is shown to be separate from sensing circuitry 250 (e.g., sensing circuitry 150 in FIG. 1), shift circuitry 223 can be considered to be part of sensing circuitry 250 (e.g., sensing circuitry 150 in FIG. 1).

Although not shown in FIG. 2A, each column of memory cells can be coupled to a column decode line (e.g., decode lines 310-0 to 310-W shown in FIG. 3) that can be activated to transfer, via local I/O line (e.g., I/O line 334 shown in FIG. 3), a data value from a corresponding sense amplifier 206 and/or compute component 231 to a control component external to the array such as an external processing resource (e.g., host processor and/or other functional unit circuitry). The column decode line can be coupled to a column decoder (e.g., column decoder 152 shown in FIG. 1). However, as described herein, in a number of embodiments, data need not be transferred via such I/O lines to perform logical operations in accordance with embodiments of the present disclosure. In a number of embodiments, shift circuitry 223 can be operated in conjunction with sense amplifiers 206 and compute components 231 to perform various operations (e.g., logical operations in association with performing subtraction, addition, multiplication, division, etc.) without transferring data to a control component external to the array, for instance.

The sensing circuitry 250 can be operated in several modes to perform logical operations, including a first mode in which a result of the logical operation is initially stored in the sense amplifier 206, and a second mode in which a result of the logical operation is initially stored in the compute component 231. Operation of the sensing circuitry 250 in the first mode is described below with respect to FIGS. 7 and 8, and operation of the sensing circuitry 250 in the second mode is described below with respect to FIGS. 9-12. Additionally with respect to the first operating mode, sensing circuitry 250 can be operated in both pre-sensing (e.g., sense amps fired before logical operation control signal active) and post-sensing (e.g., sense amps fired after logical operation control signal active) modes with a result of a logical operation being initially stored in the sense amplifier 206.

As described further below, the sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations using less power than various previous approaches. Additionally, since a number of embodiments eliminate the need to transfer data across I/O lines (e.g., between memory and discrete processor) in order to perform various operations (e.g., compute functions), a number of embodiments can enable an increased parallel processing capability as compared to previous approaches.

Figure 3:
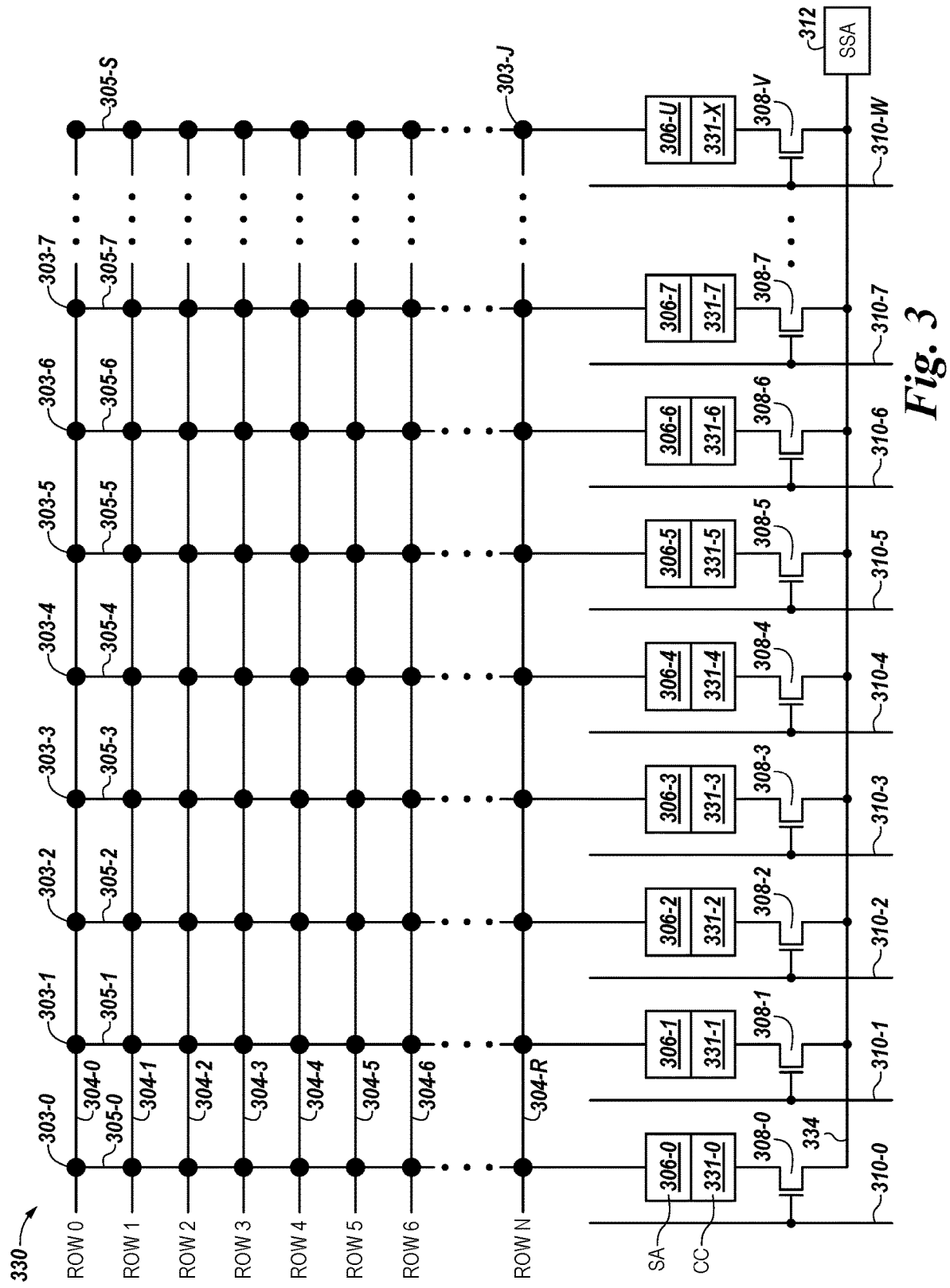
FIG. 3 illustrates a schematic diagram of a portion of a memory array in accordance with a number of embodiments of the present disclosure.

FIG. 3 illustrates a schematic diagram of a portion of a memory array 330 in accordance with a number of embodiments of the present disclosure. The array 330 includes memory cells 303-0, 303-1, 303-3, 303-4, 303-5, 303-6, 303-7, 303-8, . . . , 303-J (e.g., referred to generally as memory cells 303), coupled to rows of access lines 304-0, 304-1, 304-2, 304-3, 304-4, 304-5, 304-6, . . . , 304-R and columns of sense lines 305-0, 305-1, 305-2, 305-3, 305-4, 305-5, 305-6, 305-7, . . . , 305-S, which may be referred to generally as access lines 304 and sense lines 305. Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1 and sensing circuitry 250 shown in FIG. 2A). In this example, the sensing circuitry comprises a number of sense amplifiers 306-0, 306-1, 306-2, 306-3, 306-4, 306-5, 306-6, 306-7, . . . , 306-U (e.g., referred to generally as sense amplifiers 306) coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-2, 308-3, 308-4, 308-5, 308-6, 308-7, . . . , 308-V. In this example, the sensing circuitry also comprises a number of compute components 331-0, 331-2, 331-3, 331-4, 331-5, 331-6, 331-7, . . . , 331-X (e.g., referred to generally as compute components 331) coupled to the respective sense lines. Column decode lines 310-0 to 310-W are coupled to the gates of transistors 308-0 to 308-V, respectively, which can be selectively activated (e.g., via a column decode signal applied to the column decode lines 310) to transfer data sensed by respective sense amplifiers 306-0 to 306-U and/or stored in respective compute components 331-0 to 331-X to a secondary sense amplifier 312 and/or to processing resources external to array 330 (e.g., via I/O line 334). In a number of embodiments, the compute components 331 can be formed on pitch with the memory cells of their corresponding columns and/or with the corresponding sense amplifiers 306.

The sensing circuitry (e.g., compute components 331 and sense amplifiers 306) is configured to perform a sort operation in accordance with a number of embodiments described herein. The example described in association with FIGS. 4A to 4J, FIGS. 5A to 5M, and FIGS. 6A to 6Q demonstrate how a sort operation can be performed on elements stored in an array such as array 330. A sort operation can sort a number of elements that are stored as bit-vectors in an order ranging from bit-vectors with a smallest numerical value to bit-vectors with a largest numerical value.

As described below, the elements can be stored such that each of a number of elements (e.g., data corresponding to logic "1" or logic "0") are stored in memory cells commonly coupled to one of a respective number sense lines (e.g., 305-0 to 305-S). For example, a first element can be stored in a group of memory cells coupled to sense line 305-0, as second element can be stored in a group of memory cells coupled to sense line 305-1, etc.). In a number of embodiments, a sort operation can be performed on a number of elements. The elements being sorted can also be commonly coupled to a number of access lines (e.g., 304-0 to 304-R). For instance, consider six elements each stored in a group of three memory cells commonly coupled to one of sense lines 305-0 to 305-5. In this example, a first memory cell corresponding to each of the respective elements can be commonly coupled to a first access line (e.g., 304-0), a second memory cell corresponding to each of the respective elements can be commonly coupled to a second access line (e.g., 304-1), and a third memory cell corresponding to each of the respective elements can be commonly coupled to a third access line (e.g., 304-2).

FIGS. 4A-4J illustrate the states (e.g., logic values) of memory cells of a portion of an array 430 at a number of particular phases associated with performing a sort operation in accordance with a number of embodiments of the present disclosure. The array 430 can be an array such as array 330 described in FIG. 3. FIGS. 4A-4J illustrate the states (e.g., logic "1" or logic "0") of the cells coupled to a number of access lines 404-0 (Row 0), 404-1 (Row 1), 404-2 (Row 2), 404-3 (Mask Row), 404-4 (Bit Pattern 1 Row), and 404-5 (Bit Pattern 2 Row), and to a number of sense lines 405-0 (Col 0), 405-1 (Col 1), 405-2 (Col 2), 405-3 (Col 3), 405-4 (Col 4), and 405-5 (Col 5). FIGS. 4A-4J also illustrate the states of sensing circuitry 450 (e.g., compute components 331 and/or sense amplifiers 306 shown in FIG. 3) coupled to the respective sense lines 405-0 to 405-5 during various phases of a sort operation (e.g., various phases associated with executing the example pseudocode described below).

The example of FIGS. 4A-4J includes six elements each stored in a group of memory cells commonly coupled to one of sense lines 405-0 to 405-5. The six elements are values (e.g., decimal values) and are stored as binary bit-vectors 488-0, 488-1, 488-2, 488-3, 488-4, and 488-5 (referred to generally as bit-vectors 488) in array 430. The sort operation is performed on bit-vectors 488. In this example, each of the elements is stored in three memory cells coupled to a particular sense line and to access lines 404-0, 404-1, and 404-2. For example, the element represented by bit-vector 488-0 (e.g., [011]) is stored in the memory cells coupled to sense line 405-0 and to access lines 404-0 to 404-2, the element represented by bit-vector 488-1 (e.g., [001]) is stored in the memory cells coupled to sense line 405-1 and to access lines 404-0 to 404-2, the element represented by bit-vector 488-2 (e.g., [010]) is stored in the memory cells coupled to sense line 405-2 and to access lines 404-0 to 404-2, the element represented by bit-vector 488-3 (e.g., [100]) is stored in the memory cells coupled to sense line 405-3 and to access lines 404-0 to 404-2, the element represented by bit-vector 488-4 (e.g., [101]) is stored in the memory cells coupled to sense line 405-4 and to access lines 404-0 to 404-2, and the element represented by bit-vector 488-5 (e.g., [010]) is stored in the memory cells coupled to sense line 405-5 and to access lines 404-0 to 404-2. FIGS. 4A-4J also indicate the values (e.g., decimal values) 489-0 to 489-5 (referred to generally as values 489) of the elements represented by respective bit-vectors 488-0 to 488-5. For instance, as shown in FIG. 4A, bit-vector 488-0 (e.g., [011]) corresponds to value 489-0 (e.g., a decimal value of 3), bit-vector 488-1 (e.g., [001]) corresponds to value 489-1 (e.g., a decimal value of 1), bit-vector 488-2 (e.g., [010]) corresponds to value 489-2 (e.g., a decimal value of 2), bit-vector 488-3 (e.g., [100]) corresponds to value 489-3 (e.g., a decimal value of 4), bit-vector 488-4 (e.g., [101]) corresponds to value 489-4 (e.g., a decimal value of 5), and bit-vector 488-5 (e.g., [010]) corresponds to value 489-5 (e.g., a decimal value of 2).

The sort operation can store the bit-vectors 488 according to an order. The order can, for example, include bit-vectors with a smallest numerical value to bit-vectors with a largest numerical value. The result of sort operation, as shown in FIG. 4J, includes a bit-vector 488-0 [001]) which corresponds to value 489-0 (e.g., a decimal value of 1), bit-vector 488-1 (e.g., [010]) which corresponds to value 489-1 (e.g., a decimal value of 2), bit-vector 488-2 (e.g., [010]) which corresponds to value 489-2 (e.g., a decimal value of 2), the bit-vector 488-3 (e.g., [011]) which corresponds to value 489-3 (e.g., a decimal value of 3), bit-vector 488-4 (e.g., [100]) which corresponds to value 489-4 (e.g., a decimal value of 4), and bit-vector 488-5 (e.g., [101]) which corresponds to value 489-5 (e.g., a decimal value of 5), after performing the swap operation.

Although, in the example of FIGS. 4A-4J, the elements are stored in three cells coupled to respective sense lines such that they are represented by 3-bit bit-vectors, embodiments are not so limited. For instance, the elements can be stored in more or fewer than three cells. Also, in FIGS. 4A-4J, the LSB (least significant bit) of the bit-vectors 488-0 to 488-5 is stored in cells coupled to access line 404-0, the next LSB is stored in cells coupled to access line 404-1, and the MSB (most significant bit) is stored in cells coupled to access line 404-2; however, embodiments are not limited to a particular ordering of bits.

In a number of embodiments, the states of the memory cells commonly coupled to a particular access line (404) represent a stored data pattern (e.g., bit pattern) corresponding to a bit-vector. For instance, in the example of FIGS. 4A-4J, the memory cells commonly coupled to access line 404-0 (Row 0) and to sense lines 405-0 to 405-5 represent a stored data pattern corresponding to bit-vector 474-0 (e.g., [110010] as shown in FIG. 4A), which may be referred to as the "Row 0 bit-vector." The memory cells commonly coupled to access line 404-1 (Row 1) and to sense lines 405-0 to 405-5 represent a stored data pattern corresponding to bit-vector 474-1 (e.g., [101001] as shown in FIG. 4A), which may be referred to as the "Row 1 bit-vector." The memory cells commonly coupled to access line 404-2 (Row 2) and to sense lines 405-0 to 405-5 represent a stored data pattern corresponding to bit-vector 474-2 (e.g., [000110] as shown in FIG. 4A), which may be referred to as the "Row 2 bit-vector." As such, bit-vector 474-0 comprises the LSBs of the respective bit-vectors 488, bit-vector 474-1 comprises the next LSBs of the respective bit-vectors 488, and bit-vector 474-2 comprises the MSBs of the respective bit-vectors 488 (e.g., the bit-vectors representing the elements corresponding to the respective sense lines 405-0 to 405-5). In this example, the LSB of the bit-vectors 488 can be associated with an index of "0" (e.g., n=0), the next LSB of the bit-vectors 488 can be associated with an index of "1" (e.g., n=1), and the MSB of the bit-vectors 488 can be associated with an index of "2" (e.g., n=2).

In a number of embodiments, groups of memory cells in addition to those storing elements (e.g., the elements represented by the bit-vectors 488) can be used to perform a sort operation. The additional groups of memory cells can be groups of memory cells commonly coupled to respective access lines and to the sense lines corresponding to the stored elements (e.g., sense lines 405-0 to 405-5 in the example of FIGS. 4A-4J). As an example, a first additional group of memory cells can be used to store a bit pattern that can serve as a mask that can define which element pairs are being swapped. In the example shown in FIGS. 4A-4J, the cells coupled to access line 404-3 (Mask Row) and to sense lines 405-0 to 405-5 serve as a mask that can define which of the element pairs are swapped. The states of the memory cells of Mask Row 404-3 represent a stored data pattern corresponding to bit-vector 490, which can be referred to as the "Mask Row bit-vector." A second additional group of memory cells can also be used to store a bit pattern that can serve as a mask in association with performing a sort operation. In the example shown in FIGS. 4A-4J, the cells coupled to access line 404-4 (Bit Pattern 1 Row) and to sense lines 405-0 to 405-5 serve as a mask during a sort operation. The states of the memory cells of Bit Pattern 1 Row 404-4 represent a stored data pattern corresponding to bit-vector 492, which can be referred to as the "Bit Pattern 1 bit-vector." The cells coupled to access line 404-5 (Bit Pattern 2 Row) and to sense lines 405-0 to 405-5 serve as a mask during a sort operation. The states of the memory cells of Bit Pattern 2 Row 404-5 represent a stored data pattern corresponding to bit-vector 493, which can be referred to as the "Bit Pattern 2 bit-vector." In this example, and as shown in FIG. 4A, the data pattern corresponding to the Bit Pattern 2 bit-vector 493 is the data pattern corresponding to the Bit Pattern 1 bit-vector 492 shifted one bit-position to the right. A number of additional groups of memory cells can be used as temporary storage in association with performing a sort operation. In a number of embodiments, the Mask Row 404-3, Bit Pattern 1 Row 404-4, and Bit Pattern 2 Row 404-5 may not be addressable to a user (e.g., the cells coupled to those access lines may not be part of the addressable space of the array 430).

FIGS. 4A-4J also illustrate the states of sensing circuitry 450 (e.g., compute components 331 and/or sense amplifiers 306 shown in FIG. 3) coupled to the respective sense lines 405-0 to 405-5 during various phases of a sort operation. The states (e.g., latched logic values) of the sensing circuitry 450 represent a stored data pattern corresponding to bit-vector 483.

As described below, in a number of embodiments, sorting elements stored in an array (e.g., array 430) can include performing a number of logical operations such as AND, OR, NOT, NAND, NOR, and/or shift operations. The logical operations can be performed using data stored in the array as inputs, and can be performed without transferring data from the array via an I/O line, for instance. In a number of embodiments, the bit-vectors 474-0, 474-1, 474-2, 490, 492, 493, and 483 serve as operands to the logical operations in association with sorting the elements 488.

The below pseudocode represents instructions executable to perform a sort operation in a memory in accordance with a number of embodiments of the present disclosure. The example pseudocode is referenced using reference numbers 1-3. For example, reference number one (1) corresponds to "compare (Col(0), Col(n))" as shown in the below pseudocode, reference number two (2) corresponds to "writeRow (Compare_Mask)" as shown in the below pseudocode, etc.

```
1.    compare(Col(0), Col(n));
2.    writeRow(Mask);
3.    While (BLOCKOR( ) != 0){
         a.   readRow(Mask);
         b.   andRow(BitPattern1);
         c.   writeRow(Mask);
         d.   swap(Col(0), Col(n), Mask);
         e.   compare(Col(0), Col(n));
         f.   andRow(BitPattern2);
         g.   writeRow(Mask);
         h.   swap(Col(0), Col(n), Mask);
         i.   compare(Col(0), Col(n));
         j.   writeRow(Mask);
      }
```

For purposes of discussion, the above pseudocode will be divided into a setup phase and an iterations phase. In this example, FIGS. 4A and 4B and the pseudocode referenced by reference numbers 1-2 corresponds to the setup phase. FIG. 4C-4J and the pseudocode reference by reference number 3 (e.g., 3.a-3.j) corresponds to the iterations phase. The data patterns corresponding to bit-vectors 474-0, 474-1, 474-2, 490, 492, 493, and 483 are shown in FIGS. 4A to 4J during execution of the iterations phase.

The iterations phase can include performing a number of iterations of operations via a loop structure. For example, the pseudocode corresponding to reference number 3 (e.g., "While (BLOCKOR( )!=0)") represents a "While loop" associated with a BLOCKOR operation.

The "loop" can be used to perform a number of operations based on a BLOCKOR operation (e.g., boolean condition). For example, a number of operations that are associated with the iterations phase can be performed repeatedly while a BLOCKOR operation returns a true value (e.g., a "1"). A BLOCKOR operation can be performed on the vector 483 (e.g., vector stored in compute component 331 in FIG. 3).

As used herein, a BLOCKOR operation refers to an operation that can be performed to determine whether one or more bits of a particular bit-vector (e.g., bit-vector 483) are a particular value (e.g., a "1"). For instance, a BLOCKOR operation can be performed to determine whether one or more bits of a bit-vector stored in the sensing circuitry (e.g., in the compute components and/or sense amplifiers corresponding to Sensing Circuitry 450) are a particular value (e.g., whether any of the bits of bit-vector 483 are a "1"). The BLOCKOR operation can be performed using an I/O line (e.g., 334) and a secondary sense amplifier (e.g., 312 in FIG. 3), for example.

In performing a BLOCKOR operation, the column decode lines (e.g., 310-1 to 310-W) coupled to the selected sensing circuitry (e.g., sense amplifiers 306 and/or compute components 331) can be activated in parallel (e.g., such that respective transistors 308-1 to 308-V are turned on) in order to transfer the voltages of the components of the sensing circuitry (e.g., sense amplifiers 306 and/or compute components 331) to the local I/O line (e.g., 334). The secondary sense amplifier (e.g., SSA 312) can sense whether the precharged voltage of the local I/O line changes (e.g., by more than a threshold amount) responsive to activation of the column decode lines.

For instance, if the I/O line 334 is precharged to a ground voltage and the sensing circuitry (e.g., one or more of the selected compute components 331 and/or sense amplifiers 306) stores a logic 1 (e.g., Vcc), then the SSA 312 can sense a pull up (e.g., increase) of the voltage on I/O line 334 which indicates that at least one of the compute components and/or sense amplifiers (e.g., at least one of the compute components and/or sense amplifiers corresponding to Comp_Comp 431) stores a "1". Alternatively, if the I/O line 334 is precharged to Vcc and one or more of the selected compute components and/or sense amplifiers stores a logic 0 (e.g., 0V), then the SSA 312 can sense a pull down (e.g., decrease) of the voltage on I/O line 334 which indicates that at least one of the compute components and/or sense amplifiers stores a "0". In this manner, voltages corresponding to data stored in sensing circuitry corresponding to bit-vector 483 can be transferred, in parallel, to the local I/O line 334 and sensed by SSA 312 as part of a BLOCKOR operation. Embodiments of the present disclosure are not limited to particular precharge voltages of local I/O line 334 and/or to particular voltage values corresponding to logic 1 or logic 0.

As such, in a number of examples, a BLOCKOR operation results in (e.g., returns) a "1" if any of the bits of the bit-vector on which the operation is being performed are a "1" and results in a "0" if none of the bits of the bit-vector on which the operation is being performed are a "1." Therefore, a BLOCKOR operation is effectively performing a logic "OR" operation on the particular bit-vector (e.g., the logic operation A OR B returns a true (e.g., "1") if either A or B is a "1" and false (e.g., "0") if neither A or B is a "1").

As described further below, in this example, FIGS. 4B-4G correspond to a first iteration of the iterations phase (e.g., an initial execution of the "While" loop corresponding to the pseudocode referenced by 3.a to 3.j) and FIGS. 4H-4J correspond to a second iteration of the iterations phase.

As described above, FIG. 4A illustrates a number of elements stored as bit-vectors 488-0 to 488-5 in array 430 (e.g., prior to a sort operation). The Mask Row bit-vector 490 defines selected adjacent element pairs to be swapped. The Mask Row bit-vector 490 can be provided by the compare operation, for instance. In this example, the element pairs to be swapped are defined by whether or not the cells of Mask Row 404-3 store a logic "1." For example, a logic "1" in a bit position of bit-vector 490 corresponding to a particular sense line indicates that the corresponding element (e.g., the element stored in cells coupled to the particular sense line) is to be swapped with an adjacent element (e.g., the element stored in cells coupled to an adjacent sense line). For instance, in FIG. 4B, bit-vector 490 is [100010], which indicates that a "1" is stored in cells corresponding to sense lines 405-0 and 405-4, and that a "0" is stored in the cell corresponding to sense line 405-2. As such, Mask Row bit-vector 490 defines the element pairs being swapped as being the elements coupled to sense lines 405-0 and 405-1, and the elements coupled to sense lines 405-4 and 405-5 (e.g., the element initially stored in cells coupled to sense line 405-0 is swapped with the element initially stored in cells coupled to sense line 405-1 and the element initially stored in cells coupled to sense line 405-4 is swapped with the element initially stored in cells coupled to sense line 405-5).

FIG. 4A also illustrates Bit Pattern 1 bit-vector 492 and Bit Pattern 2 bit-vector 493, which are stored in memory cells that are coupled to access line 404-4 and access line 404-5, respectively. Bit-vector 492 is used to select (e.g., isolate) bit-vectors 488 (e.g., elements) that are stored in memory cells that are coupled to even numbered columns while bit-vector 493 is used to select (e.g., isolate) bit-vectors 488 (e.g., elements) that are stored in memory cells that are coupled to odd numbered columns.

In FIGS. 4A to 4J changes to the states of memory cells corresponding to the bit-vectors 474-0, 474-1, 474-2, 490, 492, 493, and 483 are indicated in bold font. For example, in FIG. 4B the data pattern corresponding to bit-vector 490 (e.g., the memory cells coupled to access line 404-3 and to sense lines 405-0 to 405-5) is shown in bold font to indicate the logic values corresponding to bit-vector 490 have changed during a phase of the swap operation.

The setup phase of the swap operation described in association with FIGS. 4A and 4B and can include execution of the pseudocode corresponding to reference numbers 1-2. The pseudocode corresponding to reference numbers 1-2 is associated with performing a compare operation and storing the result in the array 430 (e.g., storing it in Mask Row 404-3 as bit-vector 490).

The pseudocode corresponding to reference number 1 (e.g., "compare(Col(0), Col(n))") involves comparing the bit-vectors 488 stored in memory cells coupled to sense lines 405-0 to 405-5 by performing a compare operation. For example, performing a compare operation on bit-vectors 488 stored in memory cells coupled to sense lines 405-0 to 405-5 includes comparing a first element that is stored as bit-vector 488-0 to a second element that is stored as bit-vector 488-1, comparing the second element that is stored as bit-vector 488-1 to a third element that is stored as bit-vector 488-2, comparing the third element that is stored as bit-vector 488-2 to a fourth element that is stored as bit-vector 488-3, comparing the fourth element that is stored as a bit-vector 488-3 to a fifth element that is stored as bit-vector 488-4, and comparing the fifth element that is stored as bit-vector 488-4 to a sixth element that is stored as the bit-vector 488-5. For example, each element that is stored in memory cells coupled to a given column is compared to an element that is stored in memory cells that are coupled to an adjacent column that is to the right of the given column. For example, bit-vector 488-1 that is stored in memory cells coupled to the column 405-1 is compared to bit-vector 488-2 that is stored in memory cells that are coupled to column 405-2, where column 405-2 is adjacent and to the right of column 405-1. FIG. 5 provides an example of performing a compare operation on bit-vectors 488-0 to 488-5. A comparison can determine which of the two compared elements is greater and/or if the compared elements are equal to each other.

The results of the compare operation is stored in sensing circuitry 450. After the compare operation, and as shown in FIG. 4B, the bit-vector 483 is [100010]. As used herein, storing a bit-vector in the sensing circuitry is defined as storing the bit-vector in a number of compute components associated with the sensing circuitry and/or in a number of sense amplifiers associated with the sensing circuitry.

The bit-vector 483 (e.g., [100010]) indicates that bit-vector 488-0 that has a value 489-0 (e.g., a decimal value of 3) is greater than bit-vector 488-1 that has a value 489-1 (e.g., a decimal value of 1), that bit-vector 488-1 (e.g., decimal value of 1) is less than bit-vector 488-2 (e.g., decimal value of 2), that bit-vector 488-2 (e.g., decimal value of 2) is less than bit-vector 488-3 (e.g., decimal value of 4), that bit-vector 488-3 (e.g., decimal value of 4) is less than bit-vector 488-4 (e.g., decimal value of 5), that bit-vector 488-4 (e.g., decimal value of 5) is greater than bit-vector 488-5 (e.g., decimal value of 2). For example, the most significant bit of bit-vector 483 (e.g., [100010]), which is the left most bit in bit-vector 483, indicates that bit-vector 488-0 (e.g., a decimal value of 3) is greater than bit-vector 488-1 (e.g., a decimal value 1), the next to least significant bit of bit-vector 483 (e.g., [100010]), which is the next to right most bit in bit-vector 483, indicates that bit-vector 488-4 (e.g., a decimal value of 5) is greater than bit-vector 488-5 (e.g., a decimal value 2), and the least significant bit of bit-vector 483 (e.g., [100010]), which is the right most bit in bit-vector 483, is zero because bit-vector 488-5 is not compared to a bit-vector that is stored in memory cells that are coupled to a column to the right of column 405-5 since there is no bit-vector that is stored in memory cells that are coupled to a column to the right of column 405-5.

The pseudocode corresponding to reference number 2 (e.g., "writeRow(Mask)"), is associated with writing the data pattern stored in sensing circuitry 450 (e.g., as bit-vector 483) to the cells storing the Mask Row bit-vector 490. As described further below, the data pattern corresponding to bit-vector 483 can be copied from the sensing circuitry 450 to the cells storing bit-vector 490 (e.g., the cells coupled to access line 404-3) by activating access line 404-3, for instance. As shown in FIG. 4B, the data pattern corresponding to bit-vector 483 (e.g., [100010]), which is the result of the compare operation is stored in the memory cells corresponding to Mask Row 490. For example, Mask Row bit-vector 490 is [100010].

FIGS. 4C-4F correspond to a first iteration of the iterations phase (e.g., an initial execution of the "While" loop corresponding to the pseudocode referenced by 3.a to 3.j). A first iteration corresponds to the pseudocode referenced by reference numbers 3.a to 3.j, and is associated with comparing elements and swapping elements that are stored in memory cells coupled to odd and even numbered columns. Swapping elements that are stored in memory cells coupled to odd and even numbered columns ensures that all elements receive an opportunity to be swapped during an iteration of the iterations phase.

At reference number 3 of the pseudocode (e.g., "While (BLOCKOR( )!=0)"), a BLOCKOR operation is performed on bit-vector 483 (e.g., [100010]). The result of the BLOCKOR operation is a true value due to the two 1-bits in the bit-vector 483 (e.g., [100010]). For example, the BLOCKOR operation returns a true value (e.g., 1) because the elements are not ordered from elements with smaller values to elements with greater values in memory cells coupled to columns 405-0-405-5, respectively. The elements are not ordered because at least two elements need to be swapped as indicated by the result of the compare operation (e.g., bit-vector 483 [100010]). A first iteration of the iterations phase follows.

At reference number 3.a of the pseudocode (e.g., "readRow(Mask)"), the data pattern corresponding to the Mask bit-vector 490 is read into the sensing circuitry corresponding to bit-vector 483. At reference number 3.b (e.g., "andRow(BitPattern1)"), an AND operation is performed on Bit Pattern 1 bit-vector 492 (e.g., [101010]) and bit-vector 483 (e.g., [100010]) to select bit-vectors from bit-vectors that are identified by bit-vector 483. In this example, the selected bit-vectors include bit-vectors that are stored in memory cells that are coupled to even numbered columns.

As used herein, performing a logical operation on a first and second bit-vector can include performing, in parallel, the logical operation on each of the respective bits at corresponding bit positions of the bit-vectors. As an example, the result of a logical AND operation performed on a first bit-vector "a" (e.g., [$a_0$ $a_1$ $a_2$ $a_3$ $a_4$ $a_5$]) and a second bit-vector "b" (e.g., [$b_0$ $b_1$ $b_2$ $b_3$ $b_4$ $b_5$]) is a bit-vector "c" (e.g., [$c_0$ $c_1$ $c_2$ $c_3$ $c_4$ $c_5$]), wherein $c_0=a_0$ AND $b_0$, $c_1=a_1$ AND $b_1$, $c_2=a_2$ AND $b_2$, $c_3=a_3$ AND $b_3$, $c_4=a_4$ AND $b_4$, and $c_5=a_5$ AND $b_5$. For instance, performing an AND operation on a bit-vector [101010] and on bit-vector [100010] would result in bit-vector [100010] (e.g., the leftmost bit of the resultant bit-vector is "1" since "1" AND "1" is "1", the next bit is "0" since "0" AND "0" is "0", the next bit is "0" since "1" AND "0" is "0", the next bit is "0" since "0" AND "0" is "0", the next bit is "1" since "1" AND "1" is "1", and the rightmost bit is "0" since "0" AND "0" is "0").

In this example, "ANDing" bit-vectors 492 and 483 (e.g., [101010] AND [100010]) results in [100010] being stored as bit-vector 483 (e.g., the result of the AND operation is stored in the sensing circuitry 450). As such, bit-vector 483 is [100010] as shown in FIG. 4C.

At reference number 3.c (e.g., "writeRow(Mask)"), the data pattern corresponding to bit-vector 483 is copied to the cells storing the Mask Row bit-vector 490. As such, Mask Row bit-vector 490 is [100010] as shown in FIG. 4C.

FIG. 4D and the pseudocode referenced by reference number 3.d are associated with performing a swap operation on the bit-vectors 488-0 to 488-5. At reference number 3.d of the pseudocode (e.g., "swap(Col(0), Col(n), Mask)"), a swap operation is performed. The swap operation involves a number of bit-vectors (e.g., bit-vectors coupled to sense lines 405-0 (Col(0)) to 405-5 (Col(n))) and a mask as input. In this example, the bit-vectors 488 are stored in memory cells that are coupled to sense lines 405-0 to 405-5. At reference number 3.d of the pseudocode, "n" is used as an index to denote the number of elements that are stored as bit-vectors 488. In this example, n=5 since there are six elements that are being sorted.

The swap operation uses bit-vector 490 as a mask to identify the bit-vectors that are swapped. Bit-vector 490 identifies those bit-vectors that are stored in memory cells coupled to even numbered sense lines that are to be swapped with bit-vectors that are stored in memory cells coupled to odd numbered sense lines. The bits in bit-vector 490 identify a sense line and identify elements that are stored as bit-vectors in memory cells coupled to the same sense line. For example, the "1" (e.g., [100010]) is used to indicate that the bit-vector corresponding to the respective sense line is to be swapped with its adjacent neighbor, and a "0" (e.g., [100010]) is used to indicate no swapping.

The result of performing the swap operation is shown in FIG. 4D. The bit-vector [011] that was previously stored in memory cells coupled to sense line 405-0 is stored in memory cells coupled to sense line 405-1 after performing the swap operation and the bit-vector [001] that was previously stored in memory cells coupled to sense line 405-1 is stored in memory cells coupled to sense line 405-0 after performing the swap operation. The bit-vector [101] that was previously stored in memory cells coupled to sense line 405-4 is stored in memory cells coupled to sense line 405-5 after performing the swap operation and the bit-vector [010] that was previously stored in memory cells coupled to sense line 405-5 is stored in memory cells coupled to sense line 405-4 after performing the swap operation. As such, as shown in FIG. 4D, the bit-vector 488-0 is [001], the bit-vectors 488-1 is [011], the bit-vector 488-2 is [010], the bit-vector 488-3 is [100], the bit-vector 488-4 is [010], and the bit-vector 488-5 is [101], after performing the swap operation. FIGS. 6A to 6Q provide an example of performing a swap operation.

FIG. 4E and the pseudocode referenced by reference number 3.e correspond to performing a compare operation on the data patterns corresponding to bit-vectors 488-0 to 488-5. Reference number 3.e of the pseudocode (e.g., "compare(Col(0), Col(n))"), involves comparing the bit-vectors 488 stored in memory cells coupled to sense lines 405-0 to 405-5 (e.g., "Col(0), Col(n)"). The result of the compare operation is stored in sensing circuitry 450. After the compare operation and as shown in FIG. 4E, the bit-vector 483 is [010100].

FIG. 4F and the pseudocode referenced by reference number 3.f-3.g correspond to performing an AND operation. Reference number 3.f of the pseudocode (e.g., "andRow (BitPattern2)"), involves performing an AND operation on Bit Pattern 2 bit-vector 493 (e.g., [010101]) and bit-vector 483 (e.g., [010100]) to select bit-vectors from bit-vectors that are identified by bit-vector 483. The selected bit-vectors include bit-vectors that are stored in memory cells that are coupled to odd numbered columns. In this example, "ANDing" bit-vectors 493 and 483 (e.g., [010101] AND [010100]) results in [010100] being stored as bit-vector 483 (e.g., the result of the AND operation is stored in the sensing circuitry 450). As such, bit-vector 483 is [010100] as shown in FIG. 4F.

At reference number 3.g (e.g., "writeRow(Mask)"), the data pattern corresponding to bit-vector 483 is copied to the cells storing the Mask Row bit-vector 490. As such, Mask Row bit-vector 490 is [010100] as shown in FIG. 4F.

FIG. 4G and the pseudocode referenced by reference numbers 3.h are associated with performing a swap operation on the bit-vectors 488-0 to 488-5. At reference number 3.h of the pseudocode (e.g., "swap(Col(0), Col(n), Mask)"), a swap operation is performed. The swap operation involves a number of bit-vectors (e.g., bit-vectors stored in memory cells coupled to sense lines 405-0 (Col(0)) to 405-5 (Col(5)) and a mask as input. In this example, the bit-vectors 488 are stored in memory cells coupled to sense lines 405-0 to 405-5.

The result of performing the swap operation is shown in FIG. 4G. The bit-vector [011] that was previously stored in memory cells coupled to sense line 405-1 is stored in memory cells coupled to sense line 405-2 after performing the swap operation and the bit-vector [010] that was previously stored in memory cells coupled to sense line 405-2 is stored in memory cells coupled to sense line 405-1 after performing the swap operation. The bit-vector [100] that was previously stored in memory cells coupled to sense line 405-3 is stored in memory cells coupled to sense line 405-4 after performing the swap operation and the bit-vector [010] that was previously stored in memory cells coupled to sense line 405-4 is stored in memory cells coupled to sense line 405-3 after performing the swap operation. As such, as shown in FIG. 4D, the bit-vector 488-0 is [001], the bit-vectors 488-1 is [010], the bit-vector 488-2 is [011], the bit-vector 488-3 is [010], the bit-vector 488-4 is [100], and the bit-vector 488-5 is [101], after performing the swap operation.

FIG. 4H and the pseudocode referenced by reference number 3.i correspond to performing a compare operation on the data patterns corresponding to bit-vectors 488-0 to 488-5 and storing the result of the compare operation in the memory cells that store the Mask Row bit-vector 490. Reference number 3.i of the pseudocode (e.g., "compare (Col(0), Col(n))"), involves comparing the bit-vectors 488 stored in memory cells coupled to sense lines 405-0 to 405-5 (e.g., "Col(0), Col(n)"). The result of the compare operation is stored in sensing circuitry 450. After the compare operation and as shown in FIG. 4H, the bit-vector 483 is [001000].

At reference number 3.j (e.g., "writeRow(Mask)"), the data pattern corresponding to bit-vector 483 is copied to the cells storing the Mask Row bit-vector 490. As such, Mask Row bit-vector 490 is [001000] as shown in FIG. 4H. Reference number 3.j concludes the first iteration.

FIGS. 4I-4J and the pseudocode referenced by reference numbers 3.a-3.j correspond to a second iteration of the iterations phase. At reference 3.a, the data pattern corresponding to the Mask bit-vector 490 (e.g., [001000]) is read into the sensing circuitry corresponding to bit-vector 483. At reference number 3.b, an AND operation is performed on Bit Pattern 1 bit-vector 492 (e.g., [101010]) and bit-vector 483 (e.g., [001000]) to select bit-vectors from bit-vectors that are identified by bit-vector 483. As such, bit-vector 483 is [001000] as shown in FIG. 4I. At reference number 3.c, the data pattern corresponding to bit-vector 483 is copied to the cells storing the Mask Row bit-vector 490. As such, Mask Row bit-vector 490 is [001000] as shown in FIG. 4I.

FIG. 4J and the pseudocode referenced by reference numbers 3.d correspond to performing a swap operation during the second iteration of the iterations phase. At reference number 3.d, the swap operation involves bit-vectors 488-0 to 488-5 (e.g., [001], [010], [011], [010], [100], and [101]) and bit-vector 490 mask (e.g., [001000]) as input.

The result of performing the swap operation is shown in FIG. 4J. The bit-vector [001] is stored in memory cells coupled to sense line 405-0, the bit-vector [010] is stored in memory cells coupled to sense line 405-1, the bit-vector [010] that was previously stored in memory cells coupled to sense line 405-3 is stored in memory cells coupled to sense line 405-2 after performing the swap operation, and the bit-vector [011] that was previously stored in memory cells coupled to sense line 405-2 is stored in memory cells coupled to sense line 405-3 after performing the swap operation. As such and as shown in FIG. 4J, bit-vector 488-0 (e.g., [001]) corresponds to value 489-0 (e.g., a decimal value of 1), bit-vectors 488-1 (e.g., [010]) corresponds to value 489-1 (e.g., a decimal value of 2), bit-vector 488-2 (e.g., [010]) corresponds to value 489-2 (e.g., a decimal value of 2), the bit-vector 488-3 (e.g., [011]) corresponds to value 489-3 (e.g., a decimal value of 3), bit-vector 488-4 (e.g., [100]) corresponds to value 489-4 (e.g., a decimal value of 4), and bit-vector 488-5 (e.g., [101]) corresponds to value 489-5 (e.g., a decimal value of 5), after performing the swap operation.

At reference number 3.e, a compare operation is performed on bit-vectors 488 to determine whether the bit-vectors 488 are ordered from a bit-vector with a smallest decimal value to a bit-vector with a greatest decimal value. The result of the compare operation indicates that all bit-vectors are ordered from bit-vectors with a smallest value to bit-vectors with a larger value being stored in memory cells coupled to sense lines 405-0 to sense lines 405-5, respectively. For example, the compare operation returns [000000]. In a number of examples, after performing a compare operation at reference number 3.e, it can be determined whether the return value is equal to [000000]. If the result of the compare operation is equal to [000000], then the iterations phase can conclude. [000000] indicates that the bit-vectors 488 are ordered from a bit-vector with a smallest decimal value to a bit-vector with a greatest decimal value. The iterations phase can conclude due to, for example, a breaking of the while loop. The result of the compare operation can be determined to be [000000] via a BLOCKOR operation.

The results of performing a number of operations associated with reference numbers 3.e-3.j are not shown in FIGS. 4A-4J because no changes are made to bit-vectors 488-0 to 488-5 after reference number 3.d. No changes are made to bit-vectors 488-0 to 488-5 after reference number 3.d because bit-vectors 488 are ordered from a bit-vector having a smallest decimal value to a bit-vector having a greatest decimal value. For example, a compare operation described in association with reference number 3.e returns [000000] because the bit-vectors 488 are ordered. An AND operation described in association with reference number 3.f results in [000000] because anything ANDed with [000000] results in [000000]. No bit-vectors are swapped after performing a swap operation described in association with reference number 3.h. Embodiments however, are not limited to the order of the sequence of instructions in the pseudocode in this example.

FIGS. 5A-5M illustrate the states (e.g., logic values) of memory cells of a portion of an array 530 at a number of particular phases associated with performing a compare operation in accordance with a number of embodiments of the present disclosure. The array 530 can be analogous to array 430 in FIG. 4. FIGS. 5A-5M illustrate the states (e.g., logic "1" or logic "0") of the cells coupled to a number of access lines 504-0 (Row 0), 504-1 (Row 1), 504-2 (Row 2), 504-3 (Mask Row), and to a number of sense lines 505-0 (Col 0), 505-1 (Col 1), 505-2 (Col 2), 505-3 (Col 3), 505-4 (Col 4), and 505-5 (Col 5) which are analogous to access lines 404-0, 404-1, 404-2, 404-3 and to sense lines 405-0, 405-1, 405-2, 505-3, 505-4, and 505-5 in FIGS. 4A to 4J. FIGS. 5A-5M also illustrate the state of cells coupled to access lines 504-10 (DiffThisTime Row) and 504-11 (DiffEver Row). FIGS. 5A-5M also illustrate the states of sensing circuitry 550 (e.g., compute components 331 and/or sense amplifiers 306 shown in FIG. 3) coupled to the respective sense lines 505-0 to 505-5, which is analogous to sensing circuitry 450 in FIGS. 4A to 4J, during various phases of a swap operation (e.g., various phases associated with executing the example pseudocode described below).

The example of FIGS. 5A-5M describes the execution of the compare operation described in association with reference number 1 and FIG. 4B. The example of FIGS. 5A-5M includes six elements each stored in a group of memory cells commonly coupled to one of sense lines 505-0 to 505-5. The six elements are values (e.g., decimal values) and are stored as binary bit-vectors 588-0, 588-1, 588-2, 588-3, 588-4, and 588-5 (referred to generally as bit-vectors 488) in array 530 which are analogous to bit-vectors 488-0, 488-1, 488-2, 488-3, 488-4, and 488-5 in FIGS. 4A-4J. In this example, each of the elements is stored in three memory cells coupled to a particular sense line and to access lines 504-0, 504-1, and 504-2. For example, the element represented by bit-vector 588-0 (e.g., [011]) is stored in the memory cells coupled to sense line 505-0 and to access lines 504-0 to 504-2, the element represented by bit-vector 588-1 (e.g., [001]) is stored in the memory cells coupled to sense line 505-1 and to access lines 504-0 to 504-2, the element represented by bit-vector 588-2 (e.g., [010]) is stored in the memory cells coupled to sense line 505-2 and to access lines 504-0 to 504-2, the element represented by bit-vector 588-3 (e.g., [100]) is stored in the memory cells coupled to sense line 505-3 and to access lines 504-0 to 504-2, the element represented by bit-vector 588-4 (e.g., [101]) is stored in the memory cells coupled to sense line 505-4 and to access lines 504-0 to 504-2, and the element represented by bit-vector 588-5 (e.g., [010]) is stored in the memory cells coupled to sense line 505-5 and to access lines 504-0 to 504-2. FIGS. 5A-5M also indicate the values (e.g., decimal values) 589-0 to 589-5 (referred to generally as values 589) of the elements represented by respective bit-vectors 588-0 to 588-5. For instance, as shown in FIG. 5A, bit-vector 588-0 (e.g., [011]) corresponds to value 589-0 (e.g., a decimal value of 3), bit-vector 588-1 (e.g., [001]) corresponds to value 589-1 (e.g., a decimal value of 1), bit-vector 588-2 (e.g., [010]) corresponds to value 589-2 (e.g., a decimal value of 2), bit-vector 588-3 (e.g., [100]) corresponds to value 589-3 (e.g., a decimal value of 4), bit-vector 588-4 (e.g., [101]) corresponds to value 589-4 (e.g., a decimal value of 5), and bit-vector 588-5 (e.g., [010]) corresponds to value 589-5 (e.g., a decimal value of 2).

In FIGS. 5A-5M, the LSB (least significant bit) of the bit-vectors 588-0 to 588-5 is stored in cells coupled to access line 504-0, the next LSB is stored in cells coupled to access line 504-1, and the MSB (most significant bit) is stored in cells coupled to access line 504-2.

The example described in FIGS. 5A-5M involves comparing adjacent elements. Specifically, the example of FIGS. 5A-5M involves comparing elements stored as bit-vectors 588-0 and 588-1, comparing bit-vectors 588-1 and 588-2, comparing bit-vectors 588-2 and 588-3, comparing bit-vectors 588-3 and 588-4, and comparing bit-vectors 588-4 and 588-5.

In a number of embodiments, the states of the memory cells commonly coupled to a particular access line (504) represent a stored data pattern (e.g., bit pattern) corresponding to a bit-vector. For instance, in the example of FIGS. 5A-5M, the memory cells commonly coupled to access line 504-0 (Row 0) and to sense lines 505-0 to 505-5 represent a stored data pattern corresponding to bit-vector 574-0 (e.g., [110010] as shown in FIG. 5A), which may be referred to as the "Row 0 bit-vector." The memory cells commonly coupled to access line 504-1 (Row 1) and to sense lines 505-0 to 505-5 represent a stored data pattern corresponding to bit-vector 574-1 (e.g., [101001] as shown in FIG. 5A), which may be referred to as the "Row 1 bit-vector." The memory cells commonly coupled to access line 504-2 (Row 2) and to sense lines 505-0 to 505-5 represent a stored data pattern corresponding to bit-vector 574-2 (e.g., [000110] as shown in FIG. 5A), which may be referred to as the "Row 2 bit-vector." As such, bit-vector 574-0 comprises the LSBs of the respective bit-vectors 588, bit-vector 574-1 comprises the next LSBs of the respective bit-vectors 588, and bit-vector 574-2 comprises the MSBs of the respective bit-vectors 588 (e.g., the bit-vectors representing the elements corresponding to the respective sense lines 505-0 to 505-5). In this example, the LSB of the bit-vectors 588 can be associated with an index of "0" (e.g., i=0), the next LSB of the bit-vectors 488 can be associated with an index of "1" (e.g., i=1), and the MSB of the bit-vectors 488 can be associated with an index of "2" (e.g., i=2).

In a number of embodiments, groups of memory cells in addition to those storing elements (e.g., the elements represented by the bit-vectors 588) can be used to perform a compare operation. The additional groups of memory cells can be groups of memory cells commonly coupled to respective access lines and to the sense lines corresponding to the stored elements (e.g., sense lines 505-0 to 505-5 in the example of FIGS. 5A-5M. As an example, a first additional group of memory cells can be used to store a result of the compare operation as a bit pattern. In the example shown in FIGS. 5A-5M, the cells coupled to access line 504-3 (Mask Row) and to sense lines 505-0 to 505-5 serve as a mask that can define which of the elements are greater than or less than other elements. The states of the memory cells of Mask Row 504-3 represent a stored data pattern corresponding to bit-vector 590, which can be referred to as the "Mask Row bit-vector." A second additional group of memory cells can also be used to store a bit pattern that can identify differences between bits in bit-vectors during a particular iteration of the compare operation. In the example shown in FIGS. 5A-5M, the cells coupled to access line 504-10 (DiffThisTime Row) and to sense lines 505-0 to 505-5 serve as a notation on the differences between bits in adjacent bit-vectors during a particular iteration of a compare operation. The states of the memory cells of DiffThisTime Row 504-10 represent a stored data pattern corresponding to bit-vector 594, which can be referred to as the "DiffThisTime Row bit-vector." The example shown in FIGS. 5A-5M includes an additional group of memory cells coupled to access line 504-11 (DiffEver Row) and to sense lines 505-0 to 505-5 that is used to identify differences between bits from adjacent bit-vectors during any iteration of the compare operation. The states of the memory cells of DiffEver Row 504-11 represent a stored data pattern corresponding to bit-vector 595, which can be referred to as the "DiffEver Row bit-vector." In the example shown in FIGS. 5A-5M, the cells coupled to access line 504-12 (DiffEver 2 Row) and to sense lines 505-0 to 505-5 serve as temporary storage that is associated with DiffEver 2 Row bit-vector. The states of the memory cells of DiffEver 2 Row 504-12 represent a stored data pattern corresponding to bit-vector 596, which can be referred to as the "DiffEver 2 Row bit-vector."

In a number of embodiments, the Mask Row 504-3, DiffThisTime Row 504-10, DiffEver Row 504-11, and DiffEver 2 Row 504-12 may not be addressable to a user (e.g., the cells coupled to those access lines may not be part of the addressable space of the array 530).

FIGS. 5A-5M also illustrate the states of sensing circuitry 550 (e.g., compute components 331 and/or sense amplifiers 306 shown in FIG. 3) coupled to the respective sense lines 505-0 to 505-5 during various phases of a compare operation. The states (e.g., latched logic values) of the sensing circuitry 550 represent a stored data pattern corresponding to bit-vector 583.

As described below, in a number of embodiments, comparing selected elements stored in an array (e.g., array 530) can include performing a number of logical operations such as AND, OR, NOT, NAND, NOR, and/or shift operations. The logical operations can be performed using data stored in the array as inputs, and can be performed without transferring data from the array via an I/O line, for instance. In a number of embodiments, the bit-vectors 574-0, 574-1, 574-2, 590, 594, 595, 596, and 583 serve as operands to the logical operations in association with comparing elements.

The below pseudocode represents instructions executable to perform a number of compare operations in a memory in accordance with a number of embodiments of the present disclosure. The example pseudocode is referenced using reference numbers 1.a-1.q. For example, reference number 1.a corresponds to "ReadRow(Row+i);" as shown in the below pseudocode, etc.

```
1           For (i=nbits-1; i>=0; i--) {
1.a             ReadRow(Row (i));
1.b             ShiftAccLeft( );
1.c             XorRow(Row (i));
1.d             WriteRow(DiffThisTime Row);
```

-continued

```
1.e             OrRow(DiffEver Row);
1.f             WriteRow(DiffEver 2 Row);
1.g             ReadRow(DiffEver Row);
1.h             InvAcc( );
1.i             AndRow(DiffThisTime Row);
1.j             WriteRow(DiffThisTime Row);
1.k             ReadRow(DiffEver 2 Row);
1.l             WriteRow(DiffEver Row);
1.m             ReadRow(Row(i));
1.n             AndRow(DiffThisTime Row);
1.o             WriteRow(DiffThisTime Row);
1.p             OrRow(Mask Row);
1.q             WriteRow(Mask Row);
}
```

For purposes of discussion, the above pseudocode will be divided into a plurality of phases of a number of iterations. In this example, FIGS. 5A to 5M and the pseudocode referenced by reference numbers 1.a to 1.d corresponds to a first phase of a number of iterations, the pseudocode referenced by reference numbers 1.e to 1.l corresponds to a second phase of a number of iterations, the pseudocode referenced by reference numbers 1.m to 1.o corresponds to a third phase of a number of iterations, the pseudocode referenced by reference numbers 1.p to 1.q corresponds to a fourth phase of a number of iterations. The data patterns corresponding to bit-vectors 574-0, 574-1, 574-2, 590, 594, 595, 596, and 583 during execution of the first, second, third, and fourth phase of a number of iterations of a compare operation.

Each of the iterations and the phases include performing a number of operations. For example, the pseudocode corresponding to reference number 1 (e.g., For (i=nbits-1; i>=0; i--)) represents a "For" loop associated with an index i. The index i is initially set to a width of each of the bit-vectors 588 (e.g., i=2) and decremented (e.g., i--) after each iteration (e.g., after each iteration of the "For" loop). In this example, the "For" loop terminates when the value of i is less than zero (e.g., when i>=0, in this example). As such, the number of times the "For" loop is performed (e.g., the number of iterations) is equal to the width of the bit-vectors 588 (e.g., 3 bits in this example). Embodiments are not limited to a particular type of loop structure. For example, reference number 1 can represent a "while" loop, among other possible loop structures.

As described further below, in this example, FIGS. 5B, 5F, and 5J correspond to a first phase of a first iteration, a second iteration, a third iteration, and a fourth iteration, respectively, FIGS. 5C, 5G, and 5K correspond to a second phase of the first iteration, the second iteration, the third iteration, and the fourth iteration, respectively, FIGS. 5D, 5H, and 5L correspond to a third phase of the first iteration, the second iteration, the third iteration, and the fourth iteration, respectively, and FIGS. 5E, 5I, and 5M correspond to a fourth phase of the first iteration, the second iteration, the third iteration, and the fourth iteration, respectively.

FIG. 5A illustrates a number of elements stored as bit-vectors 588-0 to 588-5 in array 530 (e.g., prior to a compare operation). The Mask Row bit-vector 590 defines a result bit-vector that identifies the selected adjacent element pairs to be swapped via a swap operation as described in FIGS. 6A to 6Q. In this example, the element pairs to be swapped are defined by whether or not the cells of Mask Row 504-3 that are coupled to the even numbered sense lines store a logic "1." For example, a logic "1" in a bit position of bit-vector 590 corresponding to an even numbered sense line indicates that the corresponding element (e.g., the element stored in cells coupled to the particular even numbered sense line) is greater than an adjacent element (e.g., the element stored in cells coupled to the adjacent odd numbered sense line). A logic "0" in a bit position of bit-vector 590 corresponding to an even numbered sense line indicates that the corresponding element (e.g., the element stored in cells coupled to the particular even numbered sense line) is not greater than (e.g., is less than or equal to) an adjacent element (e.g., the element stored in cells coupled to the adjacent odd numbered sense line).

In FIGS. 5A to 5M, changes to the states of memory cells corresponding to the bit-vectors 574-0, 574-1, 574-2, 590, 594, 595, 596, and 583 are indicated in bold font. For example, in FIG. 5B the data pattern corresponding to bit-vector 594 (e.g., the memory cells coupled to access line 504-10 and to sense lines 505-0 to 505-5) is shown in bold font to indicate the logic values corresponding to bit-vector 594 have changed during a first phase of a first iteration of the compare operation.

The first phase of the compare operation described in association with FIG. 5B includes execution of the pseudocode corresponding to reference numbers 1.a. The pseudocode corresponding to reference numbers 1.a in a first iteration is associated with determining, via an XOR operation, whether MSBs that are adjacent to each other are different.

The pseudocode corresponding to reference number 1.a (e.g., "ReadRow(Row (i))") involves reading the data pattern stored in memory cells coupled to a row that is associated with a particular index into the sensing circuitry 550. During the first iteration of the compare operation "i" is equal to 2 (e.g., i=2). For example, during the first iteration of the compare operation, "i" is equal to a most significant index of elements 588. The bit-vector 574-2 (e.g., [000110]) is read into the sensing circuitry 550 (e.g., compute components 331-0 to 331-5 and/or sensing amplifiers 306-0 to 306-5) corresponding to bit-vector 583. As such, bit-vector 583 is [000110].

The pseudocode corresponding to reference number 1.b (e.g., "ShiftAccLeft( )"), is associated with performing a SHIFT operation on the bit-vector 583. The SHIFT operation shifts bits stored in the sensing circuitry 550 one bit position to the left. In this example, prior to the SHIFT operation, the bit-vector 583 is [000110] (e.g., the data pattern corresponding to bit-vector 574-2 which was read into the sensing circuitry 550 corresponding to bit-vector 583). After the SHIFT operation, the bit-vector 583 is [001100].

The pseudocode corresponding to reference number 1.c (e.g., "XorRow(Row (i))"), is associated with performing an XOR operation on bit-vector 583 and a bit-vector that is stored in memory cells coupled to a row access line that is associated with i. For example, the XOR operation is performed on bit-vector 583 (e.g., [001100]) and bit-vector 574-2 (e.g., [000110]).

As used herein, performing an XOR operation on a first and second bit-vector can include performing, in parallel, the logical operation on each of the respective bits at corresponding bit positions of the bit-vectors using a NAND operation, an OR operation, and an AND operation. As an example, performing an XOR operation can include performing a NAND operation on a first bit-vector "a" (e.g., [$a_0$ $a_1$ $a_2$ $a_3$ $a_4$ $a_5$]) and a second bit-vector "b" (e.g., [$b_0$ $b_1$ $b_2$ $b_3$ $b_4$ $b_5$]). Performing a NAND operation on "a" and "b" results in a bit-vector "c" (e.g., [$c_0$ $c_1$ $c_2$ $c_3$ $c_4$ $c_5$]), wherein $c_0$=$a_0$ NAND $b_0$, $c_1$=$a_1$ NAND $b_1$, $c_2$=$a_2$ NAND $b_2$, $c_3$=$a_3$ NAND $b_3$, $c_4$=$a_4$ NAND $b_4$, and $c_5$=$a_5$ NAND $b_5$. Performing an XOR operation can also include performing an OR operation on "a" and "b" which results in a bit-vector "d" (e.g., [$d_0$ $d_1$ $d_2$ $d_3$ $d_4$ $d_5$]), wherein $d_0$=$a_0$ OR $b_0$, $d_1$=$a_1$ OR $b_1$, $d_2$=$a_2$ OR $b_2$, $d_3$=$a_3$ OR $b_3$, $d_4$=$a_4$ OR $b_4$, and $d_5$=$a_5$ OR $b_5$. Performing an XOR operation can further include performing an AND operation on "c" and "d" which results in a bit-vector "e" (e.g., [$e_0$ $e_1$ $e_2$ $e_3$ $e_4$ $e_5$]), wherein $e_0$=$c_0$ AND $d_0$, $e_1$=$c_1$ AND $d_1$, $e_2$=$c_2$ AND $d_2$, $e_3$=$c_3$ AND $d_3$, $e_4$=$c_4$ AND $d_4$, and $e_5$=$c_5$ AND $d_5$. For example, performing an XOR operation on "a" and "b" results in "e". The NAND, OR, and AND operations are described in FIGS. 7-12.

"XORing" bit-vectors 583 and 574-2 (e.g., [001100] XOR [000110]) results in [001010] being stored as bit-vector 583 (e.g., the result of the XOR operation is stored in the sensing circuitry 550). As such, bit-vector 583 is [001010] as shown in FIG. 5B.

At reference number 1.d of the pseudocode (e.g., "WriteRow(DiffThisTime Row)"), the data pattern corresponding to bit-vector 583 is copied to the cells storing the DiffThisTime Row bit-vector 594. As such, DiffThisTime Row bit-vector 594 is [001010] as shown in FIG. 5B.

FIG. 5C corresponds to a second phase of the first iteration (e.g., an initial execution of the "For" loop corresponding to the pseudocode referenced by 1.a to 1.q and for which the index "i" is equal to 2). A second phase of the first iteration corresponds to the pseudocode referenced by reference numbers 1.e to 1.l and FIG. 5C, and is associated with storing the data pattern of the DiffThisTime Row bit-vector 594 in the cells corresponding to the DiffEver Row bit-vector 595. For example, a copy of the data stored in cells coupled to DiffThisTime Row 504-10 is stored in the cells coupled to DiffEver Row bit-vector 595.

Reference number 1.e of the pseudocode (e.g., "OrRow (DiffEver Row)"), is associated with performing an OR operation on bit-vector 583 and bit-vector 595. For example, the OR operation is performed on bit-vector 583 (e.g., [001010]) and bit-vector 595 (e.g., [000000]). "ORing" bit-vectors 583 and 595 (e.g., [001010] OR [000000]) results in [001010] being stored as bit-vector 583 (e.g., the result of the OR operation is stored in the sensing circuitry 550). As such, bit-vector 583 is [001010] as shown in FIG. 5C. At reference number 1.f of the pseudocode (e.g., "WriteRow(DiffEver 2 Row)"), the data pattern corresponding to bit-vector 583 is copied to the cells storing the DiffEver 2 Row bit-vector 596. As such, DiffEver 2 Row bit-vector 596 is [001010] as shown in FIG. 5C. DiffEver 2 Row bit-vector 596 is used as temporary storage. DiffEver 2 Row bit-vector 596 holds an updated value (e.g., the result of "OrRow (DiffEver Row)") that is associated with DiffEver Row bit-vector 595 while an outdated value that is associated with DiffEver Row bit-vector 595 is used to modify DiffThisTime Row bit-vector 594 (e.g., the pseudocode associated with reference number 1.j "WriteRow(DiffThisTime Row)").

The pseudocode corresponding to reference number 1.g (e.g., "ReadRow(DiffEver Row)") involves reading the data pattern (e.g., DiffEver Row bit-vector 595) stored in memory cells coupled to DiffEver Row 504-11 into the sensing circuitry 550. As such, the bit-vector 583 is [000000]. At reference number 1.h ("InvAcc( )"), an invert operation is performed on bit-vector 583 such that bit-vector 583 stores [111111] (e.g., the inverse of [000000]). At reference number 1.i (e.g., "AndRow(DiffThisTime Row)"), an AND operation is performed on bit-vector 583 (e.g., [111111]) and bit-vector 594 (e.g., [001010]). "ANDing" bit-vectors 583 and 594 (e.g., [111111] AND [001010]) results in [001010] being stored as bit-vector 583. As such, bit-vector 583 is [001010]. At reference number 1.j (e.g., "WriteRow(DiffThisTime Row)"), the data pattern corresponding to bit-vector 583 is copied to the cells storing DiffThisTime Row bit-vector 594. As such, DiffThisTime Row bit-vector 594 is [001010] as shown in FIG. 5C.

The pseudocode corresponding to reference number 1.k (e.g., "ReadRow(DiffEver 2 Row)") involves reading the data pattern (e.g., bit-vector 596) stored in memory cells coupled to DiffEver 2 Row 504-12 into the sensing circuitry 550. As such, the bit-vector 583 is [001010]. At reference number 1.l (e.g., "WriteRow(DiffEver Row)"), the data pattern corresponding to bit-vector 583 is copied to the cells storing DiffEver Row bit-vector 595. As such, DiffEver Row bit-vector 595 is [001010] as shown in FIG. 5C.

FIG. 5D and the pseudocode referenced by reference numbers 1.m-1.o corresponds to a third phase of the first iteration of the compare operation and is associated with determining whether a bit stored in a memory cell coupled to a sense line is greater than an adjacent bit stored in an memory cell coupled to an adjacent sense lined for each of a plurality of bits identified by DiffThisTime Row bit-vector 594. Reference number 1.m of the pseudocode (e.g., "ReadRow(Row(i))"), involves reading the data pattern (e.g., bit-vector 574-2) stored in memory cells coupled to Row 2 504-2 into the sensing circuitry 550. As such, bit-vector 583 is [000110]. At reference number 1.n of the pseudocode (e.g., "AndRow(DiffThisTime Row)"), an AND operation is performed on bit-vector 583 (e.g., [000110]) and bit-vector 594 (e.g., [001010]). "ANDing" bit-vectors 583 and 594 (e.g., [000110] AND [001010]) results in [000010] being stored as bit-vector 583. As such, bit-vector 583 is [000010] as shown in FIG. 5D. "ANDing" bit-vector 583 and 594 determines which bits that are stored in memory cells that are coupled to a sense line are greater than adjacent bits stored in memory cells that are coupled to a right adjacent sense line. For example, bit-vector 583 (e.g., [000010] identifies that a bit (e.g., 1) stored in a memory cell coupled to sense line 505-4 and access line 504-2 is greater than a bit (e.g., 0) stored in a memory cell coupled to sense line 505-5 and access line 504-2. Bit-vector 593 (e.g., [00010] also identifies that a bit (e.g., 0) stored in a memory cell couple to sense line 505-0 and access line 504-2 is less than or equal to a bit (e.g., 0) stored in a memory cell coupled to sense line 505-1 and access line 504-2, that a bit (e.g., 0) stored in a memory cell coupled to sense line 505-1 and access line 504-2 is less than or equal to a bit (e.g., 0) stored in a memory cell coupled to sense line 505-2 and access line 504-2, that a bit (e.g., 0) stored in a memory cell coupled to sense line 505-2 and access line 504-2 is less than or equal to a bit (e.g., 1) stored in a memory cell coupled to sense line 505-3 and access line 504-2, and that a bit (e.g., 1) stored in a memory cell coupled to sense line 505-3 and access line 504-2 is less than or equal to a bit (e.g., 1) stored in a memory cell coupled to sense line 505-4 and access line 504-2.

At reference number 1.o of the pseudocode (e.g., "WriteRow(DiffThisTime Row)"), the data pattern corresponding to bit-vector 583 is copied to the cells storing DiffThisTime Row bit-vector 594. As such, DiffThisTime Row bit-vector 594 is [000010] as shown in FIG. 5D.

FIG. 5E and the pseudocode referenced by reference numbers 1.p and 1.q corresponds to a fourth phase of the first iteration of the compare operation and is associated with performing an OR operation to indicate which elements are greater than other elements. At reference number 1.p of the pseudocode (e.g., "OrRow(Mask Row)"), an OR operation is performed on bit-vector 583 (e.g., [000010]) and bit-vector 590 (e.g., [000000]). "ORing" bit-vectors 583 and 590 (e.g., [000010] OR [000000]) results in [000010] being stored as bit-vector 583. As such, bit-vector 583 is [000010]. At reference number 1.q (e.g., "WriteRow(Mask Row)"), the data pattern corresponding to bit-vector 583 is copied to the cells storing Mask Row bit-vector 590. As such, Mask Row bit-vector 590 is [000010] as shown in FIG. 5E.

FIG. 5F and the pseudocode referenced by reference numbers 1.a to 1.d corresponds to a first phase of the second iteration of the compare operation. During the second iteration of the compare operation "i" is equal to 1 (e.g., i=1). At pseudocode corresponding to reference number 1.a, the bit-vector 574-1 (e.g., [101001]) is read into the sensing circuitry 550 corresponding to bit-vector 583. As such, bit-vector 583 is [101001].

The pseudocode corresponding to reference number 1.b involves performing a SHIFT operation on bit-vector 583 that is [101001]. Prior to the SHIFT operation, the bit-vector 583 is [101001]. After the SHIFT operation, the bit-vector 583 is [010010]. At pseudocode corresponding to reference number 1.c, an XOR operation is performed on bit-vector 583 (e.g., [010010]) and bit-vector 574-1 (e.g., [101001]). "XORing" bit-vectors 583 and 574-1 (e.g., [010010] XOR [101001]) results in [111011] being stored as bit-vector 583 (e.g., the result of the XOR operation is stored in the sensing circuitry 550). As such, bit-vector 583 is [111011] as shown in FIG. 5F. At reference number 1.d of the pseudocode, the data pattern corresponding to bit-vector 583 is copied to the cells storing the DiffThisTime Row bit-vector 594. As such, DiffThisTime Row bit-vector 594 is [111011] as shown in FIG. 5F.

FIG. 5G corresponds to a second phase of the second iteration of the compare operation. A second phase of the second iteration corresponds to the pseudocode referenced by reference numbers 1.e to 1.l and FIG. 5G, and is associated with storing the data pattern of the DiffThisTime Row bit-vector 594 in the cells corresponding to the DiffEver Row bit-vector 595. For example, a copy of the data stored in cells coupled to DiffThisTime Row 504-10 is stored in the cells coupled to DiffEver Row bit-vector 595 via an OR operation.

Reference number 1.e of the pseudocode, is associated with performing an OR operation on bit-vector 583 (e.g., [111011]) and bit-vector 595 (e.g., [001010]). "ORing" bit-vectors 583 and 595 (e.g., [111011] OR [001010]) results in [111011] being stored as bit-vector 583 (e.g., the result of the OR operation is stored in the sensing circuitry 550). As such, bit-vector 583 is [111011] as shown in FIG. 5G. At reference number 1.f of the pseudocode the data pattern corresponding to bit-vector 583 is copied to the cells storing the DiffEver 2 Row bit-vector 596. As such, DiffEver 2 Row bit-vector 596 is [111011] as shown in FIG. 5G.

The pseudocode corresponding to reference number 1.g involves reading the data pattern (e.g., DiffEver Row bit-vector 595) stored in memory cells coupled to DiffEver Row 504-11 into the sensing circuitry 550. As such, the bit-vector 583 is [001010]. At reference number 1.h, an invert operation is performed on bit-vector 583 such that bit-vector 583 stores [110101] (e.g., the inverse of [001010]). At reference number 1.i, an AND operation is performed on bit-vector 583 (e.g., [110101]) and bit-vector 594 (e.g., [111011]). "ANDing" bit-vectors 583 and 594 (e.g., [110101] AND [111011]) results in [110001] being stored as bit-vector 583. As such, bit-vector 583 is [110001]. At reference number 1.j the data pattern corresponding to bit-vector 583 is copied to the cells storing DiffThisTime Row bit-vector 594. As such, DiffThisTime Row bit-vector 594 is [110001] as shown in FIG. 5G.

The pseudocode corresponding to reference number 1.k involves reading the data pattern (e.g., bit-vector 596) stored in memory cells coupled to DiffEver 2 Row 504-12 into the sensing circuitry 550. As such, the bit-vector 583 is [001010]. At reference number 1.l, the data pattern corresponding to bit-vector 583 is copied to the cells storing DiffEver bit-vector 595. As such, DiffEver Row bit-vector 595 is [001010] as shown in FIG. 5G.

FIG. 5H and the pseudocode referenced by reference numbers 1.m-1.o corresponds to a third phase of the second iteration of the compare operation. Reference number 1.m of the pseudocode involves reading the data pattern (e.g., bit-vector 574-1) stored in memory cells coupled to Row 1 504-1 into the sensing circuitry 550. As such, bit-vector 583 is [101001]. At reference number 1.n of the pseudocode, an AND operation is performed on bit-vector 583 (e.g., [101001]) and bit-vector 594 (e.g., [110001]). "ANDing" bit-vectors 583 and 594 (e.g., [101001] AND [110001]) results in [100001] being stored as bit-vector 583. As such, bit-vector 583 is [100001] as shown in FIG. 5H.

At reference number 1.o of the pseudocode, the data pattern corresponding to bit-vector 583 is copied to the cells storing DiffThisTime Row bit-vector 594. As such, DiffThisTime Row bit-vector 594 is [100001] as shown in FIG. 5H.

FIG. 5I and the pseudocode referenced by reference numbers 1.p and 1.q corresponds to a fourth phase of the second iteration of the compare operation. At reference number 1.p of the pseudocode, an OR operation is performed on bit-vector 583 (e.g., [100001]) and bit-vector 590 (e.g., [000010]). "ORing" bit-vectors 583 and 590 (e.g., [100001] OR [000010]) results in [100011] being stored as bit-vector 583. As such, bit-vector 583 is [100011]. At reference number 1.q, the data pattern corresponding to bit-vector 583 is copied to the cells storing Mask Row bit-vector 590. As such, Mask Row bit-vector 590 is [100011] as shown in FIG. 5I.

FIG. 5J and the pseudocode referenced by reference numbers 1.a to 1.d corresponds to a first phase of the third iteration of the compare operation. During the third iteration of the compare operation "i" is equal to 0 (e.g., i=0). At pseudocode corresponding to reference number 1.a, the bit-vector 574-0 (e.g., [110010]) is read into the sensing circuitry 550 corresponding to bit-vector 583. As such, bit-vector 583 is [110010].

At pseudocode corresponding to reference number 1.b, a SHIFT operation is performed on bit-vector 583 that is [110010]. After the SHIFT operation, the bit-vector 583 is [100100]. At pseudocode corresponding to reference number 1.c, an XOR operation is performed on bit-vector 583 (e.g., [100100]) and bit-vector 574-0 (e.g., [110010]). "XORing" bit-vectors 583 and 574-1 (e.g., [100100] XOR [110010]) results in [010110] being stored as bit-vector 583 (e.g., the result of the XOR operation is stored in the sensing circuitry 550). As such, bit-vector 583 is [010110] as shown in FIG. 5J. At reference number 1.d of the pseudocode, the data pattern corresponding to bit-vector 583 is copied to the cells storing the DiffThisTime Row bit-vector 594. As such, DiffThisTime Row bit-vector 594 is [010110] as shown in FIG. 5J.

FIG. 5K corresponds to a second phase of the third iteration of the compare operation. A second phase of the third iteration corresponds to the pseudocode referenced by reference numbers 1.e to 1.l and FIG. 5K.

Reference number 1.e of the pseudocode, is associated with performing an OR operation on bit-vector 583 (e.g., [010110]) and bit-vector 595 (e.g., [001010]). "ORing" bit-vectors 583 and 595 (e.g., [010110] OR [001010]) results in [011110] being stored as bit-vector 583. As such, bit-vector 583 is [011110] as shown in FIG. 5K. At reference number 1.f of the pseudocode, the data pattern corresponding to bit-vector 583 is copied to the cells storing the DiffEver 2 Row bit-vector 596. As such, DiffEver 2 Row bit-vector 596 is [011110] as shown in FIG. 5K.

The pseudocode corresponding to reference number 1.g involves reading the data pattern (e.g., DiffEver Row bit-vector 595) stored in memory cells coupled to DiffEver Row 504-11 into the sensing circuitry 550. As such, the bit-vector 583 is [001010]. At reference number 1.h, an invert operation is performed on bit-vector 583 such that bit-vector 583 stores [110101] (e.g., the inverse of [001010]). At reference number 1.i, an AND operation is performed on bit-vector 583 (e.g., [110101]) and bit-vector 594 (e.g., [010110]). "ANDing" bit-vectors 583 and 594 (e.g., [110101] AND [010110]) results in [010100] being stored as bit-vector 583. As such, bit-vector 583 is [010100]. At reference number 1j, the data pattern corresponding to bit-vector 583 is copied to the cells storing DiffThisTime Row bit-vector 594. As such, DiffThisTime Row bit-vector 594 is [010100] as shown in FIG. 5K.

The pseudocode corresponding to reference number 1.k involves reading the data pattern (e.g., bit-vector 596) stored in memory cells coupled to DiffEver 2 Row 504-12 into the sensing circuitry 550. As such, the bit-vector 583 is [111010]. At reference number 1.l, the data pattern corresponding to bit-vector 583 is copied to the cells storing DiffEver bit-vector 595. As such, DiffEver Row bit-vector 595 is [111010] as shown in FIG. 5K.

FIG. 5L and the pseudocode referenced by reference numbers 1.m-1.o corresponds to a third phase of the third iteration of the compare operation. Reference number 1.m of the pseudocode involves reading the data pattern (e.g., bit-vector 574-0) stored in memory cells coupled to Row 0 504-0 into the sensing circuitry 550. As such, bit-vector 583 is [110010]. At reference number 1.n of the pseudocode, an AND operation is performed on bit-vector 583 (e.g., [110010]) and bit-vector 594 (e.g., [010100]). "ANDing" bit-vectors 583 and 594 (e.g., [110010] AND [010100]) results in [000000] being stored as bit-vector 583. As such, bit-vector 583 is [010000] as shown in FIG. 5L.

At reference number 1.o of the pseudocode, the data pattern corresponding to bit-vector 583 is copied to the cells storing DiffThisTime Row bit-vector 594. As such, DiffThisTime Row bit-vector 594 is [010000] as shown in FIG. 5L.

FIG. 5M and the pseudocode referenced by reference numbers 1.p and 1.q corresponds to a fourth phase of the third iteration of the compare operation. At reference number 1.p of the pseudocode, an OR operation is performed on bit-vector 583 (e.g., [010000]) and bit-vector 590 (e.g., [100011]). "ORing" bit-vectors 583 and 590 (e.g., [010000] OR [100011]) results in [110011] being stored as bit-vector 583. As such, bit-vector 583 is [110011]. At reference number 1.q, the data pattern corresponding to bit-vector 583 is copied to the cells storing Mask Row bit-vector 590. As such, Mask Row bit-vector 590 is [110011] as shown in FIG. 5M.

During a fourth iteration i is equal to −1. As such, during the execution of a number of operations associated with reference number 1, (e.g., For "(i=nbits−1; i>=0; i−−)"), "i>=0" returns false because i (e.g., −1) is less than 0. As a result, the "For loop" terminates concluding the execution of the compare operation. In a number of examples, the Mask Row bit-vector 590 that is stored in memory cells coupled to Mask Row 504-3 can be copied to memory cells coupled to a different access line. The Mask Row bit-vector 590 has a value of [110011]), which indicates that bit-vector 588-0 is greater than bit-vector 588-1, that bit-vector 588-2 is not greater than bit-vector 588-3, and that bit-vector 588-4 is greater than bit-vector 588-5 (e.g., recall that, in this example, a "1" in a bit position corresponding to an even numbered column indicates the value of the element stored in the even numbered column is greater than the value of the element stored in the adjacent odd numbered column, and a "0" in a bit position corresponding to an even numbered column indicates the value of the element stored in the even numbered column is not greater than the value of the element stored in the adjacent odd numbered column). stored in cells coupled to the particular even numbered sense line) is not greater than (e.g., is less than or equal to) an adjacent element (e.g., the element stored in cells coupled to the adjacent odd numbered sense line).

FIGS. 6A-6Q illustrate the states (e.g., logic values) of memory cells of a portion of an array 630 at a number of particular phases associated with performing a swap operation in accordance with a number of embodiments of the present disclosure. The array 630 is analogous to array 430 and 530 in FIGS. 4A-5J and FIGS. 5A-5M, respectively.

The example of FIGS. 6A-6Q includes six elements each stored in a group of memory cells commonly coupled to one of sense lines 605-0 to 605-5. The six elements are values (e.g., decimal values) and are stored as binary bit-vectors 688-0, 688-1, 688-2, 688-3, 688-4, and 688-5 (referred to generally as bit-vectors 688) in array 430. The bit-vectors 688 are analogous to bit-vectors 488 in FIG. 4C and bit-vectors 588 in FIG. 5A. FIGS. 6A-6Q also indicate the values (e.g., decimal values) 689-0 to 689-5 (referred to generally as values 689) of the elements represented by respective bit-vectors 688-0 to 688-5. For instance, as shown in FIG. 6A, bit-vector 688-0 (e.g., [011]) corresponds to value 689-0 (e.g., a decimal value of 3), bit-vector 688-1 (e.g., [001]) corresponds to value 689-1 (e.g., a decimal value of 1), bit-vector 688-2 (e.g., [010]) corresponds to value 689-2 (e.g., a decimal value of 2), bit-vector 688-3 (e.g., [100]) corresponds to value 689-3 (e.g., a decimal value of 4), bit-vector 688-4 (e.g., [101]) corresponds to value 689-4 (e.g., a decimal value of 5), and bit-vector 688-5 (e.g., [010]) corresponds to value 689-5 (e.g., a decimal value of 2).

In FIGS. 6A-6Q, the LSB (least significant bit) of the bit-vectors 688-0 to 688-5 is stored in cells coupled to access line 604-0, the next LSB is stored in cells coupled to access line 604-1, and the MSB (most significant bit) is stored in cells coupled to access line 604-2; however, embodiments are not limited to a particular ordering of bits.

The example described in FIGS. 6A-6Q involves swapping selected adjacent element pairs (e.g., selected element pairs each comprising an element stored in the cells coupled to a particular sense line and an element stored in the cells coupled to an adjacent sense line). Specifically, the example of FIGS. 6A-6Q involves swapping the elements stored as bit-vectors 688-0 and 688-1 (e.g., a first element pair) and swapping the elements stored as bit-vectors 688-4 and 588-5 (e.g., a second element pair). In this example, the elements stored as bit-vectors 688-2 and 688-3 (e.g., a third element pair) are not swapped. As such, the swapping operation described in association with FIGS. 6A-6Q results in the element originally stored in the cells coupled to sense line 605-0 (e.g., bit-vector [011] representing a decimal value of 3) being stored in the cells coupled to sense line 605-1, and the element originally stored in the cells coupled to sense line 605-1 (e.g., bit-vector [001] representing a decimal value of 1) being stored in the cells coupled to sense line 605-0, such that subsequent to swapping, bit-vector 688-0 is [001] and bit-vector 688-1 is [011]. Similarly, the swapping operation described in association with FIGS. 6A-6Q results in the element originally stored in the cells coupled to sense line 605-4 (e.g., bit-vector [101] representing a decimal value of 5) being stored in the cells coupled to sense line 605-5, and the element originally stored in the cells coupled to sense line 605-5 (e.g., bit-vector [010] representing a decimal value of 2) being stored in the cells coupled to sense line 605-4, such that subsequent to swapping, bit-vector 688-4 is [010] and bit-vector 488-5 is [101]. In a number of embodiments, the swapping operation can be performed such that swapping of the element pairs being swapped occurs in parallel.

In a number of embodiments, the states of the memory cells commonly coupled to a particular access line (604) represent a stored data pattern (e.g., bit pattern) corresponding to a bit-vector. For instance, in the example of FIGS. 6A-6Q, the memory cells commonly coupled to access line 604-0 (Row 0) and to sense lines 605-0 to 605-5 represent a stored data pattern corresponding to bit-vector 674-0 (e.g., [110010] as shown in FIG. 6A), which may be referred to as the "Row 0 bit-vector." The memory cells commonly coupled to access line 604-1 (Row 1) and to sense lines 605-0 to 605-5 represent a stored data pattern corresponding to bit-vector 674-1 (e.g., [101001] as shown in FIG. 6A), which may be referred to as the "Row 1 bit-vector." The memory cells commonly coupled to access line 604-2 (Row 2) and to sense lines 605-0 to 605-5 represent a stored data pattern corresponding to bit-vector 674-2 (e.g., [000110] as shown in FIG. 6A), which may be referred to as the "Row 2 bit-vector." As such, bit-vector 674-0 comprises the LSBs of the respective bit-vectors 688, bit-vector 674-1 comprises the next LSBs of the respective bit-vectors 688, and bit-vector 674-2 comprises the MSBs of the respective bit-vectors 688 (e.g., the bit-vectors representing the elements corresponding to the respective sense lines 605-0 to 605-5). In this example, the LSB of the bit-vectors 688 can be associated with an index of "0" (e.g., n=0), the next LSB of the bit-vectors 688 can be associated with an index of "1" (e.g., n=1), and the MSB of the bit-vectors 688 can be associated with an index of "2" (e.g., n=2).

In a number of embodiments, groups of memory cells in addition to those storing elements (e.g., the elements represented by the bit-vectors 688) can be used to perform a swapping operation. The additional groups of memory cells can be groups of memory cells commonly coupled to respective access lines and to the sense lines corresponding to the stored elements (e.g., sense lines 605-0 to 605-5 in the example of FIGS. 6A-6Q). As an example, a first additional group of memory cells can be used to store a bit pattern that can serve as a mask that can define which element pairs are being swapped. In the example shown in FIGS. 6A-6Q, the cells coupled to access line 604-3 (Mask Row) and to sense lines 605-0 to 605-5 serve as a mask that can define which of the element pairs are being swapped. The states of the memory cells of Mask Row 604-3 represent a stored data pattern corresponding to bit-vector 690, which can be referred to as the "Mask Row bit-vector." A second additional group of memory cells can also be used to store a bit pattern that can serve as a mask in association with performing a swap operation. In the example shown in FIGS.

6A-6Q, the cells coupled to access line 604-21 (Shifted Mask Row) and to sense lines 605-0 to 605-5 serve as a mask during a swap operation. The states of the memory cells of Shifted Mask Row 604-21 represent a stored data pattern corresponding to bit-vector 678, which can be referred to as the "Shifted Mask Row bit-vector." In this example, and as shown in FIG. 6B, the data pattern corresponding to the Shifted Mask Row bit-vector is the data pattern corresponding to the Mask Row bit-vector shifted one bit-position to the right. A number of additional groups of memory cells can be used as temporary storage in association with performing a swap operation. The example shown in FIGS. 6A-6Q includes an additional group of memory cells coupled to access line 604-22 (Temp Row 1) and to sense lines 605-0 to 605-5 that is used as temporary storage and an additional group of cells coupled to access line 604-23 (Temp Row 2) and to sense lines 605-1 to 605-5 that is used as temporary storage. The states of the memory cells of Temp Row 1 604-22 represent a stored data pattern corresponding to bit-vector 680, which can be referred to as the "Temp Row 1 bit-vector," and the states of the memory cells of Temp Row 2 604-23 represent a stored data pattern corresponding to bit-vector 682, which can be referred to as the "Temp Row 2 bit-vector." In a number of embodiments, the Mask Row 604-3, Shifted Mask Row 604-21, Temp Row 1 604-22, and Temp Row 2 604-23 may not be addressable to a user (e.g., the cells coupled to those access lines may not be part of the addressable space of the array 630).

FIGS. 6A-6Q also illustrate the states of sensing circuitry 650 (e.g., compute components 331 and/or sense amplifiers 306 shown in FIG. 3) coupled to the respective sense lines 605-0 to 605-5 during various phases of a swap operation. The states (e.g., latched logic values) of the sensing circuitry 650 represent a stored data pattern corresponding to bit-vector 683.

As described below, in a number of embodiments, swapping selected elements stored in an array (e.g., array 630) can include performing a number of logical operations such as AND, OR, NOT, NAND, NOR, and/or shift operations. The logical operations can be performed using data stored in the array as inputs, and can be performed without transferring data from the array via an I/O line, for instance. In a number of embodiments, the bit-vectors 674-0, 674-1, 674-2, 690, 678, 680, 482, and 683 serve as operands to the logical operations in association with swapping the selected elements.

The below pseudocode represents instructions executable to perform a number of swap operations in a memory in accordance with a number of embodiments of the present disclosure. The example pseudocode is referenced using reference numbers 1-4. For example, reference number one (1) corresponds to "readRow(Mask Row)" as shown in the below pseudocode, reference number two (2) corresponds to "shift(RIGHT)" as shown in the below pseudocode, etc.

| | |
|---|---|
| 1. | readRow(Mask Row); |
| 2. | shift(RIGHT); |
| 3. | writeRow(Shifted Mask Row); |
| 4. | for (n = 0; n < element width; n++) do |
| a. | readRow(Row(n)); |
| b. | writeRow(Temp Row 1); |
| c. | shift(RIGHT); |
| d. | andRow(Shifted Mask Row); |
| e. | writeRow(Temp Row 2); |
| f. | readRow(Shifted Mask Row); |
| g. | inv( ); |
| h. | andRow(Row(n)); |

-continued

| | |
|---|---|
| i. | orRow(Temp Row 2); |
| j. | writeRow(Row(n)); |
| k. | readRow(Temp Row 1); |
| l. | andRow(Shifted Mask Row); |
| m. | shift(LEFT); |
| n. | writeRow(Temp Row 2); |
| o. | readRow(Mask Row); |
| p. | inv( ); |
| q. | andRow(Row(n)); |
| r. | orRow(Temp Row 2); |
| s. | writeRow(Row(n)); |

For purposes of discussion, the above pseudocode will be divided into a setup phase and an iterations phase. In this example, FIGS. 6A and 6B and the pseudocode referenced by reference numbers 1-3 corresponds to the setup phase.

FIGS. 6C to 6Q and the pseudocode referenced by reference number 4 (e.g., 4.a-4.s) corresponds to the iterations phase. Each of the iterations (e.g., of the "For" loop) associated with the iterations phase can further be divided into a first phase, a second phase, a third phase, a fourth phase, and a fifth phase, with the first phase corresponding to the pseudocode referenced by reference numbers 4.a and 4.b, the second phase corresponding to the pseudocode referenced by reference numbers 4.c to 4.e, the third phase corresponding to the pseudocode referenced by reference numbers 4.f to 4.j, the fourth phase corresponding to the pseudocode referenced by reference numbers 4.k to 4.n, and the fifth phase corresponding to the pseudocode referenced by reference numbers 4.o to 4.s. The data patterns corresponding to bit-vectors 674-0, 674-1, 674-2, 690, 678, 680, 682, and 683 during execution of the iterations phase are shown in FIGS. 6C to 6Q.

The iterations phase can include performing a number of iterations of operations. For example, the pseudocode corresponding to reference number 4 (e.g., for (n=0; n<element width; n++) do:) represents a "For" loop associated with an index n. The index n can initially be set to zero (e.g., n=0) and incremented (e.g., n++) after each iteration (e.g., after each iteration of the "For" loop). In this example, the "For" loop terminates when the value of n is equal to a width of the bit-vectors 688 representing elements being swapped (e.g., when n=3, in this example). As such, the number of times the "For" loop is performed (e.g., the number of iterations) is equal to the width of the bit-vectors 688 (e.g., 3 bits in this example). Embodiments are not limited to a particular type of loop structure. For example, reference number 4 can represent a "while" loop, among other possible loop structures.

As described further below, in this example, FIGS. 6C-6G correspond to a first iteration of the iterations phase (e.g., an initial execution of the "For" loop corresponding to the pseudocode referenced by 4.a to 4.s), FIGS. 6H-6L correspond to a second iteration of the iterations phase, and FIGS. 6M-6Q correspond to a third iteration of the iterations phase.

As described above, FIG. 6A illustrates a number of elements stored as bit-vectors 688-0 to 688-5 in array 630 (e.g., prior to a swap operation). The Mask Row bit-vector 690 defines selected adjacent element pairs to be swapped. The Mask Row bit-vector 690 is provided by the compare operation.

In FIGS. 6A to 6Q changes to the states of memory cells corresponding to the bit-vectors 674-0, 674-1, 674-2, 690, 678, 680, 682, and 683 are indicated in bold font. For example, in FIG. 6B the data pattern corresponding to bit-vector 678 (e.g., the memory cells coupled to access line 604-4 and to sense lines 605-0 to 605-5) is shown in bold font to indicate the logic values corresponding to bit-vector 690 have changed during a phase of the swap operation.

The setup phase of the swap operation described in association with FIGS. 6A-6Q can include execution of the pseudocode corresponding to reference numbers 1-3. The pseudocode corresponding to reference numbers 1-3 is associated with generating a shifted mask and storing it in the array 630 (e.g., storing it in Shifted Mask Row 604-21 as bit-vector 678).

The pseudocode corresponding to reference number 1 (e.g., "readRow(Mask Row)") involves reading the data pattern stored as Mask Row bit-vector 690 (e.g., [100010]) into the sensing circuitry 650 (e.g., compute components 331-0 to 331-5 and/or sensing amplifiers 306-0 to 306-5) corresponding to bit-vector 683.

The pseudocode corresponding to reference number 2 (e.g., "shift(RIGHT)"), is associated with performing a SHIFT operation on the bit-vector 683. The SHIFT operation shifts bits stored in the sensing circuitry 650 one bit position to the right. In this example, prior to the SHIFT operation, the bit-vector 683 is [100010] (e.g., the data pattern corresponding to Mask Row bit-vector 690 which was read into the sensing circuitry 650 corresponding to bit-vector 683). After the SHIFT operation and as shown in FIG. 6B, the bit-vector 683 is [010001].

The pseudocode corresponding to reference number 3 (e.g., "writeRow(Temp Row 1)"), is associated with writing the data pattern stored in sensing circuitry 650 (e.g., as bit-vector 683) to the cells storing the Shifted Mask Row bit-vector 690. As described further below, the data pattern corresponding to bit-vector 683 can be copied from the sensing circuitry 650 to the cells storing bit-vector 678 (e.g., the cells coupled to access line 604-21) by activating access line 604-21, for instance. As shown in FIG. 6B, the data pattern corresponding to bit-vector 683 (e.g., [010001]), which is the result of the SHIFT operation performed on the data pattern corresponding to bit-vector 690 (e.g., [100010]), is stored in the memory cells corresponding to Shifted Mask Row 678. For example, Shifted Mask Row bit-vector 678 is [010001].

FIGS. 6C-6G correspond to a first iteration of the iterations phase (e.g., an initial execution of the "For" loop corresponding to the pseudocode referenced by 4.a to 4.s and for which the index n is 0). A first phase of the first iteration corresponds to the pseudocode referenced by reference numbers 4.a and 4.b and FIG. 6C, and is associated with storing the data pattern of the "Row n bit-vector" in the cells corresponding to the Temp Row 1 bit-vector 680. For example, a copy of the data stored in a first row of cells comprising data to be swapped (e.g., cells coupled to access line 604-0) is stored in the cells corresponding to Temp Row 1 bit-vector 680. For this iteration (e.g., the first iteration), the index "n" is 0 (e.g., n=0 for the first iteration of the "For" loop). At reference number 4.a of the pseudocode (e.g., "readRow(Row(n))"), the data pattern corresponding to the "Row n bit-vector" is read into the sensing circuitry corresponding to bit-vector 683. Since n=0 for the first iteration of the "For" loop, the data pattern corresponding to the Row 0 bit-vector 674-0 (e.g., [110010]) is read into the sensing circuitry 650, such that bit-vector 683 is [110010], as shown in FIG. 6C. At reference number 4.b (e.g., "writeRow(Temp Row 1)"), the data pattern corresponding to bit-vector 683 is copied to the cells storing the Temp Row 1 bit-vector 680. As such, Temp Row 1 bit-vector 680 is [110010] as shown in FIG. 6C.

FIG. 6D and the pseudocode referenced by reference numbers 4.c-4.e corresponds to a second phase of the iterations phase and is associated with performing a shift operation on the bit-vector 683, "ANDing" the shifted bit-vector with the Shifted Mask Row bit-vector 678, and storing the resultant data pattern to the cells corresponding to Temp Row 2 bit-vector 682. At reference number 4.c of the pseudocode (e.g., "shift(RIGHT)"), the data pattern stored as bit-vector 683 is shifted one bit-position to the right, such that bit-vector 683 is [011001], which is the previous bit-vector 683 (e.g., [110010]) shifted right one bit position. At reference number 4.d (e.g., "andRow(Shifted Mask Row)"), an AND operation is performed on bit-vector 678 (e.g., [010001]) and bit-vector 683 (e.g., [011001]). "ANDing" bit-vectors 678 and 683 (e.g., [010001] AND [011001]) results in [010001] being stored as bit-vector 683 (e.g., the result of the AND operation is stored in the sensing circuitry 650). As such, bit-vector 683 is [010001] as shown in FIG. 6D. At reference number 4.e (e.g., "writeRow(Temp Row 2)"), the data pattern corresponding to bit-vector 683 is copied to the cells storing the Temp Row 2 bit-vector 682. As such, Temp Row 2 bit-vector 682 is [010001] as shown in FIG. 6D. It is noted that the same result for the second phase can be obtained by "ANDing" the bit-vector 683 (which stores the data pattern corresponding to the Row 0 bit-vector 674-0) with Mask Row bit-vector 690, and then performing a right shift on bit-vector 683 prior to copying to Temp Row 2 bit-vector 682.

FIG. 6E and the pseudocode referenced by reference numbers 4.f-4.j corresponds to a third phase of the iterations phase and is associated with performing an invert operation on the data pattern corresponding to the Shifted Mask Row bit-vector 690, performing an AND operation on the result of the invert operation and the Row n bit-vector (e.g., 674-0 for this iteration), performing an OR operation on the result of the AND operation and the Temp Row 2 bit-vector 682, and writing the result of the OR operation back to the cells storing the Row n bit-vector. At reference number 4.f of the pseudocode (e.g., "readRow(Shifted Mask Row)"), the data pattern stored as bit-vector 678 is read into the sensing circuitry 650 such that bit-vector 683 is [010001]. At reference number 4.g (e.g., "inv( )"), an INVERT operation is performed on bit-vector 683 such that bit-vector 683 stores [101110] (e.g., the inverse of its previous data pattern). At reference number 4.h (e.g., "andRow(Row(n))"), an AND operation is performed on the bit-vector 683 (e.g., [101110]) and bit-vector 674-0 (e.g., [110010]), the result being retained in the sensing circuitry 650 such that bit-vector 683 is [100010]. The result of the AND operation (e.g., [100010]), which is stored as bit-vector 683, is ORed with the Temp Row 2 bit-vector 682 (e.g., [010001]), with the result (e.g., [110011]) being retained in sensing circuitry 650 as bit-vector 683. The result of the OR operation (e.g., [110011]) is copied to the cells storing bit-vector 674-0. As such, as shown in FIG. 6E, bit-vectors 674-0 and 683 are [110011] after the third phase.

FIG. 6F and the pseudocode referenced by reference numbers 4.k-4.n corresponds to a fourth phase of the iterations phase and is associated with performing an AND operation on the Shifted Mask Row bit-vector 678 and the Temp Row 1 bit-vector 680, shifting the result of the AND operation one bit position to the left, and writing the result of the left shift to the cells storing Temp Row 2 bit-vector 682. At reference number 4.k of the pseudocode (e.g., "readRow(Temp Row 1)"), the data pattern stored as bit-vector 680 is read into the sensing circuitry 650 such that bit-vector 683 is [110010]. At reference number 4.l (e.g., "andRow(Shifted Mask Row)"), an AND operation is performed on the bit-vector 683 (e.g., [110010]) and bit-vector 678 (e.g., [010001]), the result being retained in the sensing circuitry 650 such that bit-vector 683 is [010000]. At reference number 4.m (e.g., "shift(LEFT)"), the result of the AND operation (e.g., [010000]), which is stored as bit-vector 683, is shifted one bit position to the left, such that bit-vector 683 is [100000]). At reference number 4.n (e.g., "writeRow(Temp Row 2)"), the result of the left shift operation (e.g., [100000]) is copied to the cells storing bit-vector 682. As such, as shown in FIG. 6F, bit-vectors 682 and 683 are [100000] after the fourth phase.

FIG. 6G and the pseudocode referenced by reference numbers 4.o-4.s corresponds to a fifth phase of the iterations phase and is associated with performing an INVERT operation on the data pattern corresponding to the Mask Row bit-vector 690, performing an AND operation on the result of the invert operation and the Row n bit-vector (e.g., 674-0 for this iteration), performing an OR operation on the result of the AND operation and the Temp Row 2 bit-vector 682, and writing the result of the OR operation back to the cells storing the Row n bit-vector. At reference number 4.o of the pseudocode (e.g., "readRow(Mask Row)"), the data pattern stored as bit-vector 690 is read into the sensing circuitry 650 such that bit-vector 683 is [100010]. At reference number 4.p (e.g., "inv( )"), an INVERT operation is performed on bit-vector 683 such that bit-vector 683 stores [011101] (e.g., the inverse of its previous data pattern). At reference number 4.q (e.g., "andRow(Row(n))"), an AND operation is performed on the bit-vector 683 (e.g., [011101]) and bit-vector 674-0 (e.g., [110011]), the result being retained in the sensing circuitry 650 such that bit-vector 683 is [010001]. The result of the AND operation (e.g., [010001]), which is stored as bit-vector 683, is ORed with the Temp Row 2 bit-vector 682 (e.g., [100000]), with the result (e.g., [110001]) being retained in sensing circuitry 650 as bit-vector 683. The result of the OR operation (e.g., [110001]) is copied to the cells storing bit-vector 674-0. As such, as shown in FIG. 6G, bit-vectors 674-0 and 683 are [110001] after the fifth phase.

FIG. 6G shows the states of memory cells of array 630 after a first iteration of a "For" loop associated with reference number 4. After a first iteration of the "For" loop, the 1-bit from bit-vector 688-0 (e.g., a bit-vector [011]) is swapped with a 1-bit from bit-vector 688-1 (e.g., a bit-vector [001]) and the 1-bit from bit-vector 688-4 (e.g., a bit-vector [101]) is swapped with a 0-bit from bit-vector 688-5 (e.g., a bit-vector [010]). FIGS. 6H to 6L show the state of memory cells of array 630 after a second iteration of a "For" loop associated with reference number 4.

FIGS. 6H-6L correspond to a second iteration of the iterations phase. For this iteration (e.g., the second iteration), the index "n" is 1 (e.g., n=1 for the second iteration of the "For" loop). A first phase of the second iteration corresponds to the pseudocode referenced by reference numbers 4.a and 4.b and FIG. 6H. At reference number 4.a of the pseudocode (e.g., "readRow(Row(n))"), the data pattern corresponding to the "Row n bit-vector" is read into the sensing circuitry corresponding to bit-vector 683. Since n=1 for the second iteration of the "For" loop, the data pattern corresponding to the Row 1 bit-vector 674-1 (e.g., [101001]) is read into the sensing circuitry 650, such that bit-vector 683 is [101001], as shown in FIG. 6H. At reference number 4.b, the data pattern corresponding to bit-vector 683 is copied to the cells storing the Temp Row 1 bit-vector 680. As such, Temp Row 1 bit-vector 680 is [101001] as shown in FIG. 6H.

FIG. 6I and the pseudocode referenced by reference numbers 4.c-4.e corresponds to a second phase of the second iteration. At reference number 4.c, the data pattern stored as bit-vector 683 is shifted one bit-position to the right, such that bit-vector 683 is [010100], which is the previous bit-vector 683 (e.g., [101001]) shifted right one bit position. At reference number 4.d, an AND operation is performed on bit-vector 678 (e.g., [010001]]) and bit-vector 683 (e.g., [010100]). The result (e.g., [010000]) of the AND operation is stored in the sensing circuitry 650 as bit-vector 683. As such, bit-vector 683 is [010000] as shown in FIG. 6I. At reference number 4.e, bit-vector 683 is copied to the memory cells that store Temp Row 2 bit-vector 682. As such Temp Row 2 bit-vector 682 is [010000] as shown in FIG. 6I.

FIG. 6J and the pseudocode referenced by reference numbers 4.f-4.j corresponds to a third phase of the second iteration. At reference number 4.f, the data pattern stored as bit-vector 678 is read into the sensing circuitry 650 such that bit-vector 683 is [010001]. At reference number 4.g (e.g., "inv( )"), an INVERT operation is performed on bit-vector 683 such that bit-vector 683 stores [101110] (e.g., the inverse of its previous data pattern). At reference number 4.h, an AND operation is performed on the bit-vector 683 (e.g., [101110]) and bit-vector 674-1 (e.g., [101001]), the result being retained in the sensing circuitry 650 such that bit-vector 683 is [101000]. The result of the AND operation (e.g., [101000]), which is stored as bit-vector 683, is ORed with the Temp Row 2 bit-vector 682 (e.g., [010000]), with the result (e.g., [111000]) being retained in sensing circuitry 650 as bit-vector 683. The result of the OR operation (e.g., [111000]) is copied to the cells storing bit-vector 674-1. As such, as shown in FIG. 6E, bit-vectors 674-1 and 683 are [111000] after the third phase.

FIG. 6K and the pseudocode referenced by reference numbers 4.k-4.n corresponds to a fourth phase of the second iterations. At reference number 4.k, the data pattern stored as bit-vector 680 is read into the sensing circuitry 650 such that bit-vector 683 is [101001]. At reference number 4.l, an AND operation is performed on the bit-vector 683 (e.g., [101001]) and bit-vector 678 (e.g., [010001]), the result being retained in the sensing circuitry 650 such that bit-vector 683 is [000001]. At reference number 4.m, the result of the AND operation (e.g., [000001]), which is stored as bit-vector 683, is shifted one bit position to the left, such that bit-vector 683 is [000010]). At reference number 4.n, the result of the left shift operation (e.g., [000010]) is copied to the cells storing bit-vector 682. As such, as shown in FIG. 6F, bit-vectors 682 and 683 are [000010] after the fourth phase.

FIG. 6L and the pseudocode referenced by reference numbers 4.o-4.s corresponds to a fifth phase of the second iteration. At reference number 4.o, the data pattern stored as bit-vector 690 is read into the sensing circuitry 650 such that bit-vector 683 is [100010]. At reference number 4.p, an INVERT operation is performed on bit-vector 683 such that bit-vector 683 stores [011101] (e.g., the inverse of its previous data pattern). At reference number 4.q, an AND operation is performed on the bit-vector 683 (e.g., [011101]) and bit-vector 674-1 (e.g., [111000]), the result being retained in the sensing circuitry 650 such that bit-vector 683 is [011000]. The result of the AND operation (e.g., [011000]), which is stored as bit-vector 683, is ORed with the Temp Row 2 bit-vector 682 (e.g., [000010]), with the result (e.g., [011010]) being retained in sensing circuitry 650 as bit-vector 683. The result of the OR operation (e.g., [011010]) is copied to the cells storing bit-vector 674-1. As such, as shown in FIG. 6L, bit-vectors 674-1 and 683 are [011010] after the fifth phase.

FIG. 6L shows the states of memory cells of array 630 after a second iteration of the "For" loop associated with reference number 4. After the second iteration of the "For" loop, the 1-bit from bit-vector 688-0 (e.g., [011] before the second iteration) is swapped with a 0-bit from bit-vector 688-1 (e.g., [001] before the second iteration) and the 0-bit from bit-vector 688-4 (e.g., [100] before the second iterations) is swapped with a 1-bit from bit-vector 688-5 (e.g., [011] before the second iteration). FIGS. 6M to 6Q show the state of memory cells of array 630 after a third iteration of the "For" loop associated with reference number 4.

FIGS. 6M-6Q correspond to a third iteration of the iterations phase (e.g., an initial execution of the "For" loop corresponding to the pseudocode referenced by 4.a to 4.s and for which the index n is 2). A first phase of the third iteration corresponds to the pseudocode referenced by reference numbers 4.a and 4.b and FIG. 6M, and is associated with storing the data pattern of the "Row n bit-vector" in the cells corresponding to the Temp Row 1 bit-vector 680. For example, a copy of the data stored in a third row of cells comprising data to be swapped (e.g., cells coupled to access line 604-2) is stored in the cells corresponding to Temp Row 1 bit-vector 680. For this iteration (e.g., the third iteration), the index "n" is 2 (e.g., n=2 for the third iteration of the "For" loop). At reference number 4.a of the pseudocode (e.g., "readRow(Row(n))"), the data pattern corresponding to the "Row n bit-vector" is read into the sensing circuitry corresponding to bit-vector 683. Since n=2 for the third iteration of the "For" loop, the data pattern corresponding to the Row 2 bit-vector 674-2 (e.g., [000110]) is read into the sensing circuitry 650, such that bit-vector 683 is [000110], as shown in FIG. 6M. At reference number 4.b, the data pattern corresponding to bit-vector 683 is copied to the cells storing the Temp Row 1 bit-vector 680. As such, Temp Row 1 bit-vector 680 is [000110] as shown in FIG. 6M.

FIG. 6N and the pseudocode referenced by reference numbers 4.c-4.e corresponds to a second phase of the third iteration. At reference number 4.c, the data pattern stored as bit-vector 683 is shifted one bit-position to the right, such that bit-vector 683 is [000011], which is the previous bit-vector 683 (e.g., [000110]) shifted right one bit position. At reference number 4.d, an AND operation is performed on bit-vector 678 (e.g., [010001]) and bit-vector 683 (e.g., [000011]). ANDing" bit-vectors 678 and 683 (e.g., [010001] AND [000011]) results in [000001] being stored as bit-vector 683 (e.g., the result of the AND operation is stored in the sensing circuitry 650). As such, bit-vector 683 is [000001] as shown in FIG. 6N. At reference number 4.e, the data pattern corresponding to bit-vector 683 is copied to the cells storing the Temp Row 2 bit-vector 682. As such, Temp Row 2 bit-vector 682 is [000001] as shown in FIG. 6N.

FIG. 6O and the pseudocode referenced by reference numbers 4.f-4.j corresponds to a third phase of the third iteration. At reference number 4.f, the data pattern stored as bit-vector 678 is read into the sensing circuitry 650 such that bit-vector 683 is [010001]. At reference number 4.g, an INVERT operation is performed on bit-vector 683 such that bit-vector 683 stores [101110] (e.g., the inverse of its previous data pattern). At reference number 4.h, an AND operation is performed on the bit-vector 683 (e.g., [101110]) and bit-vector 674-2 (e.g., [000110]), the result being retained in the sensing circuitry 650 such that bit-vector 683 is [000110]. The result of the AND operation (e.g., [000110]), which is stored as bit-vector 683, is ORed with the Temp Row 2 bit-vector 682 (e.g., [000001]), with the result (e.g., [000111]) being retained in sensing circuitry 650 as bit-vector 683. The result of the OR operation (e.g., [000111]) is copied to the cells storing bit-vector 674-2. As such, as shown in FIG. 6O, bit-vectors 674-2 and 683 are [000111] after the third phase.

FIG. 6P and the pseudocode referenced by reference numbers 4.k-4.n corresponds to a fourth phase of the third iteration. At reference number 4.k, the data pattern stored as bit-vector 680 is read into the sensing circuitry 650 such that bit-vector 683 is [000110]. At reference number 4.1, an AND operation is performed on the bit-vector 683 (e.g., [0000110]) and bit-vector 678 (e.g., [010001]), the result being retained in the sensing circuitry 650 such that bit-vector 483 is [000000]. At reference number 4.m, the result of the AND operation (e.g., [000000]), which is stored as bit-vector 683, is shifted one bit position to the left, such that bit-vector 683 is [000000]). At reference number 4.n, the result of the left shift operation (e.g., [000000]) is copied to the cells storing bit-vector 682. As such, as shown in FIG. 6F, bit-vectors 682 and 683 are [000000] after the fourth phase.

FIG. 6Q and the pseudocode referenced by reference numbers 4.o-4.s corresponds to a fifth phase of the third iteration. At reference number 4.o, the data pattern stored as bit-vector 690 is read into the sensing circuitry 650 such that bit-vector 683 is [100010]. At reference number 4.p, an INVERT operation is performed on bit-vector 683 such that bit-vector 683 stores [011101] (e.g., the inverse of its previous data pattern). At reference number 4.q, an AND operation is performed on the bit-vector 683 (e.g., [011101]) and bit-vector 674-2 (e.g., [000111]), the result being retained in the sensing circuitry 650 such that bit-vector 683 is [000101]. The result of the AND operation (e.g., [000101]), which is stored as bit-vector 683, is ORed with the Temp Row 2 bit-vector 682 (e.g., [000000]), with the result (e.g., [000101]) being retained in sensing circuitry 650 as bit-vector 683. The result of the OR operation (e.g., [000101]) is copied to the cells storing bit-vector 674-2. As such, as shown in FIG. 6G, bit-vectors 674-2 and 683 are [000101] after the fifth phase.

FIG. 6Q shows the states of memory cells of array 630 after a third iteration of the "For" loop associated with reference number 4. After the third iteration of the "For" loop, the 0-bit from bit-vector 688-0 (e.g., [011] before the first iteration) is swapped with a 0-bit from bit-vector 688-1 (e.g., [001] before the first iteration) and the 1-bit from bit-vector 688-4 (e.g., [101] before the first iteration) is swapped with a 0-bit from bit-vector 688-5 (e.g., [010] before the first iteration).

More or less iterations of operations can be performed than those shown herein in examples with elements that have an element width that is different than an element width of three. For example, if Elements 688 had an element width of four instead of three, then four iterations of operations can be performed.

Furthermore, the swap operation can swap more than four elements (e.g., swap bit-vector 688-0 with bit-vector 688-1 and bit-vector 688-4 with bit-vector 688-5). For example, the swap operation can swap six elements, eight elements, ten elements, etc.

Embodiments however, are not limited to the order of the sequence of instructions in the pseudocode in this example. For example, a number of operations reference in reference numbers 4.c to 4.j can be performed before a number of operations reference in reference numbers 4.k to 4.q are performed.

Example functionality of the sensing circuitry 250 of FIG. 2A is described below and summarized in Table 1 below with respect to performing logical operations and initially storing a result in the sense amplifier 206. Initially storing the result of a particular logical operation in the primary latch of sense amplifier 206 can provide improved versatility as compared to previous approaches in which the result may initially reside in a secondary latch (e.g., accumulator) of a compute component 231, and then be subsequently transferred to the sense amplifier 206, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206 (e.g., without having to perform an additional operation to move the result from the compute component 231 (e.g., accumulator) to the sense amplifier 206) is advantageous because, for instance, the result can be written to a row (of the array of memory cells) or back into the accumulator without performing a precharge cycle (e.g., on the complementary data lines 205-1 (D) and/or 205-2 (D_)).

Figure 7:
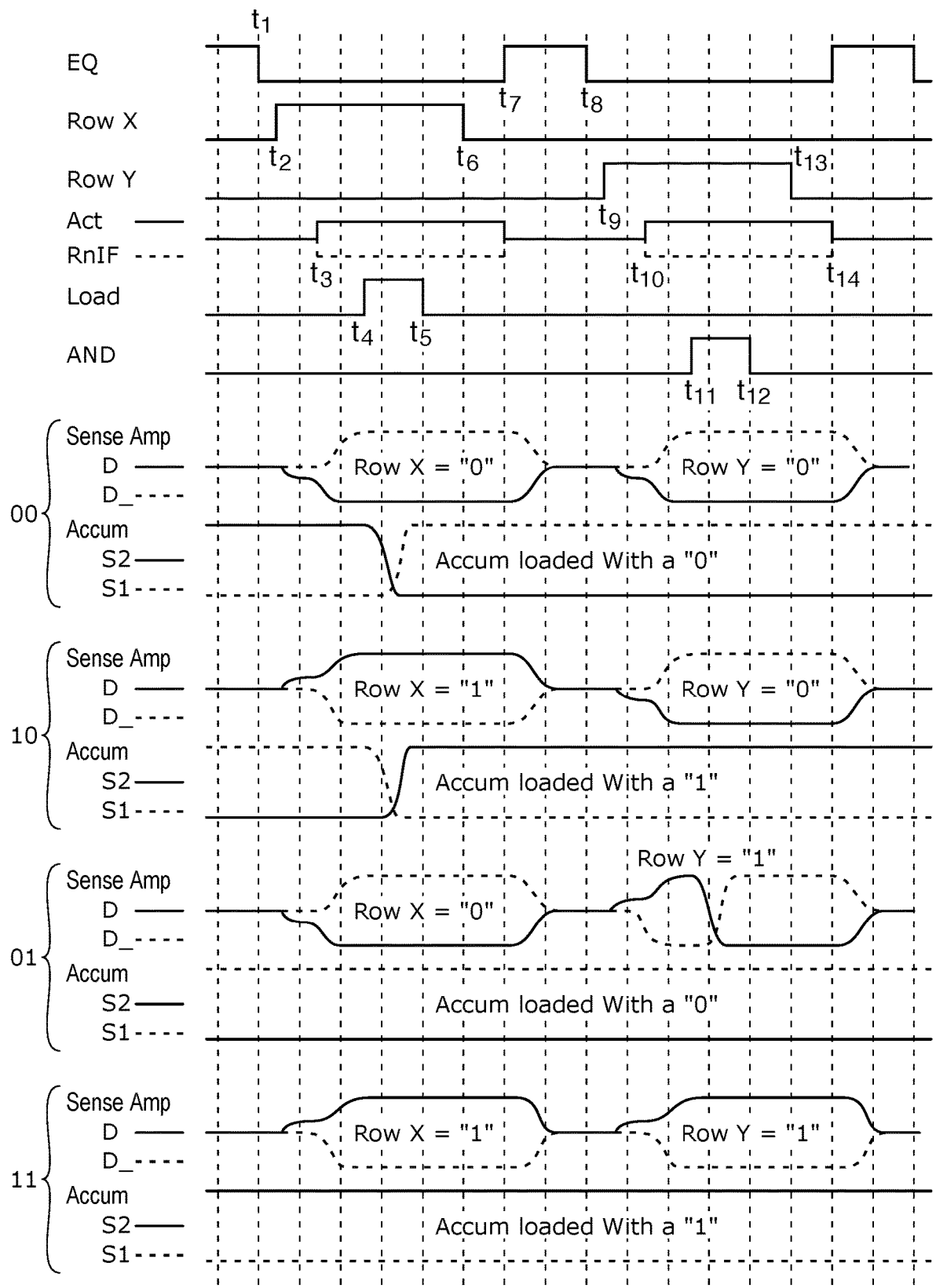
FIG. 7 illustrates a timing diagram associated with performing a number of logical operations using sensing circuitry in accordance with a number of embodiments of the present disclosure.

FIG. 7 illustrates a timing diagram associated with performing a number of logical operations using sensing circuitry in accordance with a number of embodiments of the present disclosure. FIG. 7 illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 7 illustrates a number of control signals associated with operating sensing circuitry (e.g., 250) to perform the AND logical operation. "EQ" corresponds to an equilibrate signal applied to the sense amp 206, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206, "LOAD" corresponds to a load control signal (e.g., LOAD/PASSD and LOAD/PASSDb shown in FIG. 2A), and "AND" corresponds to the AND control signal shown in FIG. 2A. FIG. 7 also illustrates the waveform diagrams showing the signals (e.g., voltage signals) on the digit lines D and D_ corresponding to sense amp 206 and on the nodes S1 and S2 corresponding to the compute component 231 (e.g., Accum) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:
Copy Row X into the Accumulator:
  Deactivate EQ
  Open Row X
  Fire Sense Amps (after which Row X data resides in the sense amps)
  Activate LOAD (sense amplifier data (Row X) is transferred to nodes S1 and S2 of the Accumulator and resides there dynamically)
  Deactivate LOAD
  Close Row X
  Precharge In the pseudo code above, "Deactivate EQ" indicates that an equilibration signal (EQ signal shown in FIG. 7) corresponding to the sense amplifier 206 is disabled at $t_1$ as shown in FIG. 7 (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 7. When the voltage signal applied to ROW X reaches the threshold voltage (Vt) of the access transistor (e.g., 202-2) corresponding to the selected cell, the access transistor turns on and couples the data line (e.g., 205-2 (D_)) to the selected cell (e.g., to capacitor 203-2) which creates a differential voltage signal between the data lines.

After Row X is enabled (e.g., activated), in the pseudo code above, "Fire Sense Amps" indicates that the sense amplifier 206 is enabled to set the primary latch and subsequently disabled. For example, as shown at $t_3$ in FIG. 7, the ACT positive control signal (e.g., 265 shown in FIG. 2B) goes high and the RnIF negative control signal (e.g., 228 shown in FIG. 2B) goes low, which amplifies the differential signal between 205-1 (D) and D_ 205-2, resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). The sensed data value is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and accumulator signals illustrated in FIG. 7 (e.g., one for each combination of Row X and Row Y data values) shows the behavior of signals on data lines D and D_. The Row X data value is stored in the primary latch of the sense amp. It should be noted that FIG. 2A shows that the memory cell including storage element 202-2, corresponding to Row X, is coupled to the complementary data line D_, while the memory cell including storage element 202-1, corresponding to Row Y, is coupled to data line D. However, as can be seen in FIG. 2A, the charge stored in the memory cell comprising access transistor 202-2 (corresponding to Row X) corresponding to a "0" data value causes the voltage on data line D_ (to which memory cell 202-2 is coupled) to go high and the charge stored in the memory cell comprising access transistor 202-2 corresponding to a "1" data value causes the voltage on data line D_ to go low, which is opposite correspondence between data states and charge stored in memory cell 202-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 7, causing load/pass transistors 218-1 and 218-2 to conduct. In this manner, activating the LOAD control signal enables the secondary latch in the accumulator of the compute component 231. The sensed data value stored in the sense amplifier 206 is transferred (e.g., copied) to the secondary latch. As shown for each of the four sets of possible sense amplifier and accumulator signals illustrated in FIG. 7, the behavior at inputs of the secondary latch of the accumulator indicates the secondary latch is loaded with the Row X data value. As shown in FIG. 7, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_), in the pseudo code above, "Deactivate LOAD" indicates that the LOAD control signal goes back low as shown at $t_5$ in FIG. 7 to cause the load/pass transistors 218-1 and 218-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 7, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 7 by the EQ signal going high at $t_7$. As shown in each of the four sets of possible sense amplifier and accumulator signals illustrated in FIG. 7 at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206 and the secondary latch of the compute component 231) and the second data value (stored in a memory cell coupled to Row Y 204-Y) includes performing particular steps which depend on the whether an AND or an OR is to be performed. Examples of pseudo code associated with "ANDing" and "ORing" the data value residing in the accumulator (e.g., the first data value stored in the memory cell coupled to Row X 204-X) and the second data value (e.g., the data value stored in the memory cell coupled to Row Y 204-Y) are summarized below. Example pseudo code associated with "ANDing" the data values can include:

Deactivate EQ
Open Row Y
Fire Sense Amps (after which Row Y data resides in the sense amps)
Close Row Y
The result of the logic operation, in the next operation, will be placed on the sense amp, which will overwrite any row that is active.
Even when Row Y is closed, the sense amplifier still contains the Row Y data value.
Activate AND
This results in the sense amplifier being written to the value of the function (e.g., Row X AND Row Y)
If the accumulator contains a "0" (i.e., a voltage corresponding to a "0" on node S2 and a voltage corresponding to a "1" on node S1), the sense amplifier data is written to a "0"
If the accumulator contains a "1" (i.e., a voltage corresponding to a "1" on node S2 and a voltage corresponding to a "0" on node S1), the sense amplifier data remains unchanged (Row Y data)
This operation leaves the data in the accumulator unchanged.
Deactivate AND
Precharge In the pseudo code above, "Deactivate EQ" indicates that an equilibration signal corresponding to the sense amplifier 206 is disabled (e.g., such that the complementary data lines 205-1 (D) and 205-2 (D_) are no longer shorted to $V_{DD}/2$), which is illustrated in FIG. 7 at $t_8$. After equilibration is disabled, a selected row (e.g., ROW Y) is enabled as indicated in the pseudo code above by "Open Row Y" and shown in FIG. 7 at $t_9$. When the voltage signal applied to ROW Y reaches the threshold voltage (Vt) of the access transistor (e.g., 202-1) corresponding to the selected cell, the access transistor turns on and couples the data line (e.g., D_ 205-1) to the selected cell (e.g., to capacitor 203-1) which creates a differential voltage signal between the data lines.

After Row Y is enabled, in the pseudo code above, "Fire Sense Amps" indicates that the sense amplifier 206 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). As shown at $t_{10}$ in FIG. 7, the ACT positive control signal (e.g., 265 shown in FIG. 2B) goes high and the RnIF negative control signal (e.g., 228 shown in FIG. 2B) goes low to fire the sense amps. The sensed data value from memory cell 202-1 is stored in the primary latch of sense amplifier 206, as previously described. The secondary latch still corresponds to the data value from memory cell 202-2 since the dynamic latch is unchanged.

After the second data value sensed from the memory cell coupled to Row Y is stored in the primary latch of sense amplifier 206, in the pseudo code above, "Close Row Y" indicates that the selected row (e.g., ROW Y) can be disabled if it is not desired to store the result of the AND logical operation back in the memory cell corresponding to Row Y. However, FIG. 7 shows that Row Y is left enabled such that the result of the logical operation can be stored back in the memory cell corresponding to Row Y. Isolating the memory cell corresponding to Row Y can be accomplished by the access transistor 202-1 turning off to decouple the selected cell from the data line 205-1 (D). After the selected Row Y is configured (e.g., to isolate the memory cell or not isolate the memory cell), "Activate AND" in the pseudo code above indicates that the AND control signal (e.g., the "AND" control signal coupled to the gate of transistor 207-1 shown in FIG. 2A) goes high as shown in FIG. 7 at $t_{11}$, causing pull-down transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231 and the second data value (e.g., Row Y) stored in the sense amplifier 206, if the dynamic latch of the compute component 231 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 209-1 to conduct thereby coupling the sense amplifier 206 to ground through transistor 209-1, pull-down transistor 207-1 and data line 205-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 206. This operation leaves the data value in the accumulator unchanged (e.g., from the Row X value).

If the secondary latch of the accumulator contains a "1" (e.g., from Row X), then the result of the AND operation depends on the data value stored in the sense amplifier 206 (e.g., from Row Y). The result of the AND operation should be a "1" if the data value stored in the sense amplifier 206 (e.g., from Row Y) is also a "1," but the result of the AND operation should be a "0" if the data value stored in the sense amplifier 206 (e.g., from Row Y) is also a "0." The sensing circuitry 250 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206 remains unchanged (e.g., from the Row Y data value) so the AND operation result is a "1" if the Row Y data value is a "1" and the AND operation result is a "0" if the Row Y data value is a "0". This operation leaves the data value in the accumulator unchanged (e.g., from the Row X value).

After the result of the AND operation is initially stored in the sense amplifier 206, "Deactivate AND" in the pseudo code above indicates that the AND control signal goes low as shown at $t_{12}$ in FIG. 7, causing pull-down transistor 207-1 to stop conducting to isolate the sense amplifier 206 (and data line 205-1 (D)) from ground. If not previously done, Row Y can be closed (as shown at $t_{13}$ in FIG. 7) and the sense amplifier can be disabled (as shown at $t_{14}$ in FIG. 7 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 7).

FIG. 7 shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S2 of the secondary latch of the compute component (e.g., 231 shown in FIG. 2A) for an AND logical operation involving each of the possible combination of operands (e.g., Row X/Row Y data values 00, 10, 01, and 11).

Although the timing diagrams illustrated in FIG. 7 and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 8:
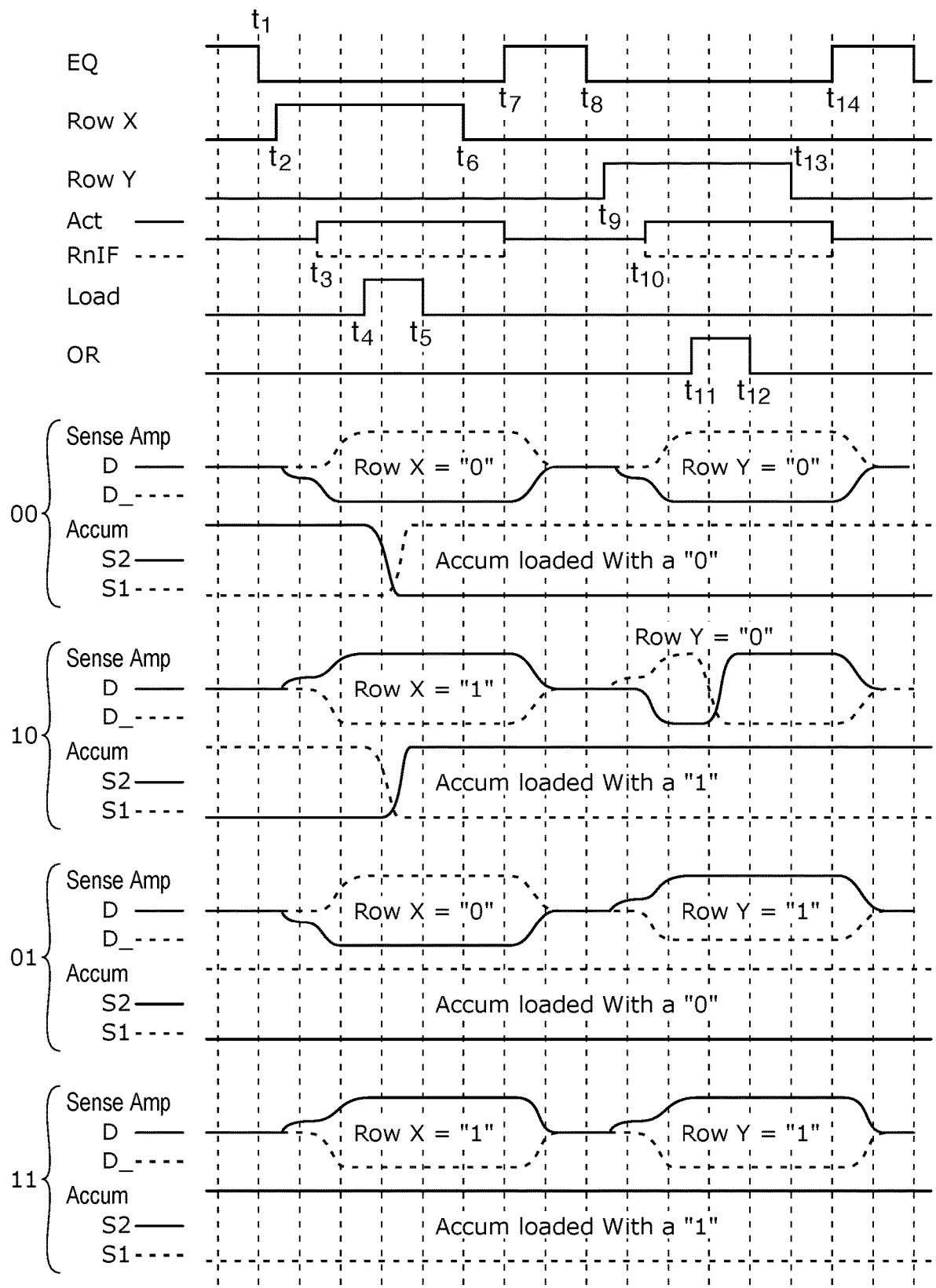
FIG. 8 illustrates a timing diagram associated with performing a number of logical operations using sensing circuitry in accordance with a number of embodiments of the present disclosure.

FIG. 8 illustrates a timing diagram associated with performing a number of logical operations using sensing circuitry in accordance with a number of embodiments of the present disclosure. FIG. 8 illustrates a timing diagram associated with initiating an OR logical operation after starting to load the second operand (e.g., Row Y data value) into the sense amplifier. FIG. 8 illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206 and the secondary latch of the compute component 231) and the second data value (stored in a memory cell coupled to Row Y 204-Y). The operations to load the Row X data into the sense amplifier and accumulator that were previously described with respect to times $t_1$-$t_7$ shown in FIG. 7 are not repeated with respect to FIG. 8. Example pseudo code associated with "ORing" the data values can include:

Deactivate EQ

Open Row Y

Fire Sense Amps (after which Row Y data resides in the sense amps)

Close Row Y

When Row Y is closed, the sense amplifier still contains the Row Y data value.

Activate OR

This results in the sense amplifier being written to the value of the function (e.g., Row X OR Row Y), which may overwrite the data value from Row Y previously stored in the sense amplifier as follows:

If the accumulator contains a "0" (i.e., a voltage corresponding to a "0" on node S2 and a voltage corresponding to a "1" on node S1), the sense amplifier data remains unchanged (Row Y data)

If the accumulator contains a "1" (i.e., a voltage corresponding to a "1" on node S2 and a voltage corresponding to a "0" on node S1), the sense amplifier data is written to a "1"

This operation leaves the data in the accumulator unchanged.

Deactivate OR

Precharge

The "Deactivate EQ" (shown at $t_8$ in FIG. 8), "Open Row Y" (shown at $t_9$ in FIG. 8), "Fire Sense Amps" (shown at $t_{10}$ in FIG. 8), and "Close Row Y" (shown at $t_{13}$ in FIG. 8, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 8, which causes pass transistor 207-2 to conduct. In this manner, activating the OR control signal causes the value of the function (e.g., Row X OR Row Y) to be written to the sense amp.

With the first data value (e.g., from Row X) stored in the secondary latch of the compute component 231 and the second data value (e.g., from Row Y) stored in the sense amplifier 206, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206 (e.g., from Row Y). The result of the OR operation should be a "1" if the data value stored in the sense amplifier 206 (e.g., from Row Y) is a "1," but the result of the OR operation should be a "0" if the data value stored in the sense amplifier 206 (e.g., from Row Y) is also a "0." The sensing circuitry 250 is configured such that if the dynamic latch of the accumulator contains a "0," with the voltage corresponding to a "0" on node S2, transistor 209-2 is off and does not conduct (and pull-down transistor 207-1 is also off since the AND control signal is not asserted) so the sense amplifier 206 is not coupled to ground (either side), and the data value previously stored in the sense amplifier 206 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does transistor 207-2 since the OR control signal is asserted), and the sense amplifier 206 input coupled to data line 205-2 (D_) is coupled to ground since the voltage corresponding to a "1" on node S2 causes transistor 209-2 to conduct along with transistor 207-2 (which also conducts since the OR control signal is asserted). In this manner, a "1" is initially stored in the sense amplifier 206 as a result of the OR operation when the secondary latch of the accumulator contains a "1" regardless of the data value previously stored in the sense amp. This operation leaves the data in the accumulator unchanged. FIG. 8 shows, in the alternative, the behavior of voltage signals on the data lines (e.g., 205-1 (D) and 205-2 (D_) shown in FIG. 2A) coupled to the sense amplifier (e.g., 206 shown in FIG. 2A) and the behavior of voltage signals on nodes S1 and S2 of the secondary latch of the compute component 231 for an OR logical operation involving each of the possible combination of operands (e.g., Row X/Row Y data values 00, 10, 01, and 11).

After the result of the OR operation is initially stored in the sense amplifier 206, "Deactivate OR" in the pseudo code above indicates that the OR control signal goes low as shown at $t_{12}$ in FIG. 8, causing transistor 207-2 to stop conducting to isolate the sense amplifier 206 (and data line D_ 205-2) from ground. If not previously done, Row Y can be closed (as shown at $t_{13}$ in FIG. 8) and the sense amplifier can be disabled (as shown at $t_{14}$ in FIG. 8 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 8.

The sensing circuitry 250 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ANDinv control signal causes transistor 214-1 to conduct and activating the ORinv control signal causes transistor 214-2 to conduct. In each case, asserting the appropriate inverted control signal can flip the sense amplifier and cause the result initially stored in the sense amplifier 206 to be that of the AND operation using inverted Row X and true Row Y data values or that of the OR operation using the inverted Row X and true Row Y data values. A true or complement version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206. As previously mentioned, activating the ANDinv control signal causes transistor 214-1 to conduct and activating the ORinv control signal causes transistor 214-2 to conduct. The ORinv and/or ANDinv control signals are used in implementing the NOT function, as described further below:

Copy Row X into the Accumulator
Deactivate EQ
Open Row X
Fire Sense Amps (after which Row X data resides in the sense amps)
Activate LOAD (sense amplifier data (Row X) is transferred to nodes S1 and S2 of the Accumulator and resides there dynamically
Deactivate LOAD
Activate ANDinv and ORinv (which puts the complement data value on the data lines)
  This results in the data value in the sense amplifier being inverted (e.g., the sense amplifier latch is flipped)
  This operation leaves the data in the accumulator unchanged
Deactivate ANDinv and ORinv
Close Row X
Precharge The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and Precharging after the Row X data is loaded into the sense amplifier 206 and copied into the dynamic latch, a complement version of the data value in the dynamic latch of the accumulator can be placed on the data line and thus transferred to the sense amplifier 206 by enabling (e.g., causing transistor to conduct) and disabling the invert transistors (e.g., ANDinv and ORinv). This results in the sense amplifier 206 being flipped from the true data value that was previously stored in the sense amplifier to a complement data value (e.g., inverted data value) stored in the sense amp. For example, a true or complement version of the data value in the accumulator can be transferred to the sense amplifier by activating and deactivating ANDinv and ORinv. This operation leaves the data in the accumulator unchanged.

Because the sensing circuitry 250 shown in FIG. 2A initially stores the result of the AND, OR, and NOT logical operations in the sense amplifier 206 (e.g., on the sense amplifier nodes), these logical operation results can be communicated easily and quickly to any enabled row, any row activated after the logical operation is complete, and/or into the secondary latch of the compute component 231. The sense amplifier 206 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206 fires.

When performing logical operations in this manner, the sense amplifier 206 can be pre-seeded with a data value from the dynamic latch of the accumulator to reduce overall current utilized because the sense amps 206 are not at full rail voltages (e.g., supply voltage or ground/reference voltage) when accumulator function is copied to the sense amplifier 206. An operation sequence with a pre-seeded sense amplifier 206 either forces one of the data lines to the reference voltage (leaving the complementary data line at $V_{DD}/2$, or leaves the complementary data lines unchanged. The sense amplifier 206 pulls the respective data lines to full rails when the sense amplifier 206 fires. Using this sequence of operations will overwrite data in an enabled row.

A SHIFT operation can be accomplished by multiplexing ("muxing") two neighboring data line complementary pairs using a traditional DRAM isolation (ISO) scheme. According to embodiments of the present disclosure, the shift circuitry 223 can be used for shifting data values stored in memory cells coupled to a particular pair of complementary data lines to the sensing circuitry 250 (e.g., sense amplifier 206) corresponding to a different pair of complementary data lines (e.g., such as a sense amplifier 206 corresponding to a left or right adjacent pair of complementary data lines. As used herein, a sense amplifier 206 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized as follows:

Deactivate Norm and Activate Shift
Deactivate EQ
Open Row X
Fire Sense Amps (after which shifted Row X data resides in the sense amps)
Activate Norm and Deactivate Shift
Close Row X
Precharge In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above. Operations to shift left Row X can be summarized as follows:

Activate Norm and Deactivate Shift
Deactivate EQ
Open Row X
Fire Sense Amps (after which Row X data resides in the sense amps)
Deactivate Norm and Activate Shift
Sense amplifier data (shifted left Row X) is transferred to Row X
Close Row X
Precharge In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 250 is stored in the sense amplifier 206.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. A potential advantage of certain apparatuses and methods described herein can be the cumulative speed that can be achieved by an entire bank of data being computed in parallel without necessarily transferring data out of the memory array (e.g., DRAM) or firing a column decode. For example, data transfer time can be reduced and/or eliminated. For example, apparatuses of the present disclosure can perform ANDS or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Figure 9:
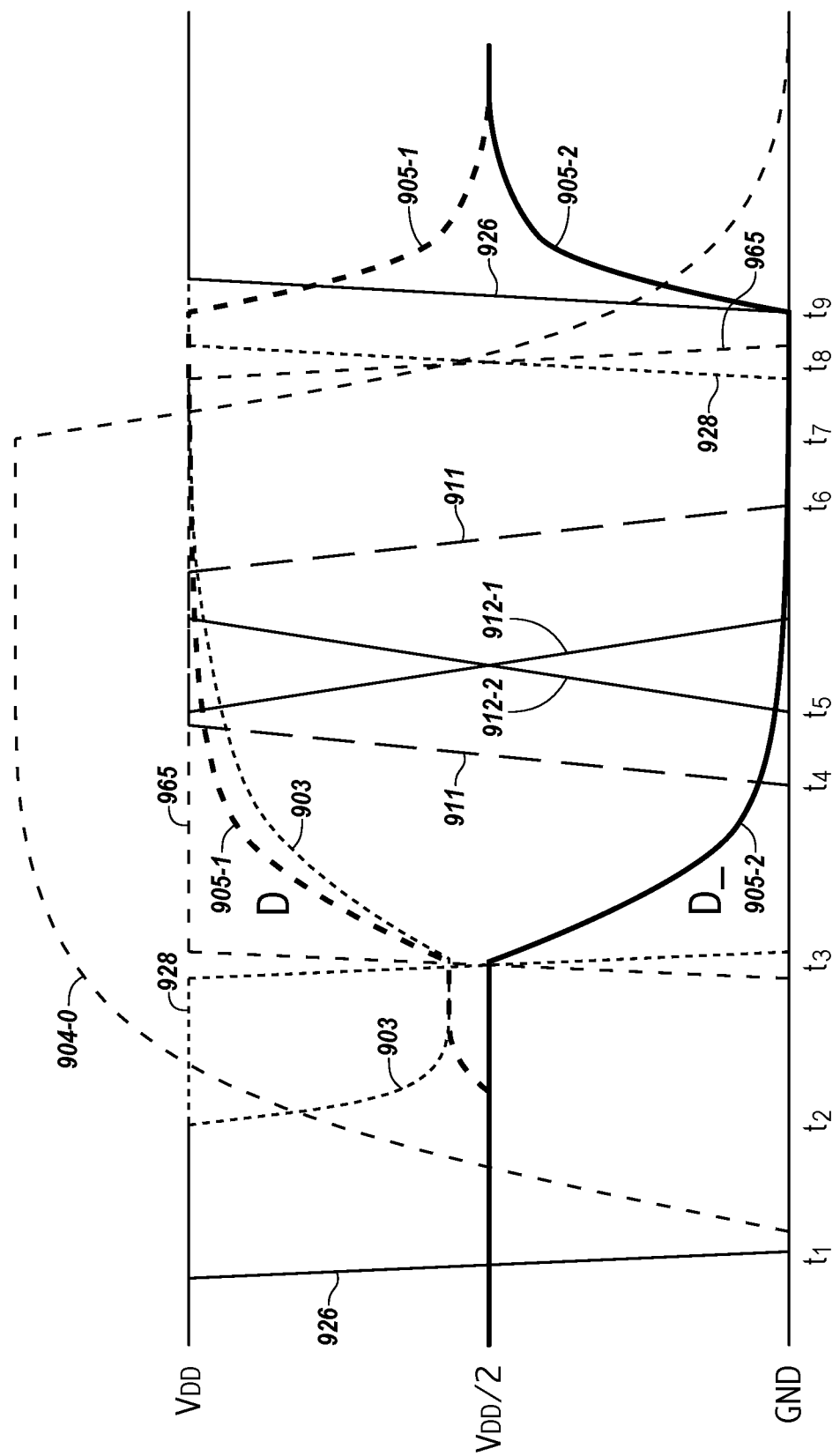
FIG. 9 illustrates a timing diagram associated with performing a number of logical operations using sensing circuitry in accordance with a number of embodiments of the present disclosure.

FIG. 9 illustrates a timing diagram associated with performing a number of logical operations using sensing circuitry in accordance with a number of embodiments of the present disclosure. The functionality of the sensing circuitry 250 of FIG. 2A is described below with respect to performing logical operations and initially storing a result in the compute component 231 (e.g., secondary latch of the accumulator). The timing diagram shown in FIG. 9 illustrates signals (e.g., voltage signals) associated with performing a first operation phase of a logical operation (e.g., an R-input logical operation) using the sensing circuitry illustrated in FIG. 2A. The first operation phase described with respect to FIG. 9 can be a first operation phase of an AND, NAND, OR, or NOR operation, for instance. Performing the operation phase illustrated in FIG. 9 can involve consuming significantly less energy (e.g., about half) than previous processing approaches that may involve providing a full swing between voltage rails (e.g., between a supply and ground).

In the example illustrated in FIG. 9, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 9 do not necessarily represent a same absolute or relative time as similar time references in other timing diagrams.

At time $t_1$, the equilibration signal 926 is deactivated, and then a selected row is enabled (e.g., the row corresponding to a memory cell whose data value is to be sensed and used as a first input). Signal 904-0 represents the voltage signal applied to the selected row (e.g., Row Y 204-Y shown in FIG. 2A). When row signal 904-0 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 shown in FIG. 2A if the cell is a 1T1C DRAM cell), which creates a differential voltage signal between the data lines D and D_ (e.g., as indicated by signals 905-1 and 905-2 on the data lines, respectively) between times $t_2$ and $t_3$. The voltage of the selected cell is represented by signal 903. Due to conservation of energy, creating the differential signal between data lines D and D_ (e.g., by coupling the cell to data line D) does not consume energy, since the energy associated with enabling/disabling the row signal 904-0 can be amortized over the plurality of memory cells coupled to the row.

At time $t_3$, the sense amplifier (e.g., 206 shown in FIG. 2A) is activated (e.g., a positive control signal 965 (e.g., corresponding to ACT 265 shown in FIG. 2B) goes high and the negative control signal 928 (e.g., corresponding to RnIF 228 shown in FIG. 2B) goes low), which amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$. FIG. 9 shows, in example, the data line voltages 905-1 and 905-2 that correspond to a logic "1" being on data line D.

According to some embodiments, the primary latch of sense amplifier 206 can be coupled to the complementary data lines D and D_ through respective pass transistors (not shown in FIG. 2B but in a similar configuration as the manner in which latch 264 is coupled to the data lines D and D_ through load/pass transistors 218-1 and 218-2 shown in FIG. 2A). The Passd control signal 911 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 911 applied to control lines coupled to the respective gates of the pass transistors going high). At time $t_5$, the accumulator negative control signal 912-1 (e.g., Accumb) and the accumulator positive control signal 912-2 (e.g., Accum) are activated via respective control lines 212-1 and 212-2 shown in FIG. 2A. As described below, the accumulator control signals ACCUMB 912-1 and ACCUM 912-2 may remain activated for subsequent operation phases. As such, in this example, activating the control signals ACCUMB 912-1 and ACCUM 912-2 enables the secondary latch (e.g., accumulator) of compute component 231-6 shown in FIG. 2A. The sensed data value stored in sense amplifier 206 is transferred (e.g., copied) to the secondary latch, including the dynamic latch and latch 264.

At time $t_6$, the Passd control signal 911 (and the Passdb control signal) goes low thereby turning off the pass transistors (if present). However, since the accumulator control signals ACCUMB 912-1 and ACCUM 912-2 remain activated, an accumulated result is stored (e.g., latched) in the secondary latches (e.g., accumulator). At time $t_7$, the row signal 904-0 is deactivated, and the array sense amps are disabled at time $t_8$ (e.g., sense amplifier control signals 928 and 965 are deactivated).

At time $t_9$, the data lines D and D_ are equilibrated (e.g., equilibration signal 926 is activated), as illustrated by data line voltage signals 905-1 and 905-2 moving from their respective rail values to the equilibration voltage ($V_{DD}/2$). The equilibration consumes little energy due to the law of conservation of energy. As described below in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 10:
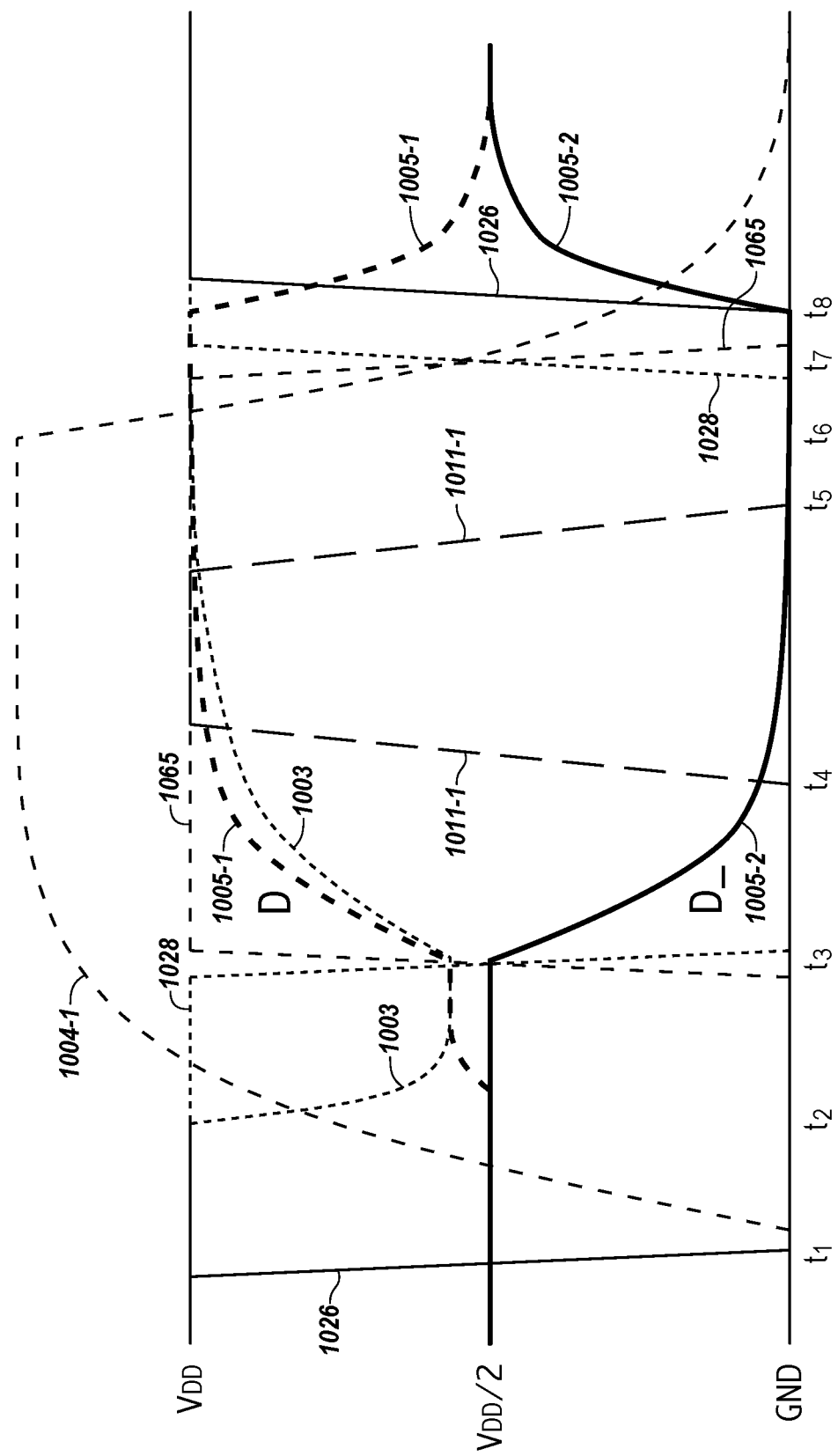
FIG. 10 illustrates a timing diagram associated with performing a number of logical operations using sensing circuitry in accordance with a number of embodiments of the present disclosure.
Figure 11:
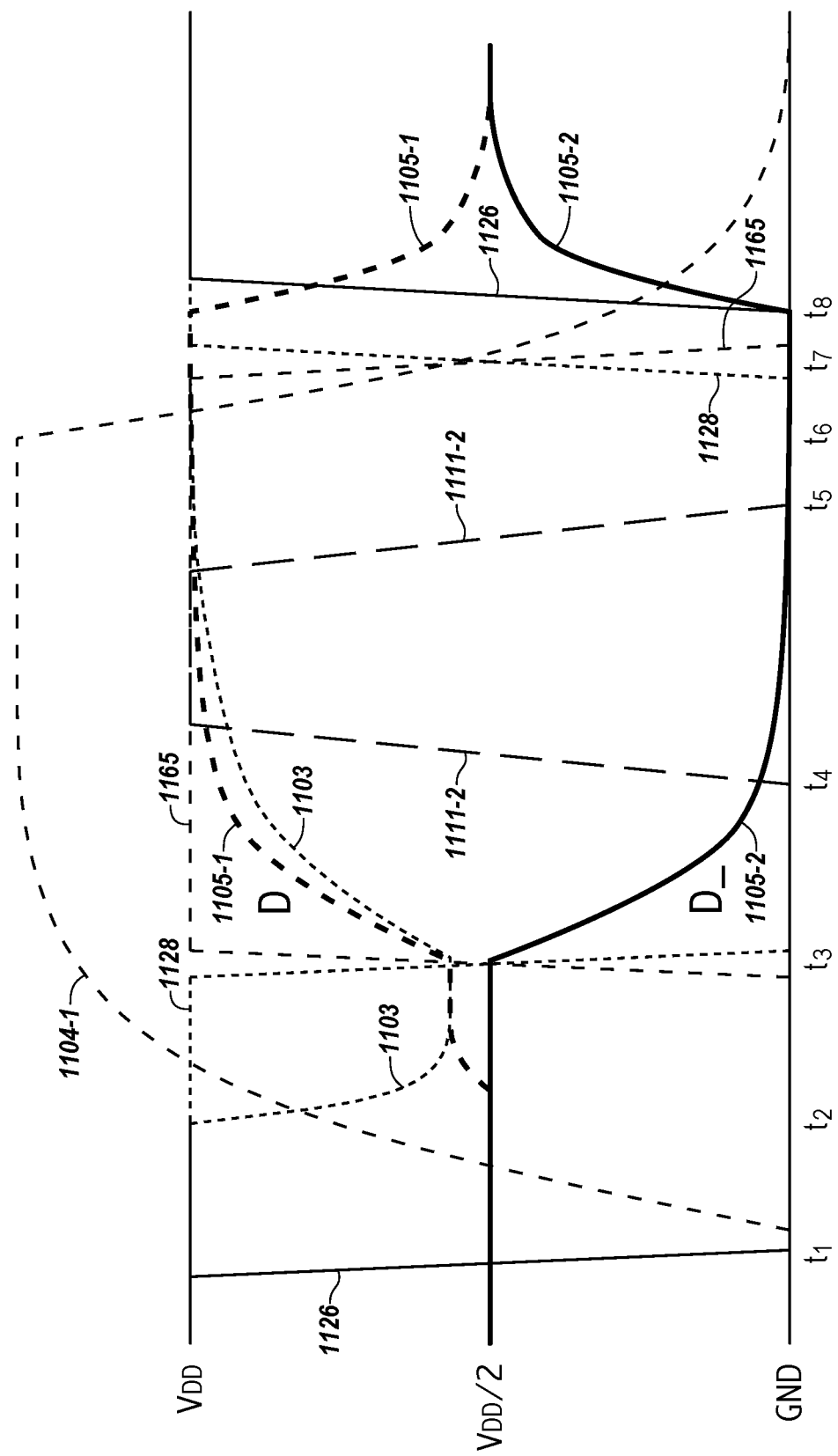
FIG. 11 illustrate a timing diagram associated with performing a number of logical operations using sensing circuitry in accordance with a number of embodiments of the present disclosure.

FIGS. 10 and 11 respectively illustrate timing diagrams associated with performing a number of logical operations using sensing circuitry in accordance with a number of embodiments of the present disclosure. Timing diagrams shown in FIGS. 10 and 11 illustrate signals (e.g., voltage signals) associated with performing a number of intermediate operation phases of a logical operation (e.g., an R-input logical operation). For instance, timing diagram shown in FIG. 10 corresponds to a number of intermediate operation phases of an R-input NAND operation or an R-input AND operation, and timing diagram shown in FIG. 11 corresponds to a number of intermediate operation phases of an R-input NOR operation or an R-input OR operation. For example, performing an AND or NAND operation can include performing the operation phase shown in FIG. 10 one or more times subsequent to an initial operation phase such as that described with respect to FIG. 9. Similarly, performing an OR or NOR operation can include performing the operation phase shown and described with respect to FIG. 11 one or more times subsequent to an initial operation phase such as that described with respect to FIG. 9.

As shown in the timing diagrams illustrated in FIGS. 10 and 11, at time $t_1$, equilibration is disabled (e.g., the equilibration signal 1026/1126 is deactivated), and then a selected row is enabled (e.g., the row corresponding to a memory cell whose data value is to be sensed and used as an input such as a second input, third input, etc.). Signal 1004-1/1104-1 represents the voltage signal applied to the selected row (e.g., Row Y 204-Y shown in FIG. 2A). When row signal 1004-1 reaches the threshold voltage (Vt) of the access transistor (e.g., 202-1 shown in FIG. 2A) corresponding to the selected cell, the access transistor turns on and couples the data line D to the selected memory cell (e.g., to the capacitor 203-1 if the cell is a 1T1C DRAM cell), which creates a differential voltage signal between the data lines D and D_ (e.g., as indicated by signals 1005-1/1105-1 and 1005-2/1105-2, respectively) between times $t_2$ and $t_3$. The voltage of the selected cell is represented by signal 1003/1103. Due to conservation of energy, creating the differential signal between D and D_ (e.g., by coupling the cell to data line D) does not consume energy, since the energy associated with activating/deactivating the row signal 1004-1/1104-1 can be amortized over the plurality of memory cells coupled to the row.

At time $t_3$, the sense amplifier (e.g., 206 shown in FIG. 2A) is enabled (e.g., a positive control signal 1065/1165 (e.g., corresponding to ACT 233 shown in FIG. 2B) goes high, and the negative control signal 1028/1128 (e.g., RnIF 228 shown in FIG. 2B) goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_), such that the sensed data value is stored in the primary latch of sense amplifier 206. The primary energy consumption occurs in charging the data line D (205-1) from the equilibration voltage $V_{DD}/2$ to the rail voltage $V_{DD}$.

As shown in timing diagrams illustrated in FIGS. 10 and 11, at time $t_4$ (e.g., after the selected cell is sensed), only one of control signals 1011-1 (Passd) shown in FIGS. 10 and 1111-2 (Passdb) shown in FIG. 11 is activated (e.g., only one of pass transistors (if present) is enabled), depending on the particular logic operation. For example, since the timing diagram illustrated in FIG. 10 corresponds to an intermediate phase of a NAND or AND operation, control signal 1011-1 (Passd) is activated at time t4 to turn on the pass transistor coupling the primary latch to data line D and the Passdb control signal remains deactivated leaving the pass transistor coupling the primary latch to data line D_ turned off. Conversely, since the timing diagram illustrated in FIG. 11 corresponds to an intermediate phase of a NOR or OR operation, control signal 1111-2 (Passdb) is activated at time t4 to turn on the pass transistor coupling the primary latch to data line D_ and control signal Passd remains deactivated leaving the pass transistor coupling the primary latch to data line D turned off. Recall from above that the accumulator control signals 912-1 (Accumb) and 912-2 (Accum) were activated during the initial operation phase described with respect to FIG. 9, and they remain activated during the intermediate operation phase(s).

Since the accumulator was previously enabled, activating only Passd (1011-1 as shown in FIG. 10) results in accumulating the data value corresponding to the voltage signal 1005-1 shown in FIG. 10 corresponding to data line D. Similarly, activating only Passdb (1111-2 as shown in FIG. 11) results in accumulating the data value corresponding to the voltage signal 1105-2 corresponding to data line D_. For instance, in an example AND/NAND operation shown in the timing diagram illustrated in FIG. 10 in which only Passd (1011-1) is activated, if the data value stored in the second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 11 in which only Passdb 1111-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 1105-2 on D_ is setting the true data value of the accumulator.

At the conclusion of an intermediate operation phase such as that shown in FIG. 10 or 11, the Passd signal 1011-1 (e.g., for AND/NAND) or the Passdb signal 1111-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 10 or 11 can be repeated in order to accumulate results from a number of additional rows. As an example, the sequence of timing diagram illustrated in FIGS. 10 and/or 11 can be performed a subsequent (e.g., second) time for a third memory cell, a subsequent (e.g., third) time for a fourth memory cell, etc. For instance, for a 10-input NOR operation, the intermediate phase shown in FIG. 11 can occur 9 times to provide 9 inputs of the 10-input logical operation, with the tenth input being determined during the initial operation phase (e.g., as described with respect to FIG. 9).

Figure 12:
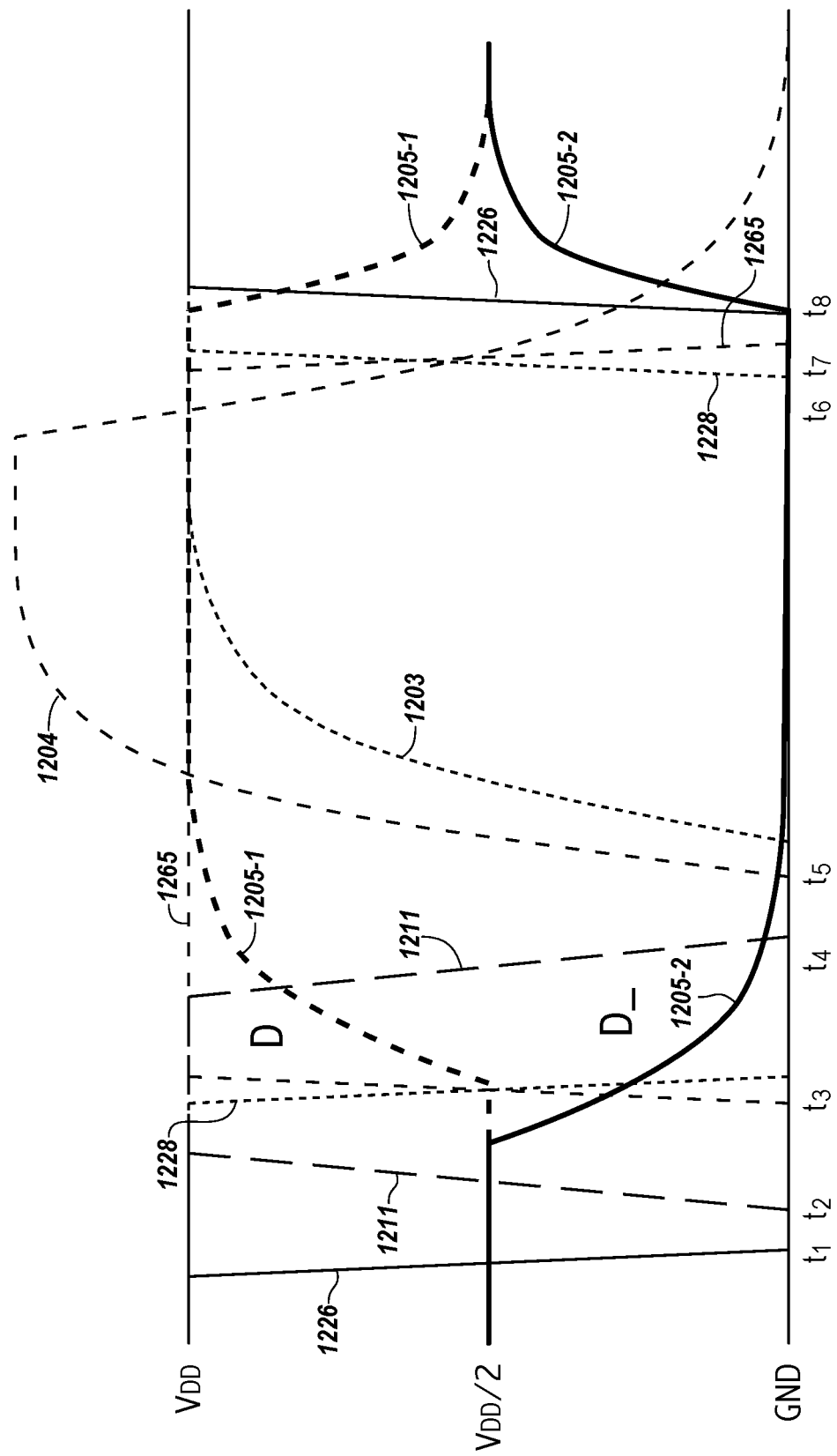
FIG. 12 illustrates a timing diagram associated with performing a number of logical operations using sensing circuitry in accordance with a number of embodiments of the present disclosure.

FIG. 12 illustrates a timing diagram associated with performing a number of logical operations using sensing circuitry in accordance with a number of embodiments of the present disclosure. The timing diagram illustrated in FIG. 12 shows signals (e.g., voltage signals) associated with performing a last operation phase of a logical operation (e.g., an R-input logical operation). For instance, the timing diagram illustrated in FIG. 12 corresponds to a last operation phase of an R-input AND operation or an R-input OR operation.

For example, performing a last operation phase of an R-input can include performing the operation phase shown in FIG. 12 subsequent to a number of iterations of the intermediate operation phase(s) described in association with FIGS. 10 and/or 11. Table 2 shown below indicates the Figures corresponding to the sequence of operation phases associated with performing a number of R-input logical operations in accordance with a number of embodiments described herein.

TABLE 2

| Operation | FIG. 9 | FIG. 10 | FIG. 11 | FIG. 12 |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R−1 iterations for an AND operation in the sense amplifier, then inverting the sense amplifier before conducting the last operation phase to store the result (described below). A NOR operation can be implemented, for example, by storing the result of the R−1 iterations for an OR operation in the sense amplifier, then inverting the sense amplifier before conducting the last operation phase to store the result (described below).

The last operation phase illustrated in the timing diagram of FIG. 12 is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 12, at time equilibration is disabled (e.g., the equilibration signal 1226 is deactivated) such that data lines D and D_ are floating. At time t2, the Passd control signal 1211 (and Passdb signal) is activated for an AND or OR operation.

Activating the Passd control signal 1211 (and Passdb signal) (e.g., in association with an AND or OR operation) transfers the accumulated output stored in the secondary latch of compute component 231-6 shown in FIG. 2A to the primary latch of sense amplifier 206. For instance, for an AND operation, if any of the memory cells sensed in the prior operation phases (e.g., the first operation phase illustrated in FIG. 9 and one or more iterations of the intermediate operation phase illustrated in FIG. 10) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206 is then enabled (e.g., a positive control signal 1265 (e.g., corresponding to ACT 265 shown in FIG. 2B) goes high and the negative control signal 1228 (e.g., corresponding to RnIF 228 shown in FIG. 2B) goes low), which amplifies the differential signal between data lines D and D_such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 9 and one or more iterations of the intermediate operation phase shown in FIG. 11) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time $t_3$, the primary latch of sense amplifier 206 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0".

The result of the R-input AND or OR logical operations can then be stored back to a memory cell of array 230 shown in FIG. 2A. In the examples shown in FIG. 12, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 12 shows, at time t3, the positive control signal 1265 and the negative control signal 1228 being activated (e.g., signal 1265 goes high and signal 1228 goes low) to enable the sense amplifier 206 shown in FIG. 2A. At time t4 the Passd control signal 1211 (and Passdb signal) that was activated at time t2 is deactivated. Embodiments are not limited to this example. For instance, in a number of embodiments, the sense amplifier 206 shown in FIG. 2A may be enabled subsequent to time t4 (e.g., after the Passd control signal 1211 (and Passdb signal) are deactivated).

As shown in FIG. 12, at time t5, a selected row is enabled (e.g., by row activation signal 1204 going high, which drives the capacitor of the selected cell to the voltage corresponding to the logic value stored in the accumulator. At time t6 the selected row is disabled. At time t7 the sense amplifier 206 shown in FIG. 2A is disabled (e.g., positive control signal 1228 and negative control signal 1265 are deactivated), and at time t8 equilibration occurs (e.g., signal 1226 is activated and the voltages on the complementary data lines 1205-1 (D) and 1205-2 (D_) are brought to the equilibration voltage).

Although the example of performing a last operation phase of an R-input was discussed above with respect to FIG. 12 for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

Figure 13A:
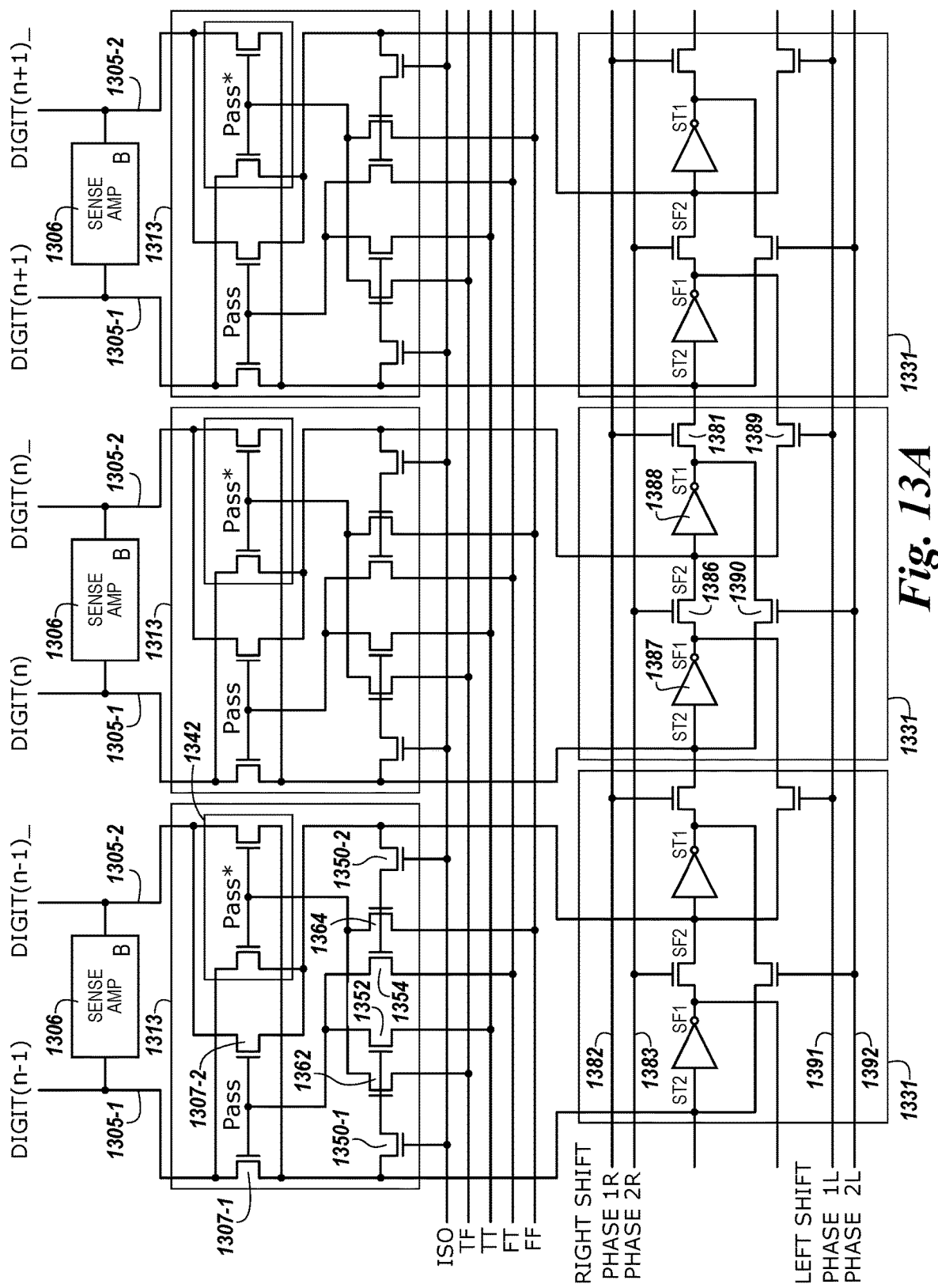
FIG. 13A is a schematic diagram illustrating sensing circuitry in accordance with a number of embodiments of the present disclosure.

FIG. 13A is a schematic diagram illustrating sensing circuitry capable of implementing a number of logical operations in accordance with a number of embodiments of the present disclosure. FIG. 13A shows a number of sense amplifiers 1306 coupled to respective pairs of complementary sense lines 1305-1 and 1305-2, and a corresponding number of compute components 1331 coupled to the sense amplifiers 1306 via pass gates 1307-1 and 1307-2. The sense amplifiers 1306 and compute components 1331 shown in FIG. 13A can correspond to sensing circuitry 150 shown in FIG. 1, for example. The sensing circuitry shown in FIG. 13A includes logical operation selection logic 1313, which can be operated as described further below.

Although not shown, memory cells (e.g., 303 in FIG. 3) are coupled to the pairs of complementary sense lines 1305-1 and 1305-2 (e.g., columns). The memory cells can be, for example, 1T1C DRAM cells each comprising a storage element (e.g., capacitor) and an access device (e.g., transistor). In a number of embodiments, the memory cells may be destructive read memory cells (e.g., reading the data stored in the cell destroys the data such that the data originally stored in the cell is refreshed after being read). The cells of the memory array can be arranged in rows coupled by word lines and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 1305-1 (D) and 1305-2 (D_) respectively. Although only three pairs of complementary data lines (e.g., three columns) are shown in FIG. 13A, embodiments of the present disclosure are not so limited, and an array of memory cells can include additional columns of memory cells and/or data lines (e.g., 4,096, 8,192, 16,384, etc.).

As shown in FIG. 13A, the sensing circuitry can comprise a sense amplifier 1306, a compute component 1331, and logical operation selection logic 1313 corresponding to respective columns of memory cells (e.g., coupled to respective pairs of complementary data lines). The sense amplifier 1306 can comprise, for example, a cross coupled latch, which can be referred to herein as a primary latch. The sense amplifiers 1306 can be configured, for example, as described with respect to FIG. 13B.

In the example illustrated in FIG. 13A, the circuitry corresponding to compute components 1331 is configured as a loadable shift register. For instance, each compute component 1331 comprises a latch, which may be referred to herein as a secondary latch, and an additional number of transistors operable to transfer (e.g., shift) data values right and/or left (e.g., to a latch of an adjacent compute component 1331). As described further herein, in a number of embodiments, the latch of the compute component 1331 can serve as an accumulator. As such, the compute component 1331 can operate as and/or may be referred to herein as an accumulator.

The gates of the pass gates 1307-1 and 1307-2 can be controlled by a logical operation selection logic signal, Pass. For example, an output of the logical operation selection logic 1313 can be coupled to the gates of the pass gates 1307-1 and 1307-2, as shown in FIG. 13A.

The sensing circuitry shown in FIG. 13A also shows logical operation selection logic 1313 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pairs of complementary sense lines 1305-1 and 1305-2 when the isolation transistors (e.g., 1350-1 and 1350-2) are enabled via the ISO control signal being asserted.

According to various embodiments, the logical operation selection logic 1313 can include four logic selection transistors: logic selection transistor 1362 coupled between the gates of the swap transistors 1342 and a TF signal control line, logic selection transistor 1352 coupled between the gates of the pass gates 1307-1 and 1307-2 and a TT signal control line, logic selection transistor 1354 coupled between the gates of the pass gates 1307-1 and 1307-2 and a FT signal control line, and logic selection transistor 1364 coupled between the gates of the swap transistors 1342 and a FF signal control line. Gates of logic selection transistors 1362 and 1352 are coupled to the true sense line through isolation transistor 1350-1 (having a gate coupled to an ISO signal control line). Gates of logic selection transistors 1364 and 1354 are coupled to the complementary sense line through isolation transistor 1350-2 (also having a gate coupled to an ISO signal control line).

Data values present on the pair of complementary sense lines 1305-1 and 1305-2 can be loaded into the compute component 1331 via the pass gates 1307-1 and 1307-2. When the pass gates 1307-1 and 1307-2 are OPEN (e.g., conducting), data values on the pair of complementary sense lines 1305-1 and 1305-2 are passed to the compute component 1331 and thereby loaded into the loadable shift register. The data values on the pair of complementary sense lines 1305-1 and 1305-2 can be the data value stored in the sense amplifier 1306 when the sense amplifier is enabled (e.g., fired). The logical operation selection logic signal, Pass, is activated to OPEN (e.g., turn on) the pass gates 1307-1 and 1307-2.

The ISO, TF, TT, FT, and FF control signals can operate to select a logical operation to implement based on the data value ("B") in the sense amplifier 1306 and the data value ("A") in the compute component 1331 (e.g., as used herein, the data value stored in a latch of a sense amplifier is referred to as a "B" data value, and the data value stored in a latch of a compute component is referred to as an "A" data value). In particular, the ISO, TF, TT, FT, and FF control signals are configured to select the logical operation (e.g., function) to implement independent from the data value present on the pair of complementary sense lines 1305-1 and 1305-2 (although the result of the implemented logical operation can be dependent on the data value present on the pair of complementary sense lines 1305-1 and 1305-2. For example, the ISO, TF, TT, FT, and FF control signals select the logical operation to implement directly since the data value present on the pair of complementary sense lines 1305-1 and 1305-2 is not passed through logic to operate the gates of the pass gates 1307-1 and 1307-2.

Additionally, FIG. 13A shows swap transistors 1342 configured to swap the orientation of the pair of complementary sense lines 1305-1 and 1305-2 between the sense amplifier 1306 and the compute component 1331. For instance, when the swap transistors 1342 are OPEN (e.g., turned on), data values on the pair of complementary sense lines 1305-1 and 1305-2 on the sense amplifier 1306 side of the swap transistors 1342 are oppositely-coupled to the pair of complementary sense lines 1305-1 and 1305-2 on the compute component 1331 side of the swap transistors 1342, and thereby loaded into the loadable shift register of the compute component 1331 in a complementary manner.

As an example, the logical operation selection logic signal Pass can be activated (e.g., high) to OPEN (e.g., turn on) the pass gates 1307-1 and 1307-2 when the ISO control signal line is activated and either the TT control signal is activated (e.g., high) with the data value on the true sense line being "1" or the FT control signal is activated (e.g., high) with the data value on the complement sense line being "1."

The data value on the true sense line being a "1" OPENs logic selection transistors 1352 and 1362. The data value on the complementary sense line being a "1" OPENs logic selection transistors 1354 and 1364. If the ISO control signal or either the respective TT/FT control signal or the data value on the corresponding sense line (e.g., sense line to which the gate of the particular logic selection transistor is coupled) is not high, then the pass gates 1307-1 and 1307-2 will not be OPENed by a particular logic selection transistor.

The logical operation selection logic signal Pass* can be activated (e.g., high) to OPEN (e.g., turn on) the swap transistors 1342 when the ISO control signal line is activated and either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 1342 will not be OPENed by a particular logic selection transistor.

The sensing circuitry illustrated in FIG. 13A is configured to select one of a plurality of logical operations to implement directly from the four logic selection control signals (e.g., logical operation selection is not dependent on the data value present on the pair of complementary sense lines). Some combinations of the logic selection control signals can cause both the pass gates 1307-1 and 1307-2 and swap transistors 1342 to be OPEN (e.g., conducting) at the same time, which shorts the pair of complementary sense lines 1305-1 and 1305-2 together. According to a number of embodiments of the present disclosure, the logical operations which can be implemented by the sensing circuitry illustrated in FIG. 13A can be the logical operations summarized in the logic tables shown in FIG. 13B.

Although not shown in FIG. 13A, each column of memory cells can be coupled to a column decode line that can be activated to transfer, via a local I/O line, a data value from a corresponding sense amplifier 1306 and/or compute component 1331 to a control component external to the array such as an external processing resource (e.g., host processor and/or other functional unit circuitry). The column decode line can be coupled to a column decoder. However, as described herein, in a number of embodiments, data need not be transferred via such I/O lines to perform logical operations in accordance with embodiments of the present disclosure. In a number of embodiments, shift circuitry can be operated in conjunction with sense amplifiers 1306 and compute components 1331 to perform logical operations without transferring data to a control component external to the array, for instance. As used herein, transferring data, which may also be referred to as moving data is an inclusive term that can include, for example, copying data from a source location to a destination location and/or moving data from a source location to a destination location without necessarily maintaining a copy of the data at the source location.

As noted above, the compute components 1331 can comprise a loadable shift register. In this example, each compute component 1331 is coupled to a corresponding pair of complementary data lines 1305-1/1305-2, with a node ST2 being coupled to the particular data line (e.g., DIGIT(n)) communicating a "true" data value and with node SF2 being coupled to the corresponding complementary data line (e.g., DIGIT(n)_) communicating the complementary data value (e.g., "false" data value).

In this example, the loadable shift register comprises a first right-shift transistor 1381 of a particular compute component 1331 having a gate coupled to a first right-shift control line 1382 (e.g., PHASE 1R), and a second right-shift transistor 1386 of the particular compute component 231 having a gate coupled to a second right-shift control line 1383 (e.g., PHASE 2R). Node ST2 of the particular control component is coupled to an input of a first inverter 1387, whose output (e.g., node SF1) is coupled to a first source/drain region of transistor 1386. The second source/drain region of transistor 1386 is coupled to the input (e.g., node SF2) of a second inverter 1388. The output (e.g., node ST1) of inverter 1388 is coupled to a first source/drain region of transistor 1381, and a second source/drain region of transistor 1381 the particular compute component 1331 is coupled to an input (e.g., node ST2) of a first inverter 1387 of an adjacent compute component 1331. The loadable shift register shown in FIG. 13A includes a first left-shift transistor 1389 coupled between node SF2 of a particular compute component and node SF1 of an adjacent compute component 1331. The loadable shift register shown in FIG. 13A also includes a second left-shift transistor 1390 of a particular compute component 1331 having a first source/drain region coupled to node ST2 and a second source/drain region coupled to node ST1. The gate of the first left-shift transistor 1389 is coupled to a first left-shift control line 1391 (e.g., PHASE 1L), and the gate of the second left-shift transistor 1390 is coupled to a second left-shift control line 1392 (e.g., PHASE 2L).

In operation, a data value on a pair of complementary data lines (e.g., 1305-1/1305-2) can be loaded into a corresponding compute component 1331 (e.g., by operating logical operation selection logic as described above). As an example, a data value can be loaded into a compute component 1331 via overwriting of the data value currently stored in the compute component 1331 with the data value stored in the corresponding sense amplifier 1306. Alternatively, a data value may be loaded into a compute component by deactivating the control lines 1382, 1383, 1391, and 1392.

Once a data value is loaded into a compute component 1331, the "true" data value is separated from the complement data value by the first inverter 1387. Shifting data to the right (e.g., to an adjacent compute component 1331) can include alternating operation of the first right-shift transistor 1381 and the second right-shift transistor 1386, for example, via the PHASE 1R and PHASE 2R control signals being periodic signals that go high out of phase from one another (e.g., non-overlapping alternating square waves 180 out of phase). The transistor 1390 can be turned on to latch the shifted data value.

An example of shifting data left via the shift register shown in FIG. 13A can include operating control signals 1391 and 1392 to move a data value one control component to the left through transistors 1389 and 1390. Data from node ST2 is inverted through inverter 1387 to node SF1. Activation of control signal 1391 causes the data from node SF1 to move left through transistor 1389 to node SF2 of a left-adjacent compute component 1331. Data from node SF2 is inverted through inverter 1388 to node ST1. Subsequent activation of control signal 1392 causes the data from node ST1 to move through transistor 1390 left to node ST2, which completes a left shift by one compute component 1331. Data can be "bubbled" to the left by repeating the left shift sequence multiple times. Data values can be latched (and prevented from being further shifted) by maintaining the control signal 1392 activated.

Embodiments of the present disclosure are not limited to the shifting capability described in association with the compute components 1331. For example, a number of embodiments and include shift circuitry in addition to and/or instead of the shift circuitry described in association with a loadable shift register.

The sensing circuitry in FIG. 13A can be operated in several modes to perform logical operations, including a first mode in which a result of the logical operation is initially stored in the sense amplifier 1306, and a second mode in which a result of the logical operation is initially stored in the compute component 1331. Additionally with respect to the first operating mode, sensing circuitry can be operated in both pre-sensing (e.g., sense amplifiers fired before logical operation control signal active) and post-sensing (e.g., sense amplifiers fired after logical operation control signal active) modes with a result of a logical operation being initially stored in the sense amplifier 1306.

In a number of examples, the sense amplifier 1306 and the compute component 1331 can be in at least one of two states associated with the first mode and the second mode. As used herein, a state of a sense amplifier 1306 and/or the compute component 1331 describes a transfer of data between the sense amplifier 1306 and/or the compute component 1331. The state of the sense amplifier 1306 and the compute component 1331 can also be described as the state of a sensing component. The state of a sensing component can be based on whether the sense amplifier 1306 is in an equilibration state or is storing a data value (e.g., logic "0" or logic "1"). For example, a sense amplifier can be configured to be in an initial state, wherein the initial state is one of an equilibration state and a data storage state. An equilibration state includes the sense amplifier 1306 being in an equilibration state. A data storage state includes the sense amplifiers 1306 storing a data value. As used herein, a data value can be referred to as a bit and/or a digit value. Data can be transferred from a compute component 1331 to a sense amplifier 1306 in response to enabling a pass gate (e.g., activating the PASS and/or PASS* control signals via the TF 1362, TT 1352, FT 1354, and/or FF 1364 control signals that are referred to herein as a logical operation selection logic) and the sense amplifier 1306 being in a equilibration state. Data can be transferred from a sense amplifier 1306 to a compute component 1331 in response to enabling the pass gate (e.g., activating the PASS and/or PASS* control signals via the TF 1362, TT 1352, FT 1354, and/or FF 1364 control signals that are referred to herein as a logical operation selection logic) and the sense amplifier 1306 being in a data storage state. The direction of the transfer of data between the sense amplifier 1306 and the compute component 1331 is determined by whether the sense amplifier 1306 is in an equilibration state or a data storage state before the PASS and/or PASS* control signals are activated and by a particular operation selected via the logical operation selection logic (e.g., TF 1362, TT 1352, FT 1354, and FF 1364 control signals).

For example, if the sense amplifier 1306 is equilibrated and the PASS and/or PASS* control signals are activated to provide a conduction path (e.g., electrical continuity) between the sense amplifier 1306 and the compute component 1331, then a data value stored in the compute component 1331 can be transferred from the compute component 1331 to the sense amplifier 1306.

If the sense amplifier 1306 is configured to store a first bit (e.g., first data value) and the PASS and/or PASS* control signals are activated to provide a conduction path between the sense amplifier 1306 and the compute component 1331, then a second bit (e.g., second data value) that is stored in the compute component 1331 before the activation of the PASS and/or PASS* control signals can be replaced by the first bit and the sense amplifier 1306 retains the first bit. Furthermore, a number of operations can be performed using the first bit and the second bit using the logical operation selection logic and the result of the operation can be stored in the compute component 1331.

Figure 13B:
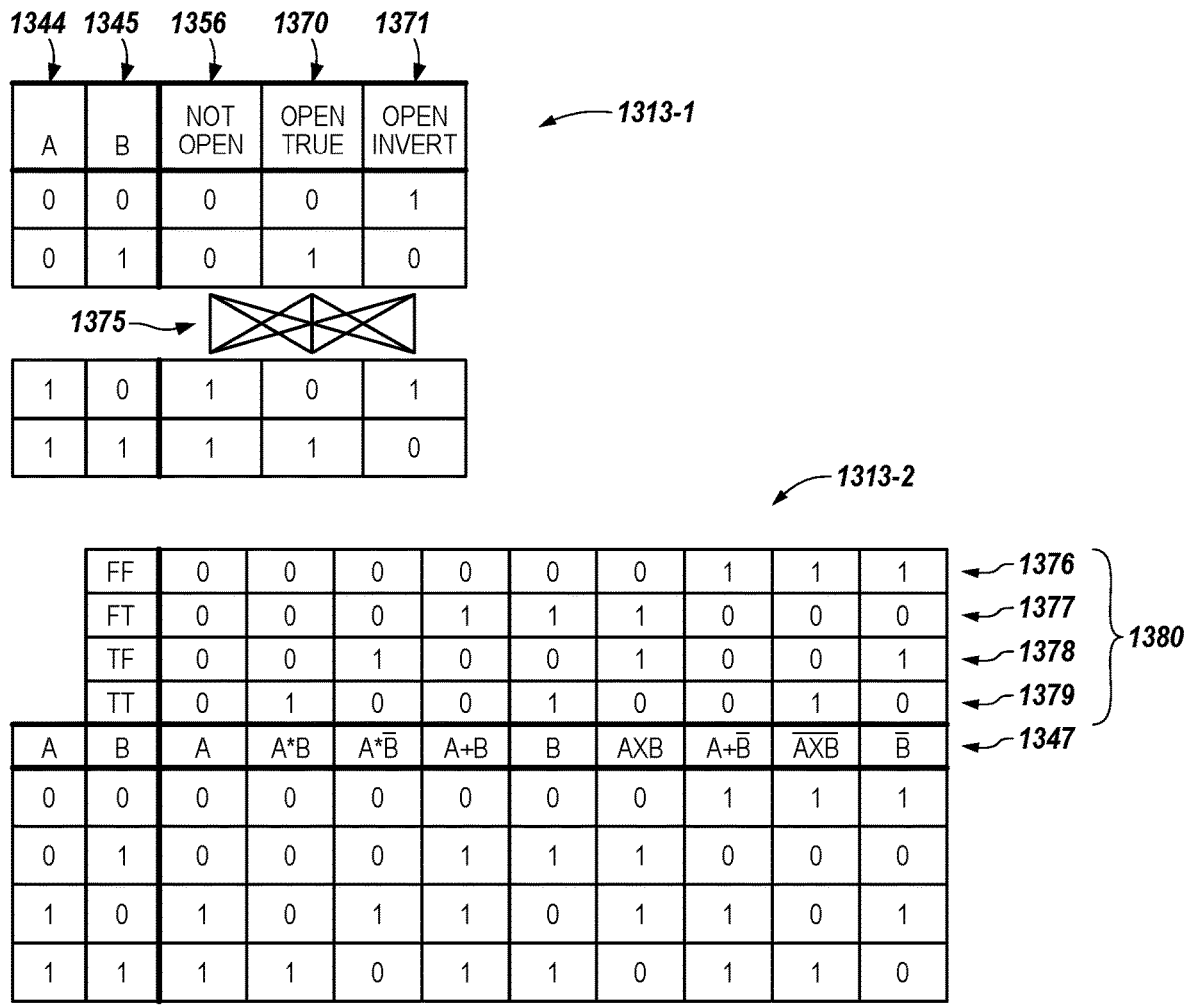
FIG. 13B is a logic table illustrating selectable logic operation results implemented by sensing circuitry in accordance with a number of embodiments of the present disclosure.

FIG. 13B is a logic table illustrating selectable logic operation results implemented by a sensing circuitry in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 1306 (e.g., the "B" value) and compute component 1331 (e.g., the "A" value). The four control signals, in conjunction with a particular data value present on the complementary sense lines, controls the state (conducting or not conducting) of the pass gates 1307-1 and 1307-2 and swap transistors 1342, which in turn affects the data value in the compute component 1331 and/or sense amplifier 1306 before/after firing. The capability to selectably control the state of the swap transistors 1342 facilitates implementing logical operations involving inverse data values (e.g., inverse operands and/or inverse result), among others.

Logic Table 1313-1 illustrated in FIG. 13B shows the starting data value stored in the compute component 1331 in FIG. 13A shown in column A at 1344, and the starting data value stored in the sense amplifier 1306 shown in column B at 1345. The other 3 column headings in Logic Table 1313-1 refer to the state of the pass gates 1307-1 and 1307-2, and the swap transistors 1342, which can respectively be controlled to be OPEN (e.g., conducting/on) or CLOSED (e.g., not conducting/off) depending on the state of the four logic selection control signals (e.g., TF, TT, FT, and FF), in conjunction with a particular data value present on the pair of complementary sense lines 1305-1 and 1305-2 when the ISO control signal is asserted. The "Not Open" column corresponds to the pass gates 1307-1 and 1307-2 and the swap transistors 1342 both being in a non-conducting condition, the "Open True" corresponds to the pass gates 1307-1 and 1307-2 being in a conducting condition, and the "Open Invert" corresponds to the swap transistors 1342 being in a conducting condition. The configuration corresponding to the pass gates 1307-1 and 1307-2 and the swap transistors 1342 both being in a conducting condition is not reflected in Logic Table 1313-1 since this results in the sense lines being shorted together.

The logic tables illustrated in FIG. 13B reflect a result initially stored in the compute component 1331 in FIG. 13A. Therefore, when the pass gates 1307-1 and 1307-2 are controlled to be CLOSED (e.g., not conducting), the result initially stored in the compute component 1331 is the same as the starting data value in the compute component 1331. However, since the sense sensing circuitry 1350 is configured such that the sense amplifier 1306 can overpower the compute component 1331 as shown in the "Not Open" column 1356 of the Logic Table 1313-1, the result initially stored in the compute component 1331 is the same as the starting data value in the sense amplifier 1306 when the pass gates 1307-1 and 1307-2 are controlled to be OPEN (e.g., conducting) as shown in the "Open True" column 1370 of the Logic Table 1313-1. The compute component 1331 can be inverted as shown in the "Open Invert" column 1371 when the swap transistors 1342 are in a conducting condition.

Via selective control of the state of the pass gates 1307-1 and 1307-2 and the swap transistors 1342, each of the three columns of the upper portion of Logic Table 1313-1 can be combined with each of the three columns of the lower portion of Logic Table 1313-1 to provide 3×3=9 different result combinations, corresponding to nine different logical operations, as indicated by the various connecting paths shown at 1375. The nine different selectable logical operations that can be implemented by the sensing circuitry 1350 are summarized in Logic Table 1313-2 illustrated in FIG. 13B.

The columns of Logic Table 1313-2 illustrated in FIG. 13B show a heading 1380 that includes the state of logic selection control signals. For example, the state of a first logic selection control signal is provided in row 1376, the state of a second logic selection control signal is provided in row 1377, the state of a third logic selection control signal is provided in row 1378, and the state of a fourth logic selection control signal is provided in row 1379. The particular logical operation corresponding to the results is summarized in row 1347.

For example, the results for the values of FF, FT, TF, and TT of "0000" are summarized as "A" since the result (initially stored in the compute component after the sense amplifier fires) is the same as the starting value in the compute component. Other columns of results are similarly annotated in row 1347, where "A*B" intends A AND B, "A+B" intends A OR B, and "AXB" intends A XOR B. By convention, a bar over a data value or a logical operation indicates an inverted value of the quantity shown under the bar. For example, AXB bar intends not A XOR B, which is also A XNOR B.

The present disclosure includes apparatuses and methods related to performing sort operations in memory. An example apparatus might include a first group of memory cells coupled to a first sense line, a second group of memory cells coupled to a second sense line, and a controller configured to control sensing circuitry to sort a first element stored in the first group of memory cells and a second element stored in the second group of memory cells by performing an operation without transferring data via an input/output (I/O) line.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
    a first group of memory cells coupled to a first sense line;
    a second group of memory cells coupled to a second sense line;
    a third group of memory cells coupled to an access line, the first sense line, and the second sense line; and
    a controller configured to control sensing circuitry, comprising compute components and sense amplifiers, to sort a first element stored in the first group of memory cells and a second element stored in the second group of memory cells by performing an operation using a mask stored in the memory array without transferring data out of the memory array and the sensing circuitry via an input/output (I/O) line.

2. The apparatus of claim 1, wherein performing the operation comprises performing at least one of: an AND operation; an OR operation, an INVERT operation, and a SHIFT operation without performing a sense line address access.

3. The apparatus of claim 2, wherein the sensing circuitry comprises a first compute component coupled to the first sense line and formed on pitch with the first group of memory cells and a second compute component coupled to the second sense line and formed on pitch with the second group of memory cells.

4. The apparatus of claim 3, wherein:
the sensing circuitry comprises a first sense amplifier coupled to the first compute component and a second sense amplifier coupled to the second compute component; and
the I/O line is coupled, via respective access devices, to the first and second compute components and to a secondary sense amplifier.

5. The apparatus of claim 4, wherein the control is further configured to perform the at least one of the AND operation; the OR operation; the INVERT operation; and the SHIFT operation utilizing the first and second compute components and the first and second sense amplifiers.

6. The apparatus of claim 5, wherein the controller is configured to activate isolation devices to couple the first compute component and the first sense amplifier to the second compute component and the second sense amplifier to align bits of the first element and bits of the second element to perform the at least one of the AND operation and the OR operation.

7. The apparatus of claim 6, wherein the controller is configured to perform the at least one SHIFT operation to control the activation of the isolation devices.

8. The apparatus of claim 4, wherein each of the first and the second sense amplifier comprise a primary latch and each of the first and the second compute component comprises a secondary latch.

9. A method comprising:
performing a sort operation, comprising:
swapping a first element stored in a first group of memory cells coupled to a first sense line and to a number of access lines of an array of memory cells with a second element stored in a second group of memory cells coupled to a second sense line and to the number of access lines if the first element is greater than the second element as identified by a mask stored in the array, such that subsequent to the swapping, the first element is stored in the second group of memory cells and the second element is stored in the first group of memory cells; and
wherein the swapping is performed without transferring data corresponding to the first and second elements out of the array and a sensing circuitry of the array via an input/output (I/O) line.

10. The method of claim 9, wherein, prior to the swapping, the first element is stored as a first bit-vector in the first group of memory cells, with each memory cell in the first group of memory cells storing a respective bit of the first bit-vector.

11. The method of claim 9, wherein, prior to swapping, the second element is stored as a second bit-vector in the second group of memory cells, with each memory cell in the second group of memory cells storing a respective bit of the second bit-vector.

12. The method of claim 11, wherein, subsequent to the swapping, the first bit-vector is stored in the second group of memory cells and the second bit-vector in the first group of memory cells.

13. The method of claim 9, wherein, prior to the swapping:
the first element is stored, as a first bit-vector comprising a number of bits, in a respective number of memory cells of the first group; and
the second element is stored, as a second bit-vector comprising a same number of bits as the first bit-vector, in a respective number of memory cells of the second group; and
wherein bits of the first bit-vector having a same bit position as bits of the second bit-vector are stored in memory cells coupled to a same access line of the number of access lines; and
wherein swapping the first element with the second element comprises swapping bit pairs of the first and second bit-vectors having a same bit position and stored in memory cells coupled to a same access line such that subsequent to the swapping, the first element is stored, as the first bit-vector, in the respective number of memory cells of the second group, and the second element is stored, as the second bit-vector, in the respective number of memory cells of the first group.

14. The method of claim 9, wherein the first element is a first value and the second element is a second value and wherein performing the swap operation results in storing the first value in the second group of memory cells and storing the second value in the first group of memory cells.

15. An apparatus comprising:
a plurality of groups of memory cells configured to store a plurality of elements, wherein each group from the plurality of groups of memory cells is coupled to a different sense line from a plurality of sense lines and to a plurality of access lines of a memory array;
a controller configured to control sensing circuitry comprising sense amplifiers and compute components to:
perform a first comparison operation on the plurality of elements by comparing a first group of elements to a second group of elements from the plurality of elements, wherein the first group of elements and the second group of elements are stored in a plurality of adjacent sense lines from the plurality of sense lines;
swap a first portion of the first group of elements with a second portion of the second group of elements, wherein the first portion of the first group of elements and the second portion of the second group of elements are selected based on a result of the first comparison operation stored in the memory array;
perform a second comparison operation on the plurality of elements by comparing the first group of elements to the second group of elements, wherein the first group of elements and the second group of elements are stored in a different plurality of adjacent sense lines from the plurality of sense lines;
swap a third portion of first group of elements with a fourth portion of the second group of elements, wherein the third portion of the first group of elements and the second portion of the second group of elements are selected based on a result of the second comparison operation stored in the memory array; and
conclude performing a plurality of iterations of the first comparison operation and the second comparison operation responsive to performing a BLOCKOR operation on the result of the second comparison operation.

16. The apparatus of claim 15, wherein a first plurality of pairing of sense lines comprising the plurality of adjacent sense lines are different from a second plurality of pairings of sense lines comprising the different plurality of adjacent sense lines.

17. The apparatus of claim 15, wherein the controller configured to perform the first comparison operation and the second comparison operation is further configured to compare each of the first group of elements with elements from the second group of elements that are stored in adjacent sense lines on either side of each of the first group of elements.

18. The apparatus of claim 15, wherein the plurality of adjacent sense lines are identifies using the first mask and the different plurality of adjacent sense lines are identified using the second mask.

19. The apparatus of claim 15, wherein the controller is further configured to perform the plurality of iterations of the first comparison operation, the second comparison operation, the swap of the first portion of the first group of elements with the second portion of the second group of elements, and the swap of the third portion of the first group of elements and the fourth portion of the second group of elements.

* * * * *